US012010842B2

(12) United States Patent
Tobioka et al.

(10) Patent No.: US 12,010,842 B2
(45) Date of Patent: Jun. 11, 2024

(54) METHOD OF FORMING A STEPPED SURFACE IN A THREE-DIMENSIONAL MEMORY DEVICE AND STRUCTURES INCORPORATING THE SAME

(71) Applicant: SANDISK TECHNOLOGIES LLC, Addison, TX (US)

(72) Inventors: Akihiro Tobioka, Nagoya (JP); Akira Yoshida, Nogoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 227 days.

(21) Appl. No.: 17/166,357

(22) Filed: Feb. 3, 2021

(65) Prior Publication Data

US 2022/0246636 A1  Aug. 4, 2022

(51) Int. Cl.
*H10B 43/27* (2023.01)
*H10B 41/10* (2023.01)
*H10B 41/27* (2023.01)
*H10B 41/35* (2023.01)
*H10B 43/10* (2023.01)
*H10B 43/35* (2023.01)

(52) U.S. Cl.
CPC ............ *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ......... H01L 27/11519; H01L 27/11565; H01L 27/11582; H01L 27/11556; H01L 27/11524; H01L 27/1157
See application file for complete search history.

(56) References Cited

U.S. PATENT DOCUMENTS 5,915,167 A  6/1999  Leedy
8,828,884 B2  9/2014  Lee et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Kimberly N Rizkallah
*Assistant Examiner* — Zhijun Xu
(74) *Attorney, Agent, or Firm* — THE MARBURY LAW GROUP PLLC

(57) ABSTRACT

A method includes forming a first-tier alternating stack of first insulating layers and first sacrificial material layers, forming a joint dielectric layer over the first-tier alternating stack, such that the joint dielectric layer is thicker than each of the first insulating layers and the first sacrificial material layers, forming a second-tier alternating stack of second insulating layers and second sacrificial material layers over the joint dielectric layer and the first-tier alternating stack, performing a level-shift anisotropic etch process to form a recess trench or via cavities vertically extending through the second-tier alternating stack and down to the joint dielectric layer, and performing an extension etching process to extend the recess trench or the via cavities through at least the joint dielectric level. At least one of etching time or etching power used during the extension etching process is different from that used during the level-shift anisotropic etch process.

19 Claims, 51 Drawing Sheets

(56) References Cited

U.S. PATENT DOCUMENTS

| | | | |
|---|---|---|---|
| 8,994,099 | B2 | 3/2015 | Lee et al. |
| 9,412,753 | B2 | 8/2016 | Izumi et al. |
| 9,524,901 | B2 | 12/2016 | Izumi et al. |
| 9,960,181 | B1 | 5/2018 | Cui et al. |
| 9,985,046 | B2 | 5/2018 | Lu et al. |
| 10,192,877 | B2 | 1/2019 | Norizuki et al. |
| 10,629,606 | B2 | 4/2020 | Sugawara et al. |
| 10,861,871 | B2 | 12/2020 | Tobioka |
| 2008/0186771 | A1* | 8/2008 | Katsumata ........ H01L 27/11529 365/185.23 |
| 2013/0313627 | A1 | 11/2013 | Lee et al. |
| 2017/0358594 | A1 | 12/2017 | Lu et al. |
| 2018/0261611 | A1 | 9/2018 | Norizuki et al. |
| 2019/0139974 | A1 | 5/2019 | Sugawara et al. |
| 2019/0148392 | A1 | 5/2019 | Kanno et al. |
| 2019/0148506 | A1 | 5/2019 | Kanakamedala et al. |
| 2019/0319040 | A1* | 10/2019 | Ishii ................ H01L 27/11521 |
| 2020/0075627 | A1* | 3/2020 | Ahn ................ H01L 21/31144 |
| 2020/0098779 | A1* | 3/2020 | Cernea ............... H01L 23/5283 |
| 2020/0194457 | A1* | 6/2020 | Lee ................. H01L 27/11575 |
| 2020/0258900 | A1* | 8/2020 | Lee ................. H01L 27/11556 |

OTHER PUBLICATIONS

U.S. Appl. No. 16/547,971, filed Aug. 22, 2019, SanDisk Technologies LLC.

U.S. Appl. No. 16/675,459, filed Nov. 6, 2019, SanDisk Technologies LLC.

U.S. Appl. No. 16/782,307, filed Feb. 5, 2020, SanDisk Technologies LLC.

U.S. Appl. No. 16/827,990, filed Mar. 24, 2020, SanDisk Technologies LLC.

U.S. Appl. No. 16/881,346, filed May 22, 2020, SanDisk Technologies LLC.

U.S. Appl. No. 16/881,401, filed May 22, 2020, SanDisk Technologies LLC.

U.S. Appl. No. 16/918,463, filed Jul. 1, 2020, SanDisk Technologies LLC.

U.S. Appl. No. 16/918,493, filed Jul. 1, 2020, SanDisk Technologies LLC.

U.S. Appl. No. 16/921,146, filed Jul. 6, 2020, SanDisk Technologies LLC.

U.S. Appl. No. 17/039,160, filed Sep. 30, 2020, SanDisk Technologies LLC.

U.S. Appl. No. 17/081,458, filed Oct. 27, 2020, SanDisk Technologies LLC.

U.S. Appl. No. 17/146,866, filed Jan. 12, 2021, SanDisk Technologies LLC.

* cited by examiner

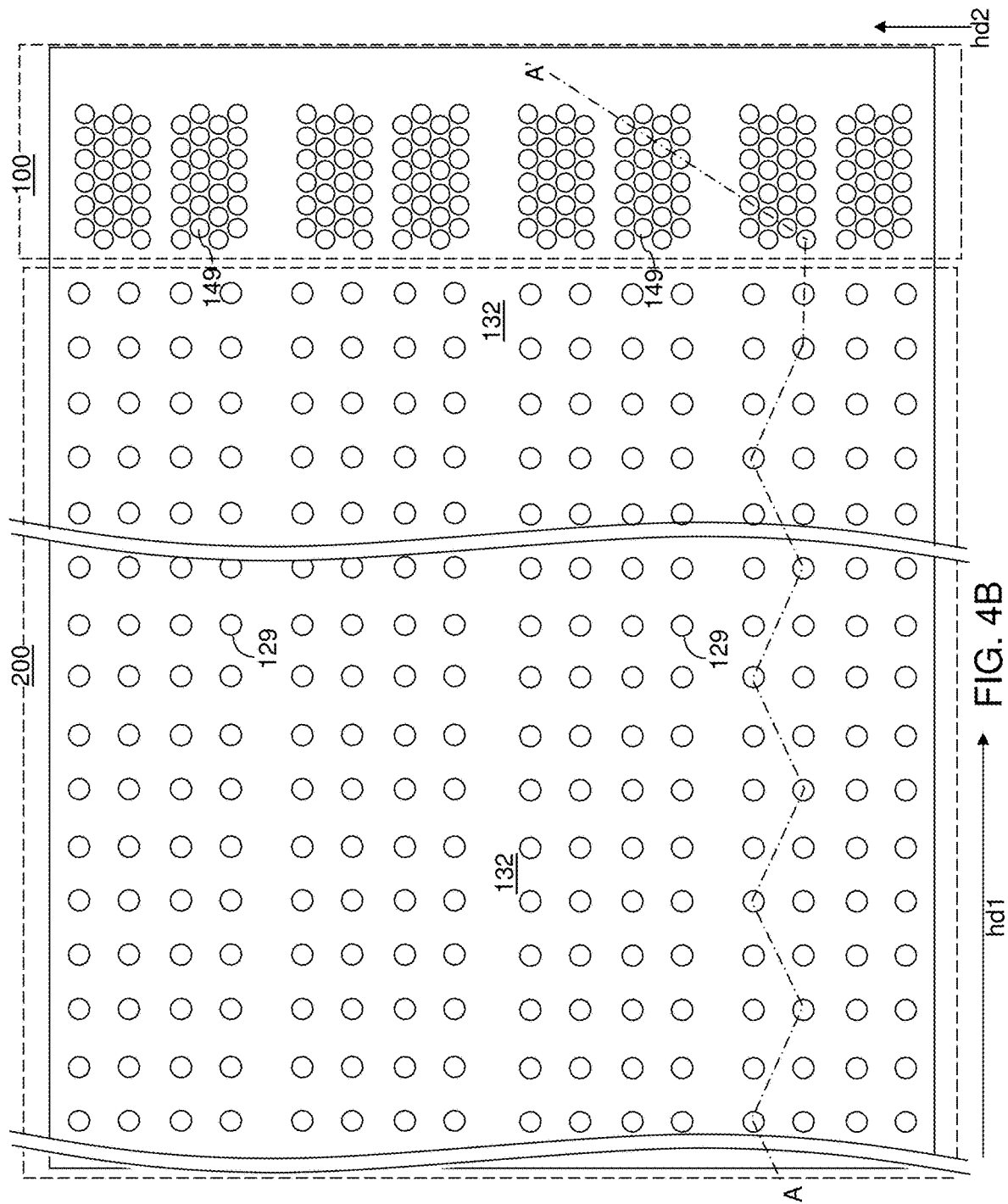

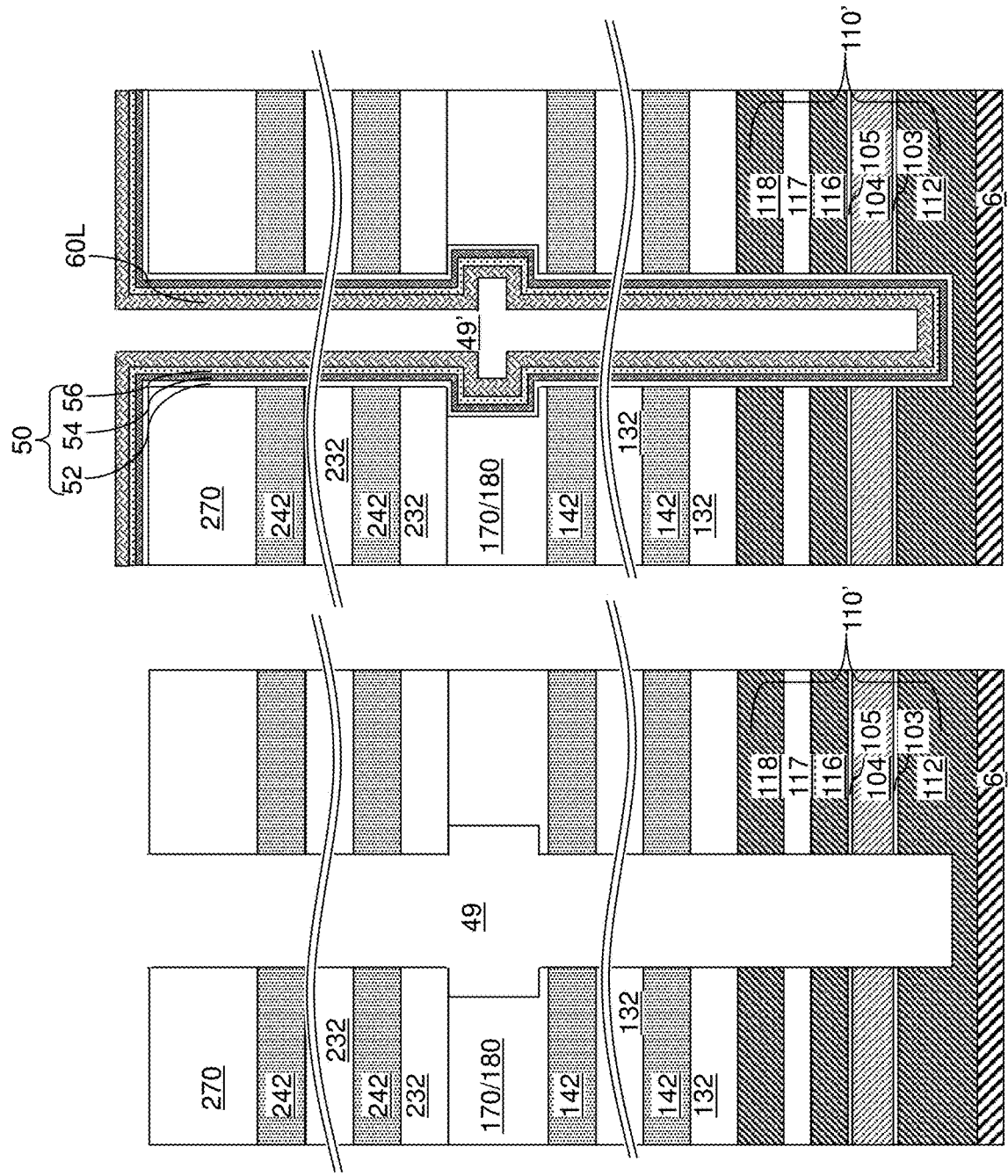

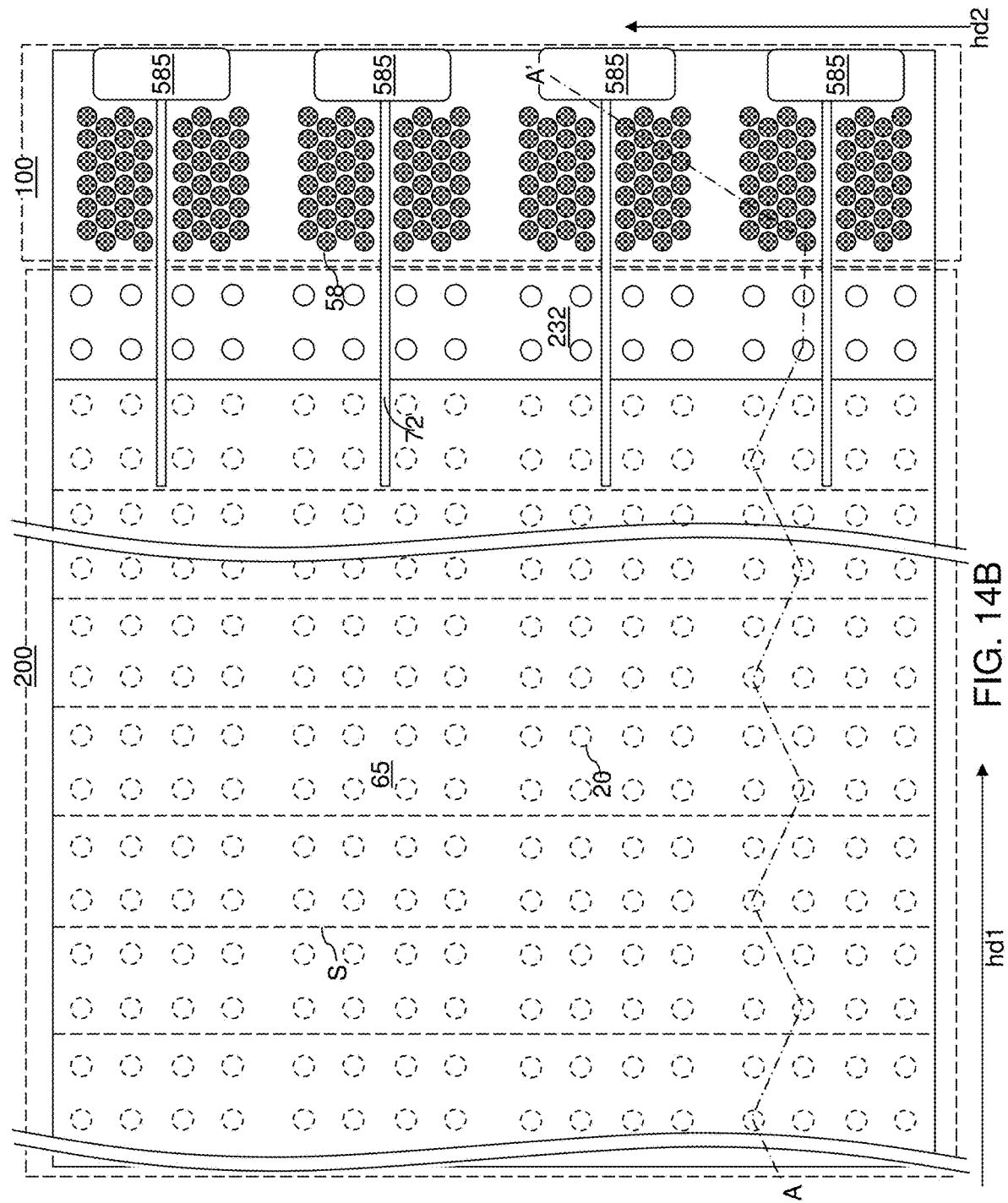

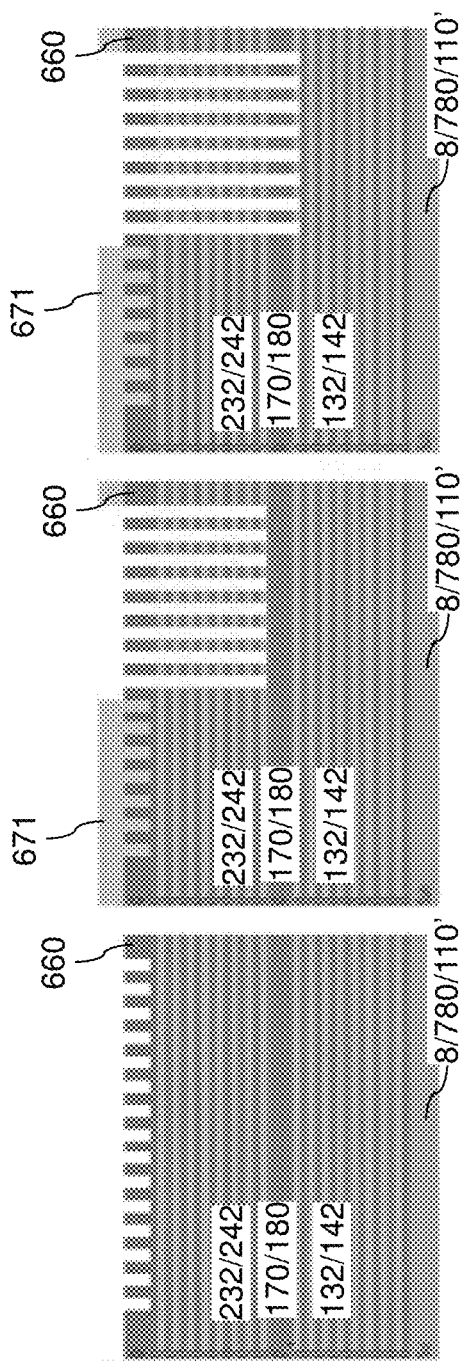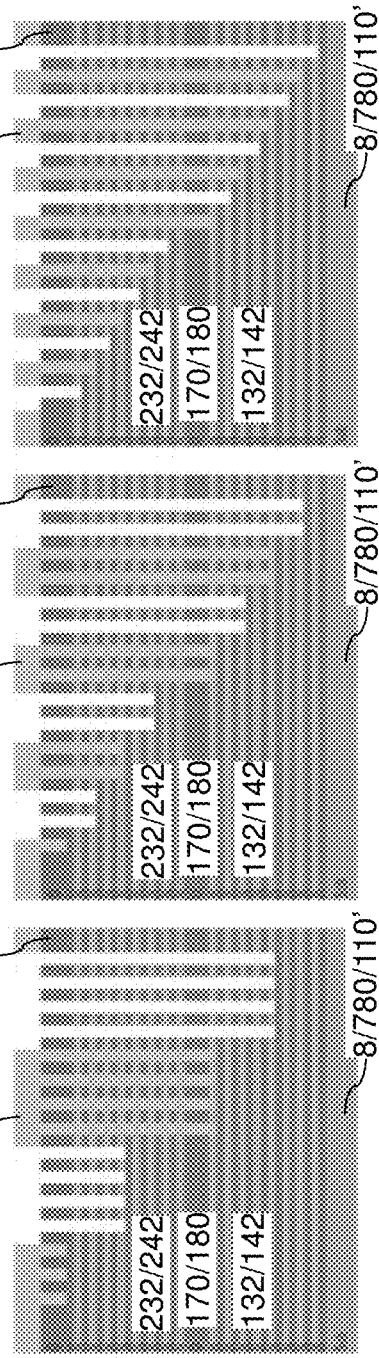

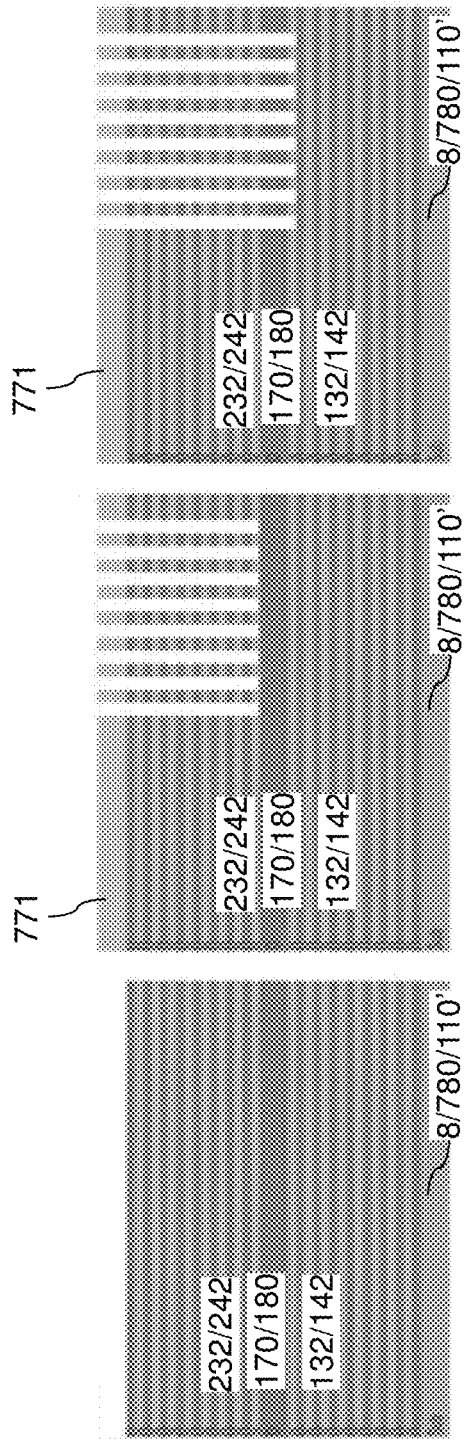
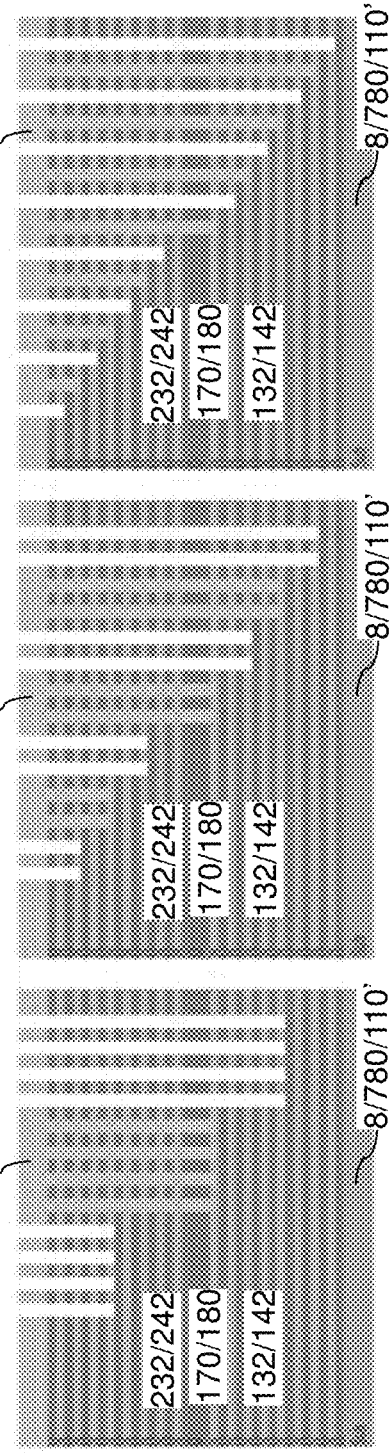
FIG. 25A, FIG. 25B, FIG. 25C, FIG. 25D, FIG. 25E, FIG. 25F

METHOD OF FORMING A STEPPED SURFACE IN A THREE-DIMENSIONAL MEMORY DEVICE AND STRUCTURES INCORPORATING THE SAME

FIELD

The present disclosure relates generally to the field of semiconductor device manufacturing, and particularly to stepped surface formation for a three-dimensional memory device and structures incorporating the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment, a method of forming a three-dimensional memory device comprises forming a first-tier alternating stack of first insulating layers and first sacrificial material layers over a substrate, forming a joint dielectric layer over the first-tier alternating stack, wherein the joint dielectric layer is thicker than each of the first insulating layers and the first sacrificial material layers, forming first-tier memory openings through the first-tier alternating stack and the joint dielectric layer, forming sacrificial first-tier memory opening fill portions in the first-tier memory openings, forming a second-tier alternating stack of second insulating layers and second sacrificial material layers over the joint dielectric layer, the first-tier alternating stack and the sacrificial first-tier memory opening fill portions, performing a level-shift anisotropic etch process to form a recess trench vertically extending through the second-tier alternating stack and down to the joint dielectric layer, performing an extension etching process to extend the recess trench through at least the joint dielectric level, wherein at least one of etching time or etching power used during the extension etching process is different from that used during the level-shift anisotropic etch process, patterning first stepped surfaces in the first-tier alternating stack underneath a volume of the recess trench and patterning second stepped surfaces in the second-tier alternating stack adjacent to the volume of the recess trench, whereby a continuous stepped cavity overlying the first stepped surfaces and the second stepped surfaces is formed, and forming a retro-stepped dielectric material portion in the continuous stepped cavity. The method also includes forming memory openings through the second-tier alternating stack and the first-tier alternating stack, wherein each of the memory openings comprises a volume formed by removing a respective one of the sacrificial first-tier memory opening fill portions, forming memory opening fill structures in the memory openings, wherein each of the memory opening fill structures comprises a respective vertical semiconductor channel and a respective vertical stack of memory elements, and replacing the first sacrificial material layers and the second sacrificial material layers with first electrically conductive layers and second electrically conductive layers, respectively.

According to another embodiment, a method of forming a three-dimensional memory device comprises forming a first-tier alternating stack of first insulating layers and first sacrificial material layers over a substrate, forming a joint dielectric layer over the first-tier alternating stack, wherein the joint dielectric layer is thicker than each of the first insulating layers and the first sacrificial material layers, forming first-tier memory openings through the first-tier alternating stack, forming sacrificial first-tier memory opening fill portions in the first-tier memory openings, forming a second-tier alternating stack of second insulating layers and second sacrificial material layers over the joint dielectric layer, the first-tier alternating stack and the sacrificial first-tier memory opening fill portions, forming a first masking pattern over the second-tier alternating stack, forming first via cavities having a same depth through the second-tier alternating stack down to the joint dielectric layer by performing a level-shift anisotropic etch process that etches the unmasked portions of the second-tier alternating stack underneath the first masking pattern, performing an extension etching process to extend the first cavities through at least the joint dielectric level, wherein at least one of etching time or etching power used during the extension etching process is different from that used during the level-shift anisotropic etch process, and performing multiple via extension processes. Each of the multiple via extension processes comprises a respective patterned etch mask formation step in which a respective etch mask partially covering a respective subset of the first openings and a respective subset of the second openings is formed over the hard mask layer, and a respective additional anisotropic etch step in which a respective subset of layers within the first-tier alternating stack and a respective subset of layers within the second-tier alternating stack are vertically etched within areas that are not covered by the respective etch mask.

BRIEF DESCRIPTION OF THE DRAWINGS

FIG. 4B is a horizontal cross-sectional view of the first exemplary structure of FIG. 4A. The hinged vertical plane A-A' corresponds to the plane of the vertical cross-sectional view of FIG. 4A.

FIGS. 12A-12D illustrate sequential vertical cross-sectional views of a memory opening during formation of a memory opening fill structure according to the first embodiment of the present disclosure.

FIG. 14B is a horizontal cross-sectional view of the first exemplary structure along the horizontal plane B-B' of FIG. 14A. The hinged vertical plane A-A' corresponds to the plane of the vertical cross-sectional view of FIG. 14A.

FIGS. 24A-24F are sequential vertical cross-sectional views of a third exemplary structure during formation of stepped surfaces according to a third embodiment of the present disclosure.

FIGS. 25A-25F are sequential vertical cross-sectional views of a fourth exemplary structure during formation of stepped surfaces according to a fourth embodiment of the present disclosure.

DETAILED DESCRIPTION

Figure 1A:
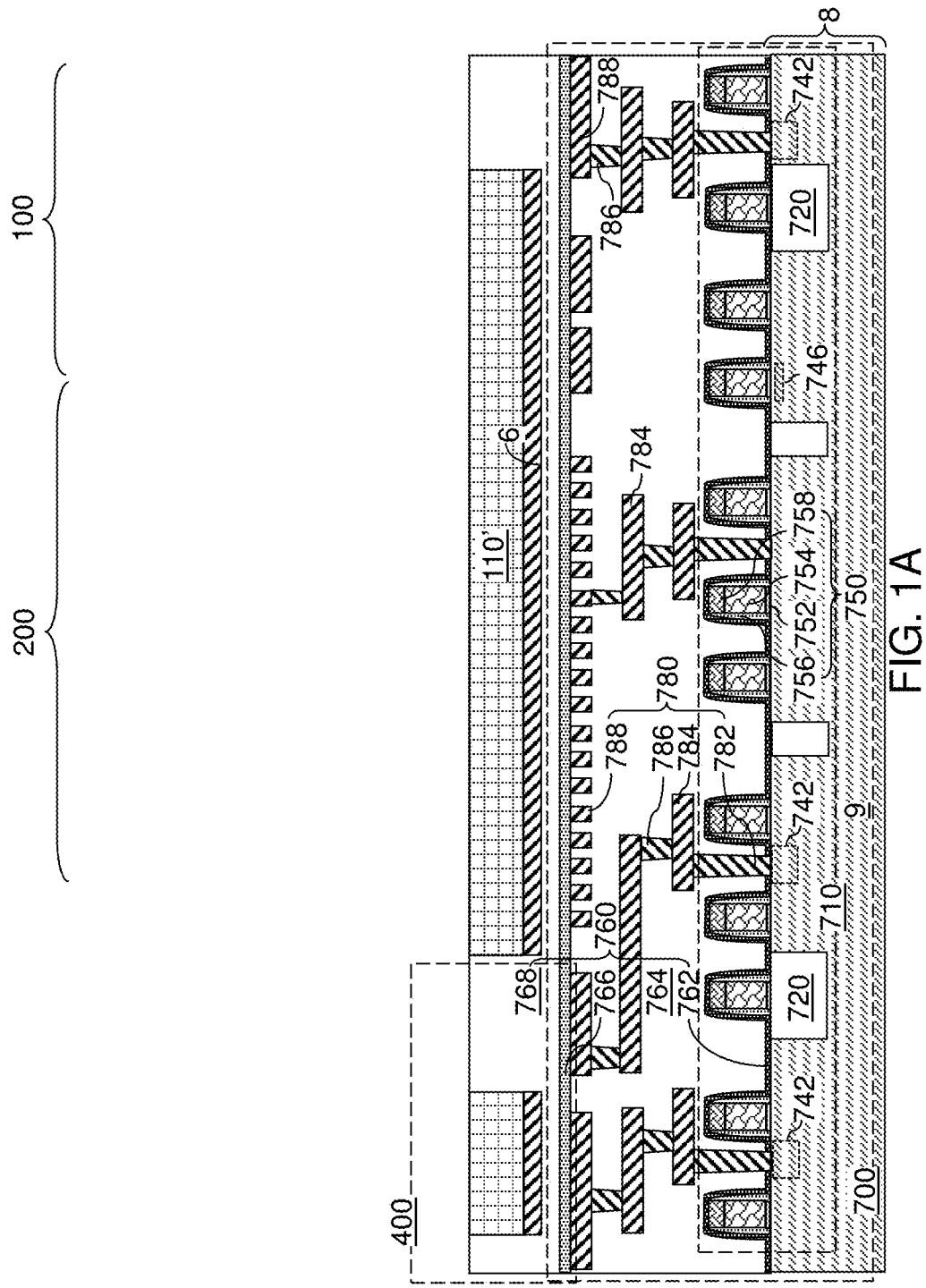
FIG. 1A is a vertical cross-sectional view of a first exemplary structure after formation of semiconductor devices, lower level dielectric layers, lower metal interconnect structures, and in-process source level material layers on a semiconductor substrate according to a first embodiment of the present disclosure.

As discussed above, embodiments of the present disclosure are directed to stepped surface formation for a three-dimensional memory device and structures incorporating the same, the various aspects of which are described herein in detail. The embodiments of the present disclosure may be used to form various semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
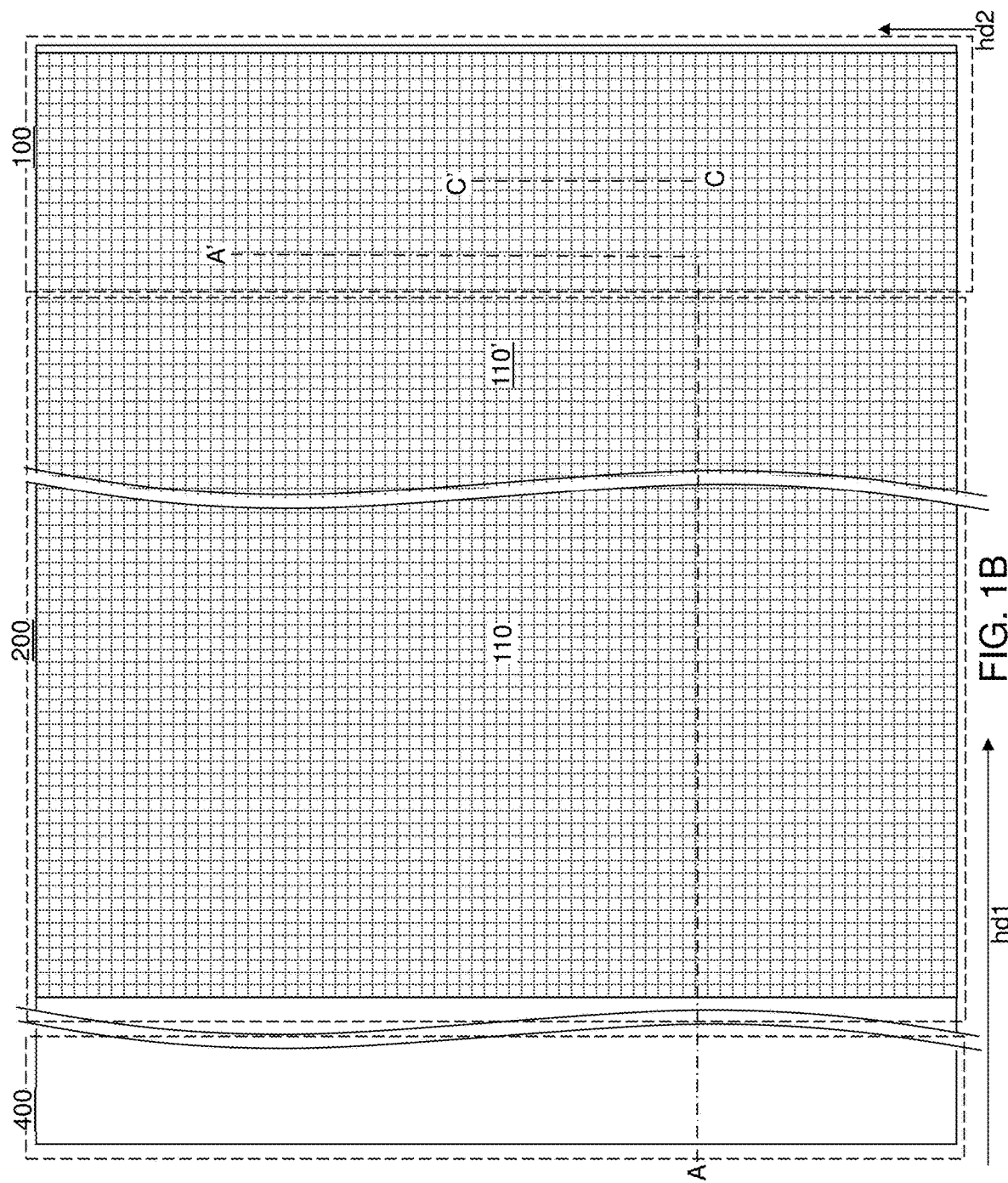
FIG. 1B is a top-down view of the first exemplary structure of FIG. 1A. The hinged vertical plane A-A' is the plane of the vertical cross-sectional view of FIG. 1A.
Figure 1C:
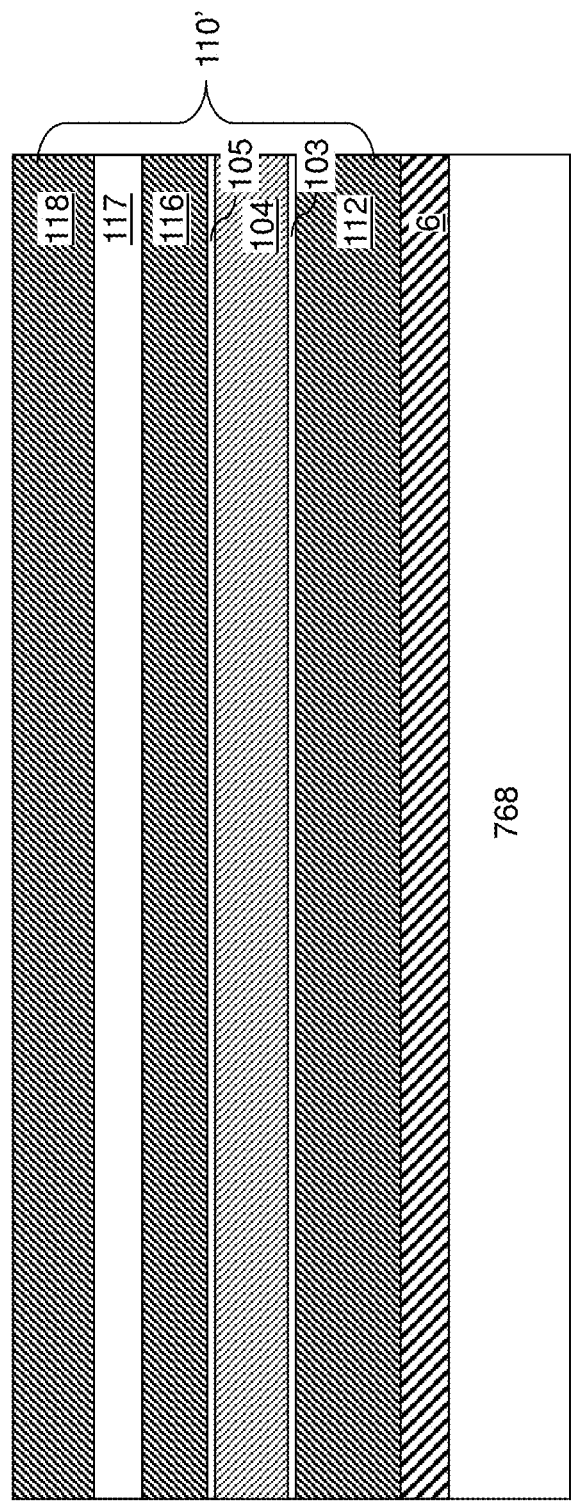
FIG. 1C is a magnified view of the in-process source level material layers along the vertical plane C-C' of FIG. 1B.

Referring to FIGS. 1A-1C, a first exemplary structure according to the first embodiment of the present disclosure is illustrated. FIG. 1C is a magnified view of an in-process source-level material layers 110' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
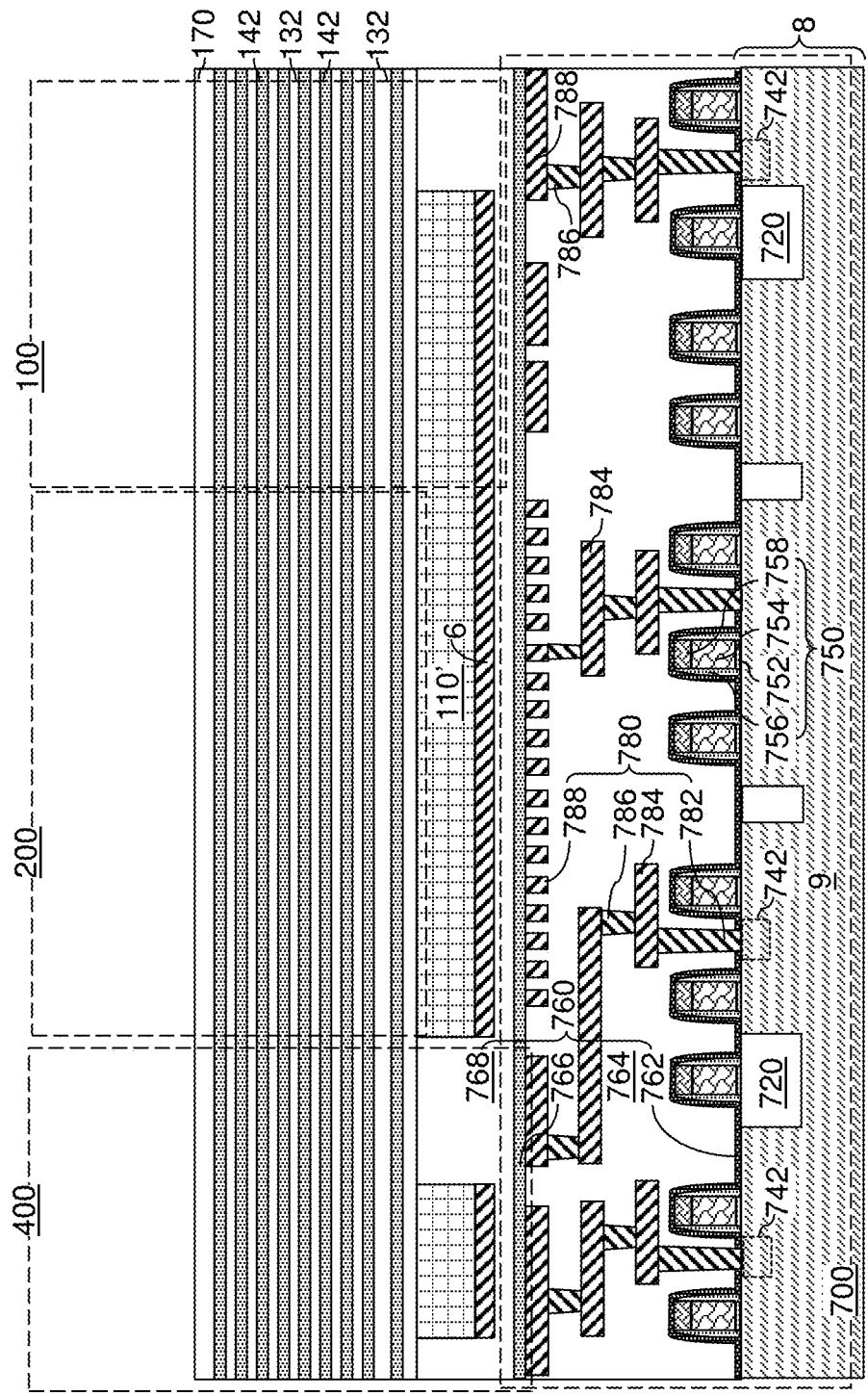
FIG. 2 is a vertical cross-sectional view of the first exemplary structure after formation of a first-tier alternating stack of first insulting layers and first spacer material layers according to the first embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

An optional first insulating cap layer 170 is subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used. The combination of the first-tier alternating stack (132, 142) and the first insulating layer 170 constitutes a first-tier structure (132, 142, 170).

Figure 3:
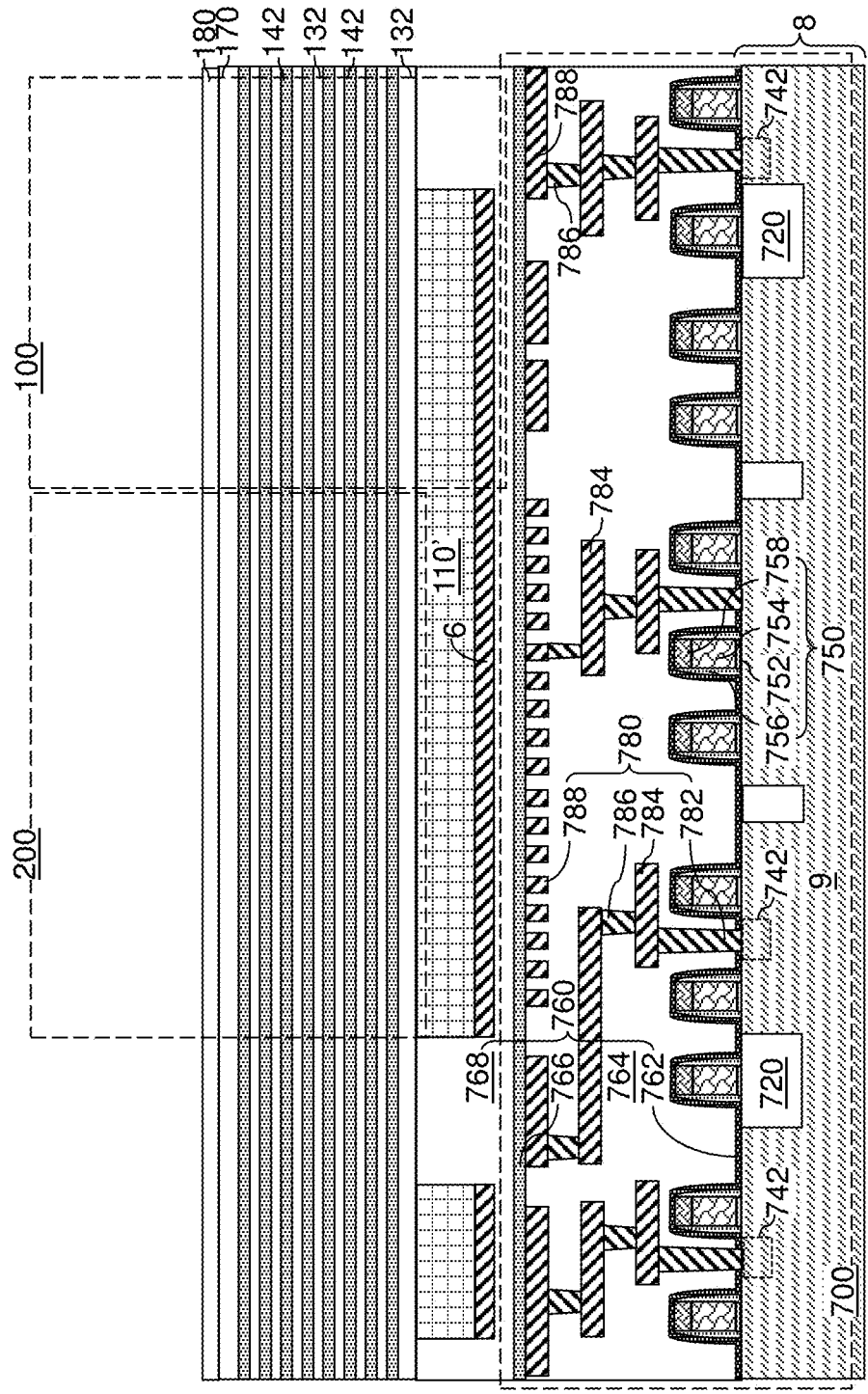
FIG. 3 is a vertical cross-sectional view of the first exemplary structure after formation of an inter-tier dielectric layer according to the first embodiment of the present disclosure.

Referring to FIG. 3, an inter-tier dielectric layer 180 can be deposited over the first insulating cap layer 170. The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 60 nm to 300 nm, although lesser and greater thicknesses may also be used. In one embodiment, the inter-tier dielectric layer 180 is thicker than each of the first insulating layers 132 and the first sacrificial material layers 142. A combination of the optional first insulating cap layer 170 (if present) and the inter-tier dielectric layer 180 comprises a joint dielectric layer.

Figure 4A:
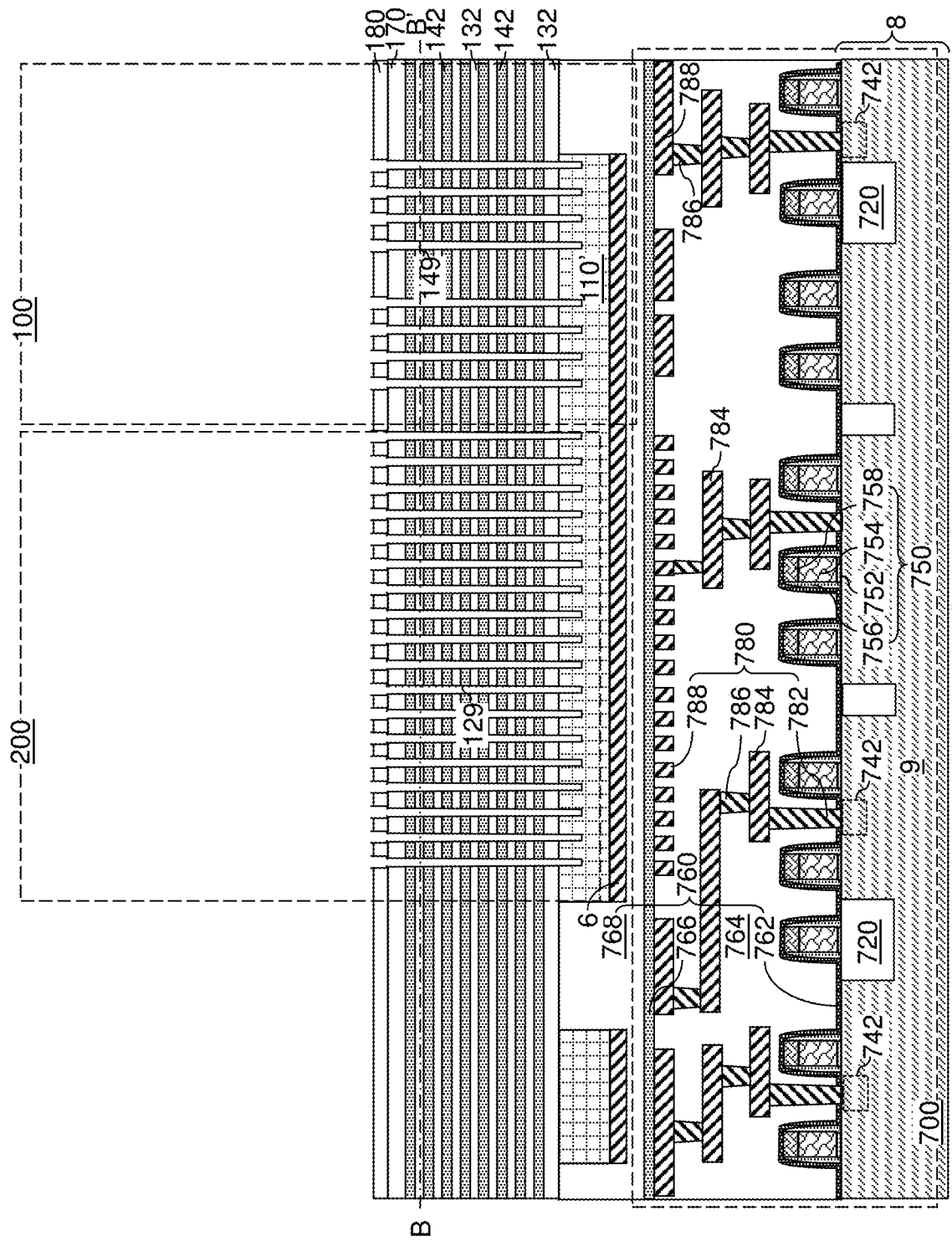
FIG. 4A is a vertical cross-sectional view of the first exemplary structure after formation of first-tier memory openings and first-tier support openings according to the first embodiment of the present disclosure.

Referring to FIGS. 4A and 4B, various first-tier openings (149, 129) may be formed through the inter-tier dielectric layer 180 and the first-tier structure (132, 142, 170) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first-tier alternating stack (132, 142) are illustrated as dotted lines in FIG. 4B.

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149. The first-tier support openings 129 are openings that are formed in the staircase region 200, and are subsequently employed to form dielectric pillar portions.

In one embodiment, the first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
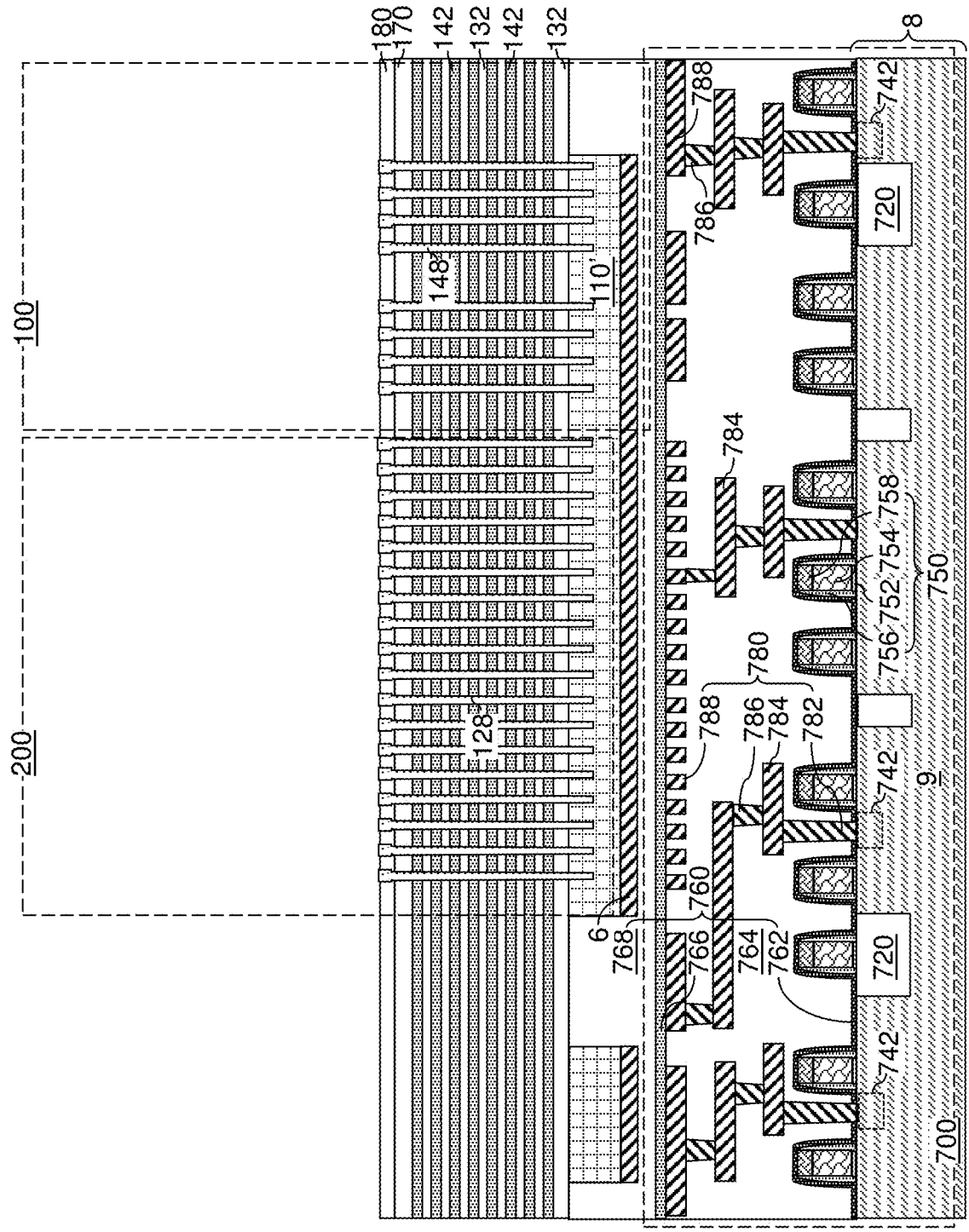
FIG. 5 is a vertical cross-sectional view of the first exemplary structure after formation of various first-tier sacrificial fill structures according to the first embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetra-ethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
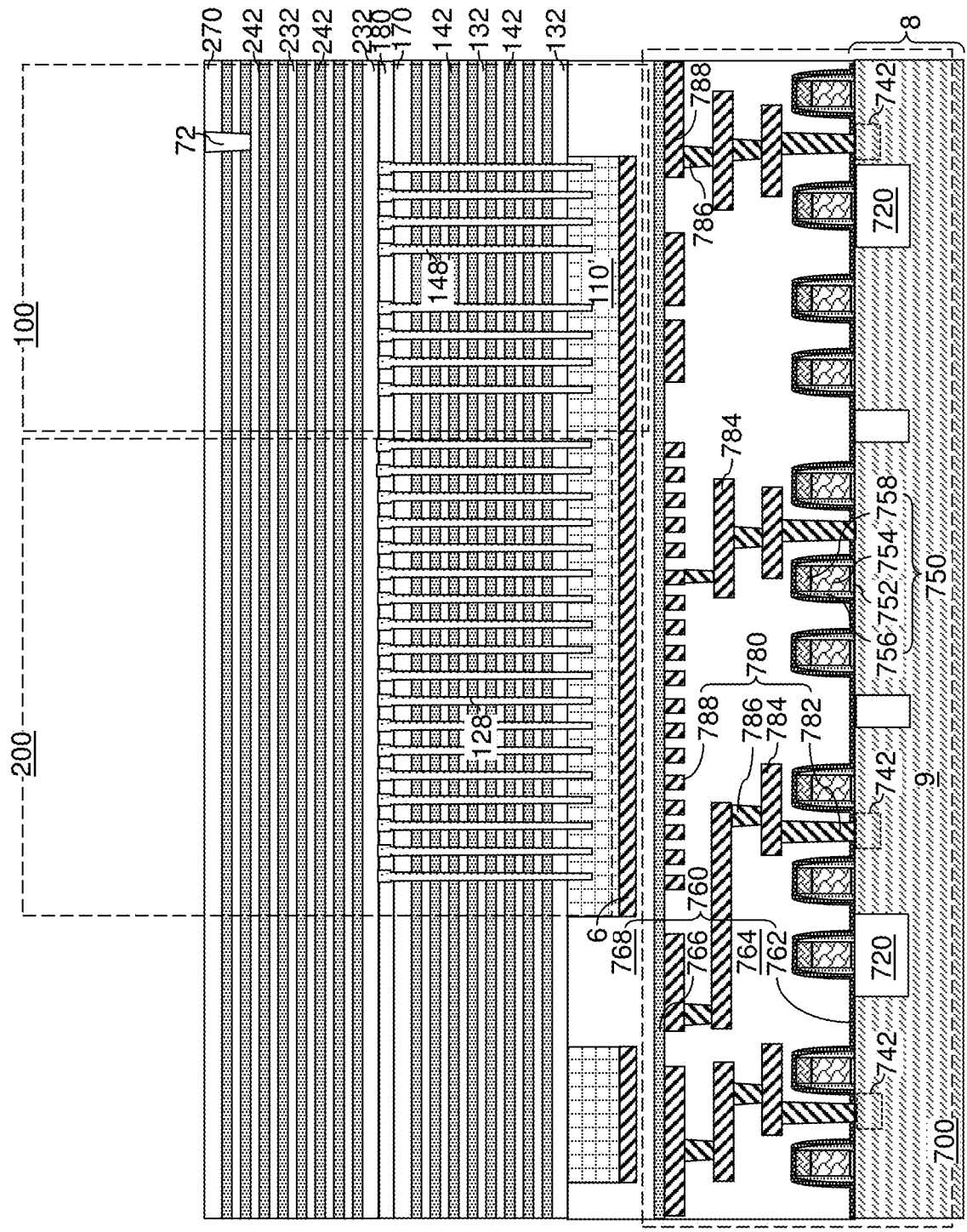
FIG. 6 is a vertical cross-sectional view of the first exemplary structure after formation of a second-tier alternating stack of second insulating layers and second spacer material layers according to the first embodiment of the present disclosure.

Referring to FIG. 6, a second-tier structure may be formed over the first-tier structure (132, 142, 170, 148, 128). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. In one embodiment, the inter-tier dielectric layer 180 is thicker than each of the second insulating layers 232 and the second sacrificial material layers 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Optionally, drain-select-level isolation structures 72 may be formed through the second insulating cap layer 270 and a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second-tier alternating stack (232, 242), the second insulating cap layer 270, and the optional drain-select-level isolation structures 72 collectively constitute a second-tier structure (232, 242, 270, 72).

Figure 7A:
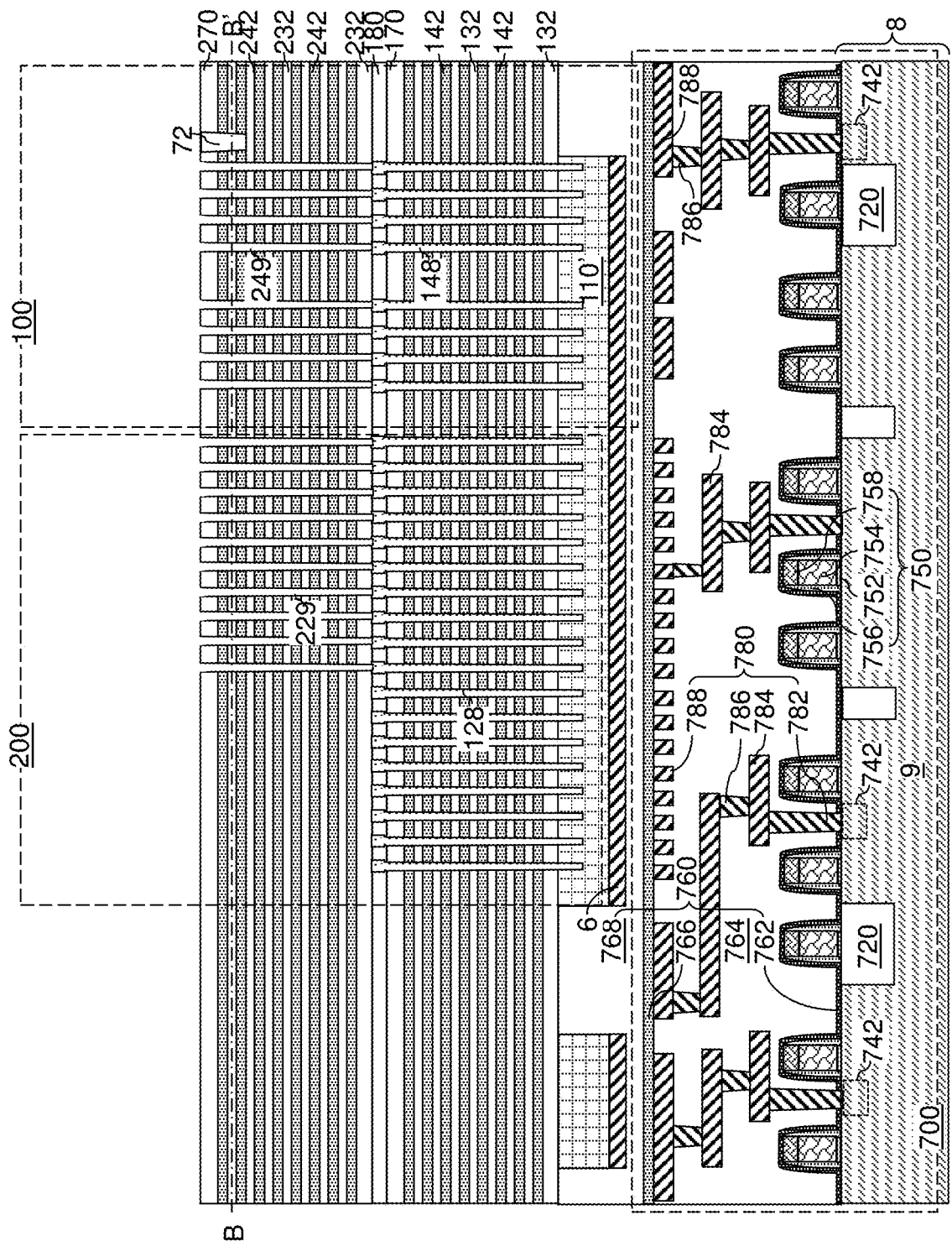
FIG. 7A is a vertical cross-sectional view of the first exemplary structure after formation of second-tier memory openings and second-tier support openings according to the first embodiment of the present disclosure.
Figure 7B:
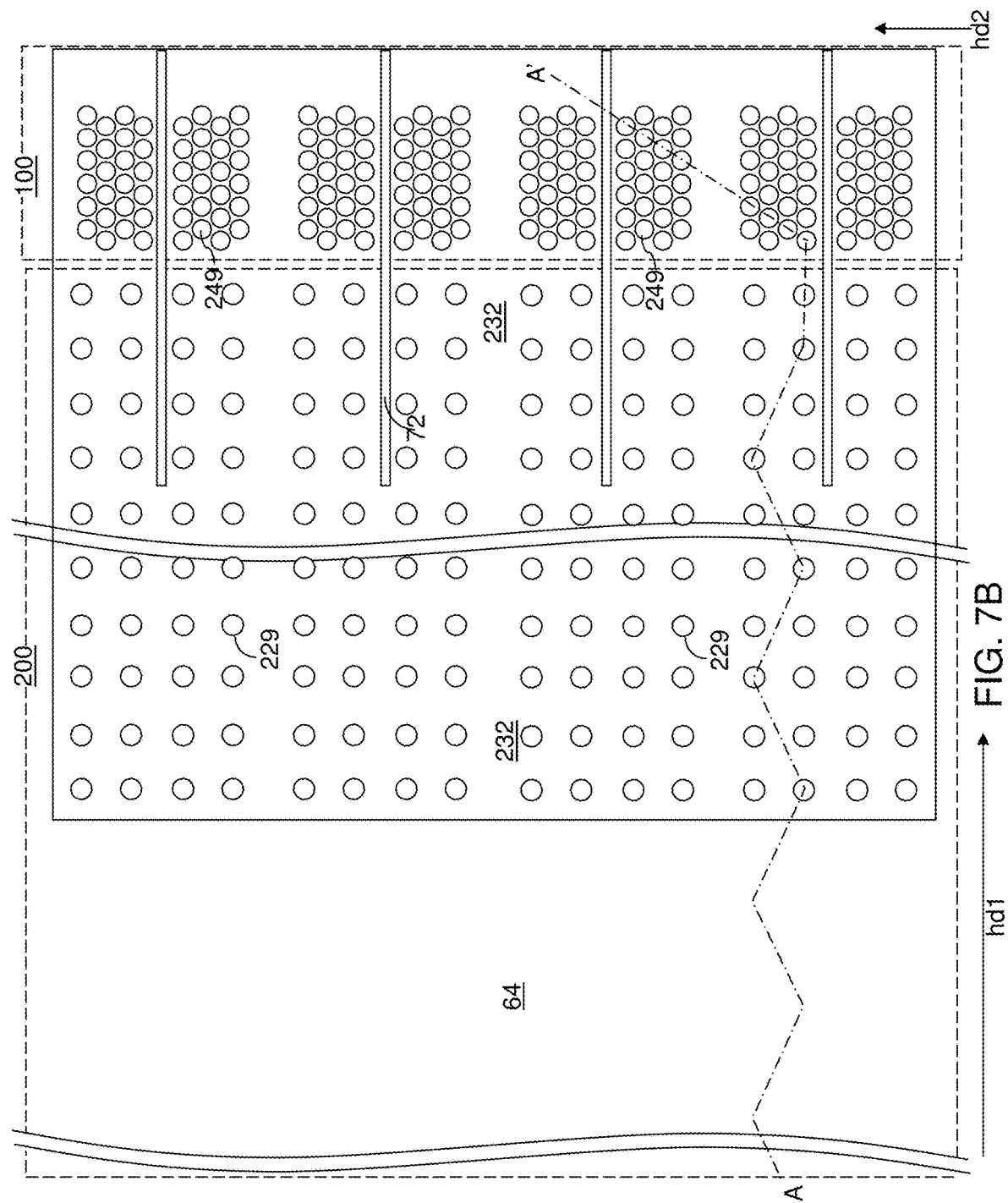
FIG. 7B is a horizontal cross-sectional view of the first exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 270, 72). A photoresist layer (not shown) may be applied over the second insulating cap layer 270, and may be lithographically patterned to form various openings therethrough. In one embodiment, the pattern of the openings may be the same as the pattern of the various first-tier openings (149, 129), which is the same as the sacrificial first-tier opening fill portions (148, 128). In this case, the lithographic mask used to pattern the first-tier openings (149, 129) may be used to pattern the photoresist layer. In another embodiment, the pattern of the openings may differ from the pattern of the various first-tier openings (149, 129) by omission of openings that overlie a subset of the sacrificial first-tier support opening fill portions 128.

The pattern of openings in the photoresist layer may be transferred through the second-tier structure (232, 242, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229. The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128.

The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be located entirely within, a periphery of a top surface of a respective underlying sacrificial first-tier opening fill portion (148, 128). The photoresist layer may be subsequently removed, for example, by ashing.

Figure 8:
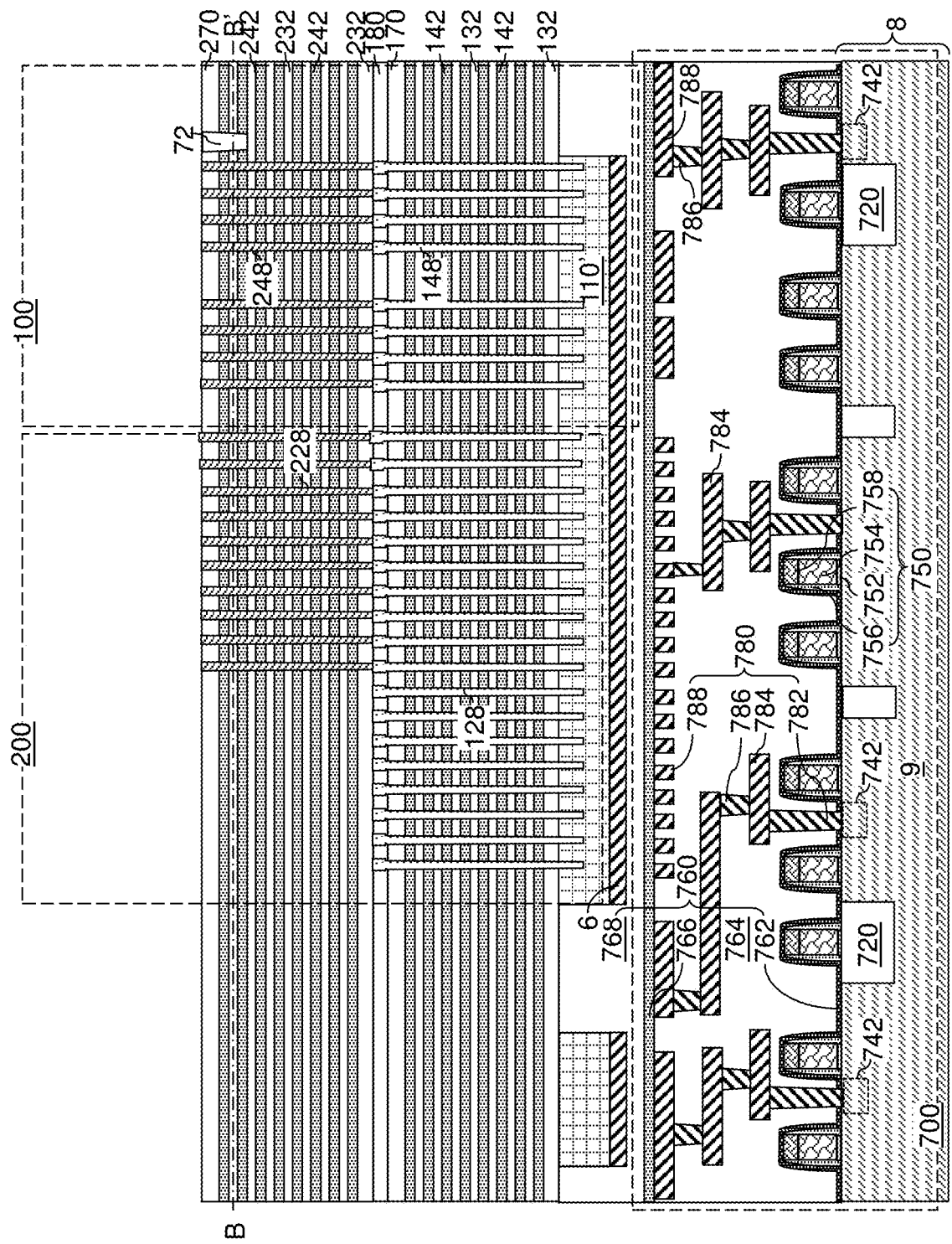
FIG. 8 is a vertical cross-sectional view of the first exemplary structure after formation of various second-tier sacrificial fill structures according to the first embodiment of the present disclosure.

Referring to FIG. 8, sacrificial second-tier opening fill portions (248, 228) may be formed in the various second-tier openings (249, 229). For example, a sacrificial second-tier fill material is deposited concurrently deposited in each of the second-tier openings (249, 229). The sacrificial second-tier fill material includes a material that may be subsequently removed selective to the materials of the second insulating layers 232 and the second sacrificial material layers 242.

In one embodiment, the sacrificial second-tier fill material can include any material that may be employed for the sacrificial first-tier fill material. The sacrificial second-tier fill material may be the same as, or may be different from, the sacrificial first-tier fill material. Portions of the deposited sacrificial material may be removed from above the topmost layer of the second-tier alternating stack (232, 242), such as from above the second insulating cap layer 270. For example, the sacrificial second-tier fill material may be recessed to a top surface of the second insulating cap layer 270 using a planarization process. The planarization process may include a recess etch, chemical mechanical planarization (CMP), or a combination thereof. The top surface of the inter-tier dielectric layer 280 may be used as an etch stop layer or a planarization stop layer.

Remaining portions of the sacrificial second-tier fill material comprise sacrificial second-tier opening fill portions (248, 228). Specifically, each remaining portion of the sacrificial material in a second-tier memory opening 249 constitutes a sacrificial second-tier memory opening fill portion 248. Each remaining portion of the sacrificial material in a second-tier support opening 229 constitutes a sacrificial second-tier support opening fill portion 228. The various sacrificial second-tier opening fill portions (248, 228) are concurrently formed, i.e., during a same set of processes including the deposition process that deposits the sacrificial second-tier fill material and the planarization process that removes the second-tier deposition process from above the second-tier alternating stack (232, 242) (such as from above the top surface of the second insulating cap layer 270). The top surfaces of the sacrificial second-tier opening fill portions (248, 228) may be coplanar with the top surface of the second insulating cap layer 270. Each of the sacrificial second-tier opening fill portions (248, 228) may, or may not, include cavities therein.

Figure 9A:
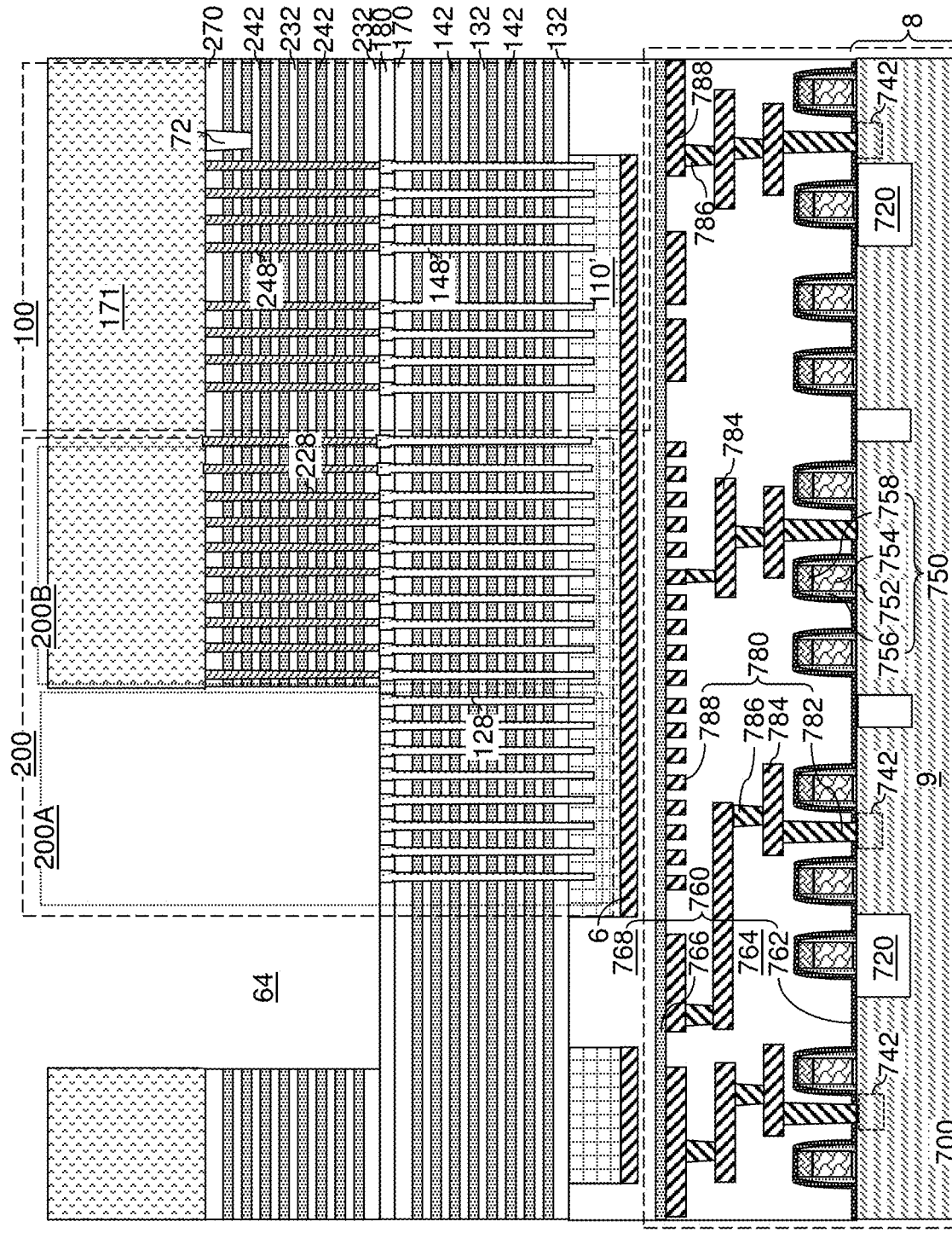
FIGS. 9A-9F are sequential vertical cross-sectional views of the first exemplary structure during formation of a recess trench and subsequent formation of stepped surfaces according to the first embodiment of the present disclosure.

FIGS. 9A-9D are sequential vertical cross-sectional views of the first exemplary structure during formation of a recess trench 64 and subsequent formation of stepped surfaces according to the first embodiment of the present disclosure. Referring to FIG. 9A, the first exemplary structure is illustrated after a first set of patterning process steps, which includes a first patterned etch mask formation step and a first anisotropic etch step.

During the first patterned etch mask formation step, a first photoresist layer 171 can be applied over the first exemplary structure, and can be lithographically patterned to form an opening within a first area 200A of the staircase region 200. In one embodiment, a second area 200B of the staircase region 200 may be located between the first area 200A of the staircase region 200 and the memory array region 100. The first photoresist layer 171 can cover the second area 200B of the staircase region 200 and the entirety of the memory array region 100.

During the first anisotropic etch step, a first anisotropic etch process can be performed to vertically recess portions of the first exemplary structure within the first area 200A of the staircase region 200 that is not covered by the first photoresist layer 171. The anisotropic etch process is herein referred to as a level-shift anisotropic etch process. A recess trench 64 vertically extending through the second-tier alternating stack (232, 242) and down to the inter-tier dielectric layer 180 can be formed by the anisotropic etch process. In one embodiment, the recess trench 64 can have a horizontal cross-sectional shape of a rectangle or a rounded rectangle.

The a first pair of sidewalls of the recess trench 64 can be parallel to the first horizontal direction (e.g., word line direction) hd1, and a second pair of sidewalls of the recess trench 64 can be parallel to the second horizontal direction (e.g., bit line direction) hd2. The sidewalls of the recess trench 64 can be straight in a vertical cross-sectional view, and may be vertical or may be tapered with a taper angle greater than 0 degree and less than 10 degrees. The sidewalls of the recess trench 64 can vertically extend at least from a topmost layer within the second-tier alternating stack (232, 242) to the inter-tier dielectric layer 180, and may vertically extend from a top surface of the second insulating cap layer 270 to the inter-tier dielectric layer 180. In one embodiment, the recess trench 64 may comprise a set of straight sidewalls, which includes a pair of lengthwise sidewalls that laterally extend along the first horizontal direction hd1, and laterally spaced apart from each other along the second horizontal direction hd2 that is perpendicular to the first horizontal direction hd1. In one embodiment, the set of straight sidewalls includes a pair of widthwise sidewalls that laterally extend along the second horizontal direction hd2.

Figure 9B:
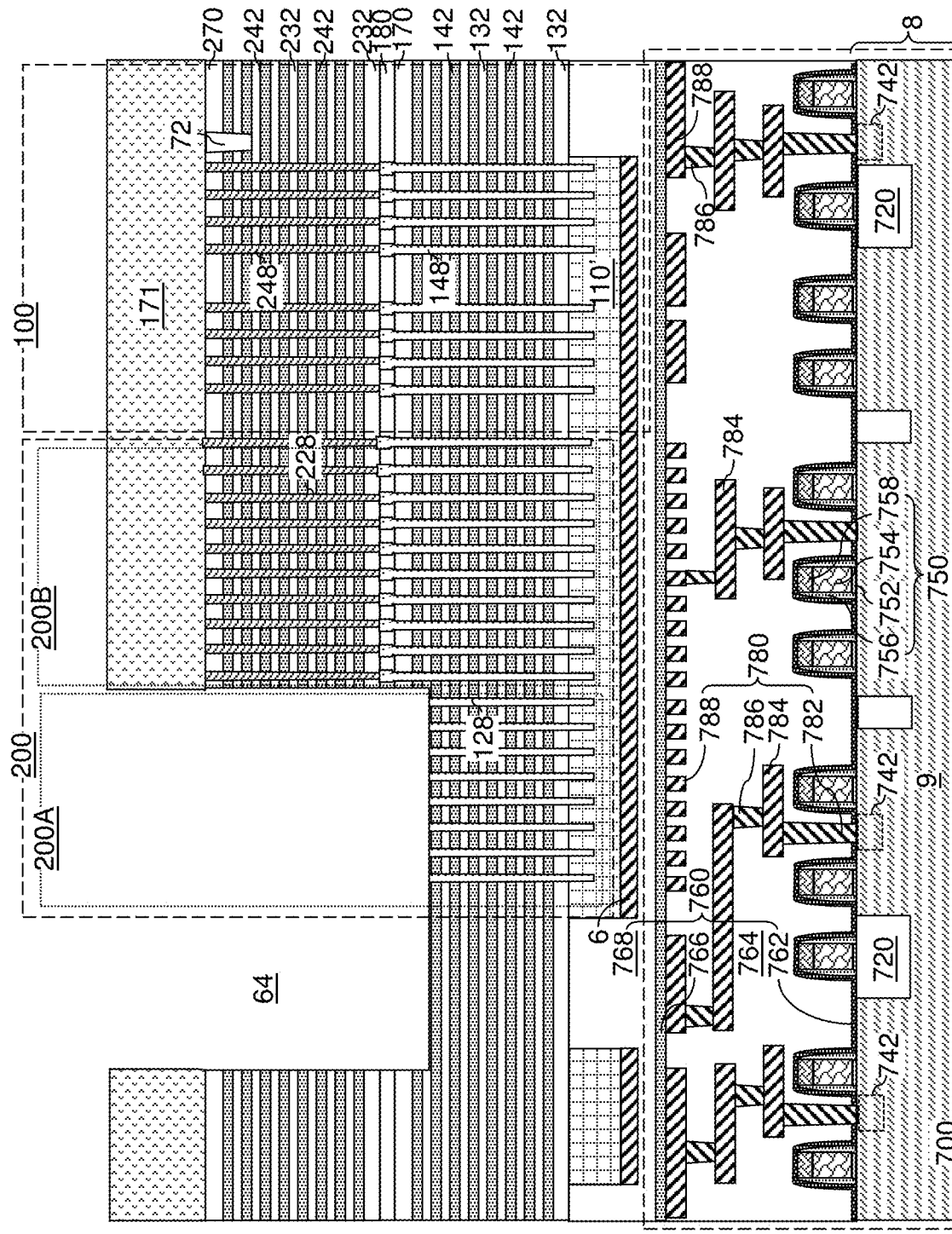

Referring to FIG. 9B, the recess trench 64 is extended through the inter-tier dielectric layer 180 by anisotropic etching, which is referred to as an extension etch process. Preferably, the recess trench 64 is also extended through layer 170 and through at least one pair of a topmost first insulating layer 132 and the topmost first sacrificial material layer 142 of the first-tier alternating stack during the extension etch process. In the extension etch process, the etching time and/or the etching power of the plasma etching (e.g., RIE etching) is changed relative to the level-shift anisotropic etch process. Thus, the etching time and/or etching power is different during the level-shift anisotropic etch process and during the extension etch process to account for the etching of the relatively thick joint dielectric layer (i.e., the combination of the first insulating cap layer 170 (if present) and the inter-tier dielectric layer 180) versus etching of the relatively thin second insulating material layers 232 and the second sacrificial material layers 242. Thus, by etching the joint dielectric layer separately from the second-tier alternating stack, the etching errors (e.g., over etching into the first-tier alternating stack) may be reduced or avoided. The first photoresist layer 171 can be subsequently removed, for example, by ashing.

Figure 9C:
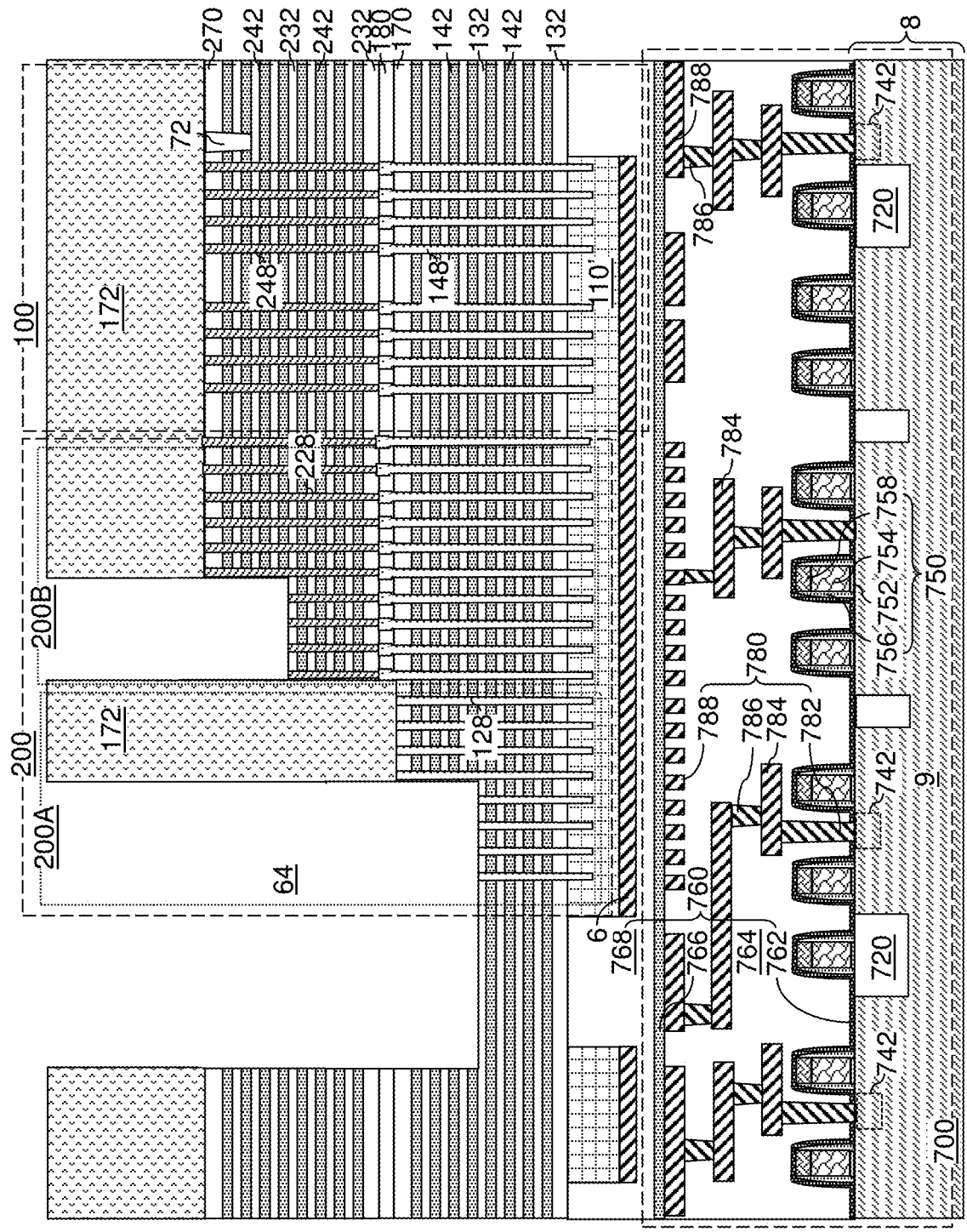
Figure 9D:
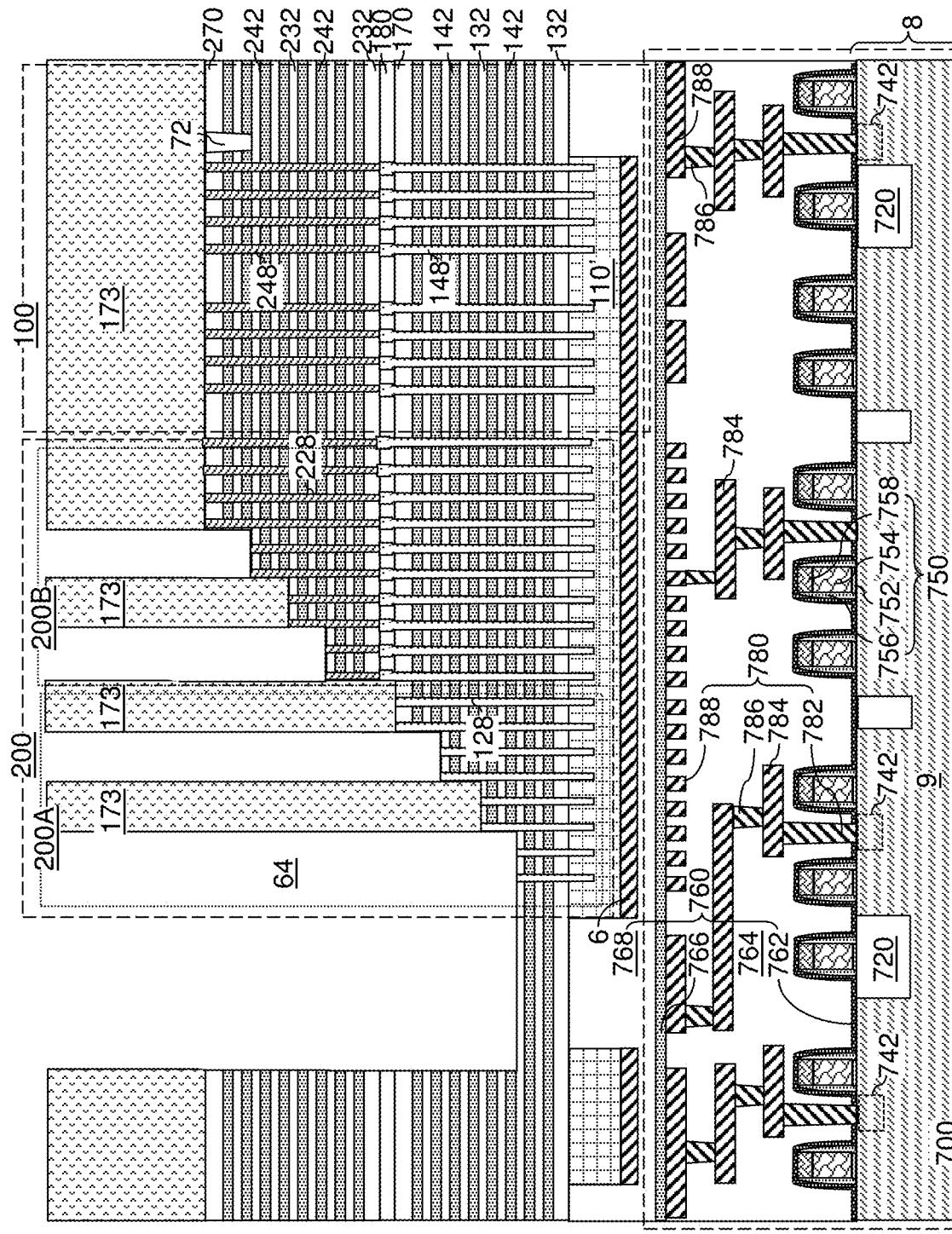
Figure 9E:
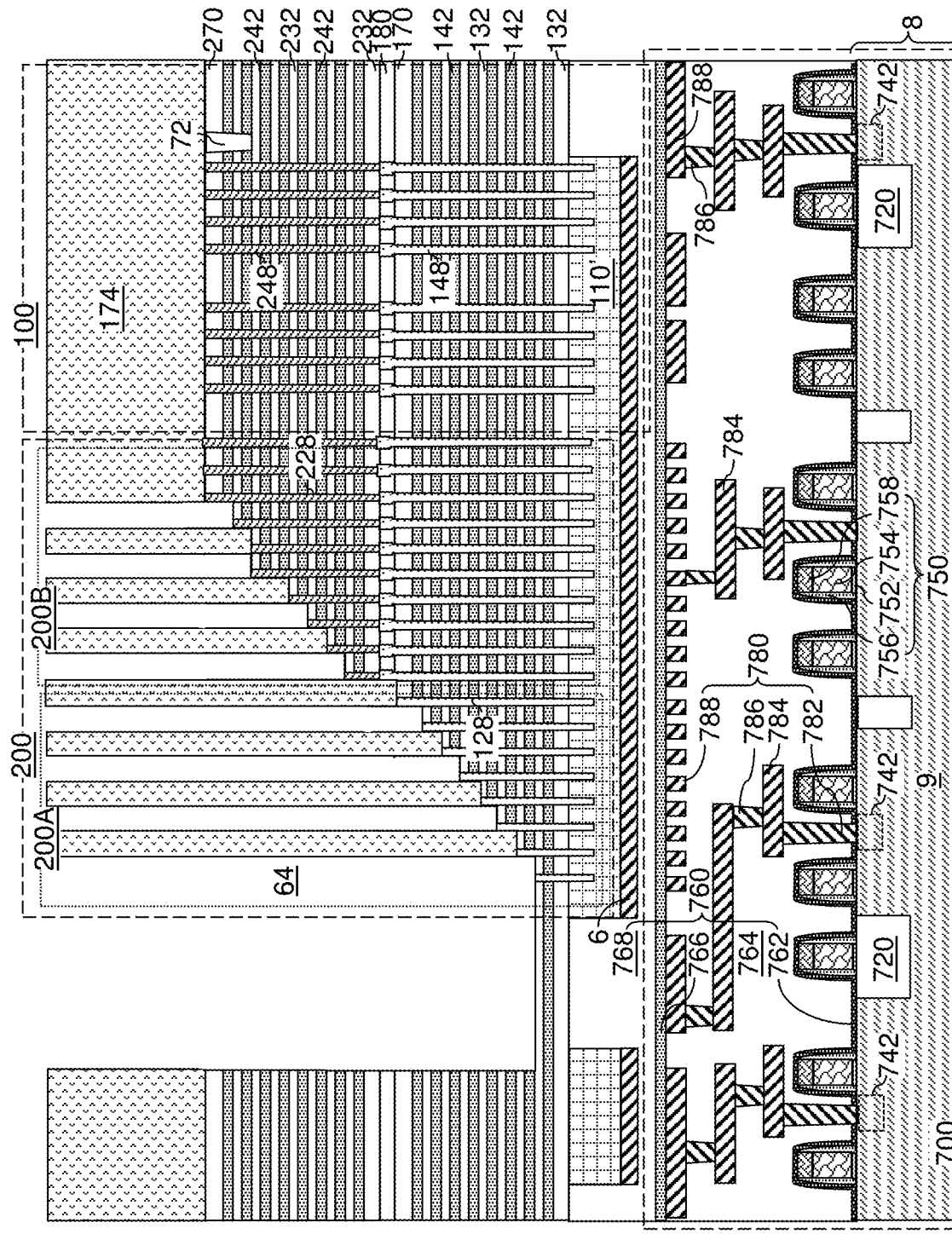

Referring to FIGS. 9C-9E, at least one set of patterning process steps can be subsequently performed to form first stepped surfaces within the area of the recess trench 64 as formed at the processing steps of FIG. 9B, and to form second stepped surfaces within an area located between the memory array region 100 and the area of the recess trench 64 as formed at the processing steps of FIG. 9B. Each set of patterning process steps comprises a patterned etch mask formation step in which a respective etch mask partially covering a respective area of the first stepped surfaces and partially covering a respective area of the second stepped surfaces is formed. Further, each set of patterning process steps comprises an anisotropic etch step in which a respective subset of layers within the first-tier alternating stack (132, 142) and a respective subset of layers within the second-tier alternating stack (232, 242) are vertically etched within areas that are not covered by the respective etch mask.

Referring to FIG. 9C, the first exemplary structure is illustrated after a second set of patterning process steps, which includes a second patterned etch mask formation step and a second anisotropic etch step. During the second patterned etch mask formation step, a second photoresist layer 172 can be applied over the first exemplary structure, and can be lithographically patterned to form a first opening located within the first area 200A of the staircase region 200 (which is the same as the area of the recess trench 64 as formed at the processing steps of FIG. 9B) and to form a second opening located within the second area 200B of the staircase region 200 (which is located between the first area 200A of the staircase region 200 and the memory array region 100). During the second anisotropic etch step, first stepped surfaces can be patterned in the first-tier alternating stack (132, 142) underneath a volume of the recess trench 64 within the first area, and second stepped surfaces can be patterned in the second-tier alternating stack (232, 242) adjacent to the volume of the recess trench 46 as formed at the processing steps of FIG. 9A (i.e., within the second area 200B of the staircase region 200).

In a non-limiting illustrative example, the total number of first sacrificial material layers 142 may be an integer Q1 that is in a range from $2^{(N-1)}+1$ to $2^N$, and the total number of second sacrificial material layers 242 may be Q2 that is in a range from $2^{(N-1)}+1$ to $2^N$. In one embodiment, Q2 may be the same as Q1. The value of N may be in a range from 3 to 10, such as from 4 to 8, although lesser and greater numbers can be employed. In this case, the total number of adjoining pairs of a first insulating layer 132 and a first sacrificial material layer 142 that is etched by the second anisotropic etch step can be in a range from $2^{(N-2)}+1$ to $2^{(N-1)}$, and may be in a range from min(Q1, Q2)/2 and max(Q1, Q2)/2, in which min(Q1, Q2) represents the minimum of Q1 and Q2, and max(Q1, Q2) represents the maximum of Q1 and Q2. The total number of adjoining pairs of a second insulating layer 232 and a second sacrificial material layer 242 that is etched by the second anisotropic etch step is the same as the total number of adjoining pairs of a first insulating layer 132 and a first sacrificial material layer 142 that is etched by the second anisotropic etch step. For example, four pairs may be etched. The second photoresist layer 172 can be subsequently removed, for example, by ashing.

Referring to FIG. 9D, the first exemplary structure is illustrated after a third set of patterning process steps, which includes a third patterned etch mask formation step and a third anisotropic etch step. During the third patterned etch mask formation step, a third photoresist layer 173 can be applied over the first exemplary structure, and can be lithographically patterned to form first openings 200A located within the first area of the staircase region 200 (which is the same as the area of the recess trench 64 as formed at the processing steps of FIG. 9A) and to form second openings located within the second area 200B of the staircase region 200 (which is located between the first area 200A of the staircase region 200 and the memory array region 100). During the third anisotropic etch step, the first stepped surfaces in the first-tier alternating stack (132, 142) can be further patterned within the first area, and second stepped surfaces in the second-tier alternating stack (232, 242) can be further patterned within the second area.

In the above described non-limiting illustrative example in which the total number of first sacrificial material layers 142 may be an integer Q1 that is in a range from $2^{(N-1)}+1$ to $2^N$, and the total number of second sacrificial material layers 242 may be Q2 that is in a range from $2^{(N-1)}+1$ to $2^N$, the total number of adjoining pairs of a first insulating layer 132 and a first sacrificial material layer 142 that is etched by the third anisotropic etch step underneath any given opening in the third photoresist layer 173 can be in a range from $2^{(N-3)}+1$ to $2^{(N-2)}$, and may be in a range from min(Q1, Q2)/4 and max(Q1, Q2)/4, in which min(Q1, Q2) represents the minimum of Q1 and Q2, and max(Q1, Q2) represents the maximum of Q1 and Q2. The total number of adjoining pairs of a second insulating layer 232 and a second sacrificial material layer 242 that is etched by the third anisotropic etch step underneath any given opening in the third photoresist layer 173 is the same as the total number of adjoining pairs of a first insulating layer 132 and a first sacrificial material layer 142 that is etched by the third anisotropic etch step underneath a respective opening in the third photoresist layer 173. For example, two pairs may be etched. The third photoresist layer 173 can be subsequently removed, for example, by ashing.

Referring to FIG. 9E, the first exemplary structure is illustrated after a fourth set of patterning process steps, which includes a fourth patterned etch mask formation step and a fourth anisotropic etch step. During the fourth patterned etch mask formation step, a fourth photoresist layer 174 can be applied over the first exemplary structure, and can be lithographically patterned to form first openings located within the first area 200A of the staircase region 200 (which is the same as the area of the recess trench 64 as formed at the processing steps of FIG. 9A) and to form second openings located within the second area 200B of the staircase region 200 (which is located between the first area 200B of the staircase region 200 and the memory array region 100). During the fourth anisotropic etch step, the first stepped surfaces in the first-tier alternating stack (132, 142) can be further patterned within the first area, and second stepped surfaces in the second-tier alternating stack (232, 242) can be further patterned within the second area.

In the above described non-limiting illustrative example in which the total number of first sacrificial material layers 142 may be an integer Q1 that is in a range from $2^{(N-1)}+1$ to $2^N$, and the total number of second sacrificial material layers 242 may be Q2 that is in a range from $2^{(N-1)}+1$ to $2^N$, the total number of adjoining pairs of a first insulating layer 132 and a first sacrificial material layer 142 that is etched by the fourth anisotropic etch step underneath any given opening in the fourth photoresist layer 174 can be in a range from $2^{(N-4)}+1$ to $2^{(N-3)}$, and may be in a range from min(Q1, Q2)/8 and max(Q1, Q2)/8, in which min(Q1, Q2) represents the minimum of Q1 and Q2, and max(Q1, Q2) represents the maximum of Q1 and Q2. The total number of adjoining pairs of a second insulating layer 232 and a second sacrificial material layer 242 that is etched by the fourth anisotropic etch step underneath any given opening in the fourth photoresist layer 174 is the same as the total number of adjoining pairs of a first insulating layer 132 and a first sacrificial material layer 142 that is etched by the fourth anisotropic etch step underneath a respective opening in the fourth photoresist layer 174. For example, one pair may be patterned. The fourth photoresist layer 174 can be subsequently removed, for example, by ashing.

Generally, multiple sets of patterning process steps can be repeated performed until first stepped surfaces are formed on the first-tier alternating stack (132, 142) and second stepped surfaces are formed in the second-tier alternating stack (232, 242) such that horizontal surfaces of each of the first sacrificial material layers 142 and the second sacrificial material layers 242 are physically exposed. The total number of layers within the first-tier alternating stack (132, 142) and the second-tier alternating stack (232, 242) that are etched by the anisotropic etch processes of the multiple sets of patterning process steps within each unmasked area (i.e., within each area that is not masked by a patterned photoresist layer) differ among the anisotropic etch processes. In one embodiment, the total number of layers within the first-tier alternating stack (132, 242) and the second-tier alternating stack (232, 242) that are etched by the anisotropic etch processes of the multiple sets of patterning process steps within each unmasked area can be is 2 for one of the anisotropic etch processes, can be 4 for another of the anisotropic etch processes, and can be 2' for at least yet another of the anisotropic etch process in which i is an integer greater than 2. In one embodiment, the total number of layers within the first-tier alternating stack (132, 242) and the second-tier alternating stack (232, 242) that are etched by the anisotropic etch processes of the multiple sets of patterning process steps within each unmasked area can be $2^{(N-1)}$, $2^{(N-2)}$, $2^{(N-3)}$, . . . , 8, 4, 2, and 1.

In one embodiment, each etch mask employed within the at least one set of patterning process steps comprises a patterned photoresist layer that partly covers a first area of the first stepped surfaces, does not cover a second area of the first stepped surfaces, covers a first area of the second stepped surfaces, and does not cover a second area of the second stepped surfaces. The recess trench 64 is converted into a continuous stepped cavity overlying the first stepped surfaces and the second stepped surfaces by the at least one set of patterning process steps.

Figure 9F:
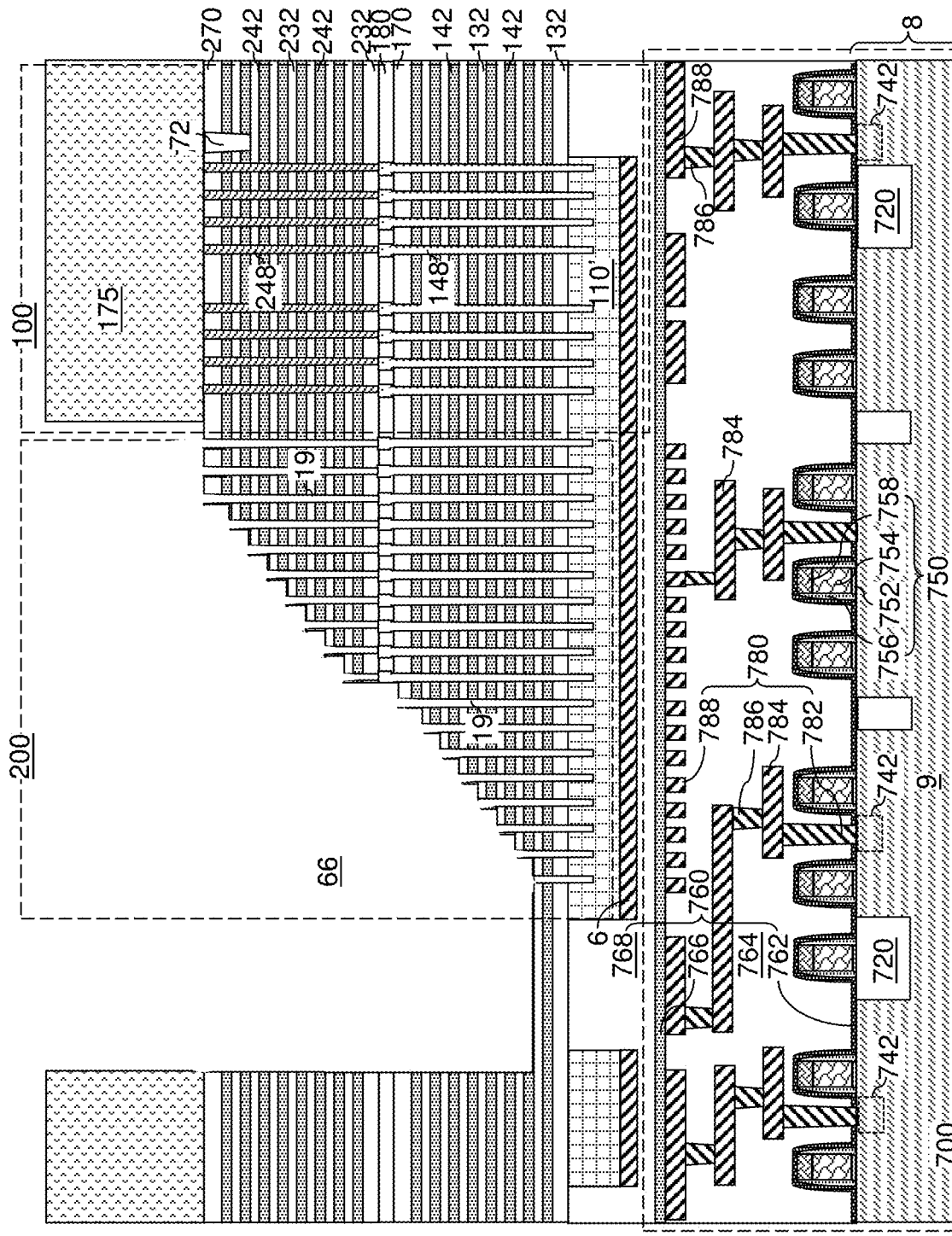

Referring to FIG. 9F, a terminal (i.e., final) photoresist layer 175 can be applied over the first exemplary structure, and can be lithographically patterned to cover the memory array region 100 without covering the staircase region 200. An etch process can be performed to remove the materials of the sacrificial second-tier memory opening fill portions 248 and the sacrificial first-tier memory opening fill portions 148. The etch process may include an isotropic etch process (such as a wet etch process) or an anisotropic etch process (such as a reactive ion etch process). Voids are formed within the volumes of the sacrificial first-tier support opening fill portions 148 and the sacrificial second-tier support opening fill portions 248 upon selective removal of the sacrificial first-tier support opening fill portions 148 and the sacrificial second-tier support opening fill portions 248 after formation of the continuous stepped cavity. The voids are herein referred to as support openings 19. The support openings 19 vertically extend from one of the first and second stepped surfaces into the in-process source-level material layers 110'.

A continuous stepped cavity 66 is formed with the area of the staircase region 200. The bottom surfaces of the continuous stepped cavity comprise the first stepped surfaces and the second stepped surfaces. The continuous stepped cavity 66 comprises a set of straight sidewalls that vertically extend at least from a topmost layer within the second-tier alternating stack (232, 242) at least to the topmost layer within the first-tier alternating stack (132, 142), and continuously extending from a bottommost surface of the first stepped surfaces to a topmost surface of the second stepped surfaces. Each of the sacrificial material layers (142, 242) other than the bottommost one of the first sacrificial material layers 142 can be physically exposed to the continuous stepped cavity 66.

In one embodiment, the set of straight sidewalls comprise a pair of lengthwise sidewalls that laterally extend along a first horizontal direction hd1, and laterally spaced apart from each other along a second horizontal direction hd2 that is perpendicular to the first horizontal direction hd1. The set of straight sidewalls comprises a widthwise sidewall that continuously extends through each level of vertical steps within the first stepped surfaces and the second stepped surfaces. The terminal photoresist layer 175 can be subsequently removed, for example, by ashing.

Figure 10:
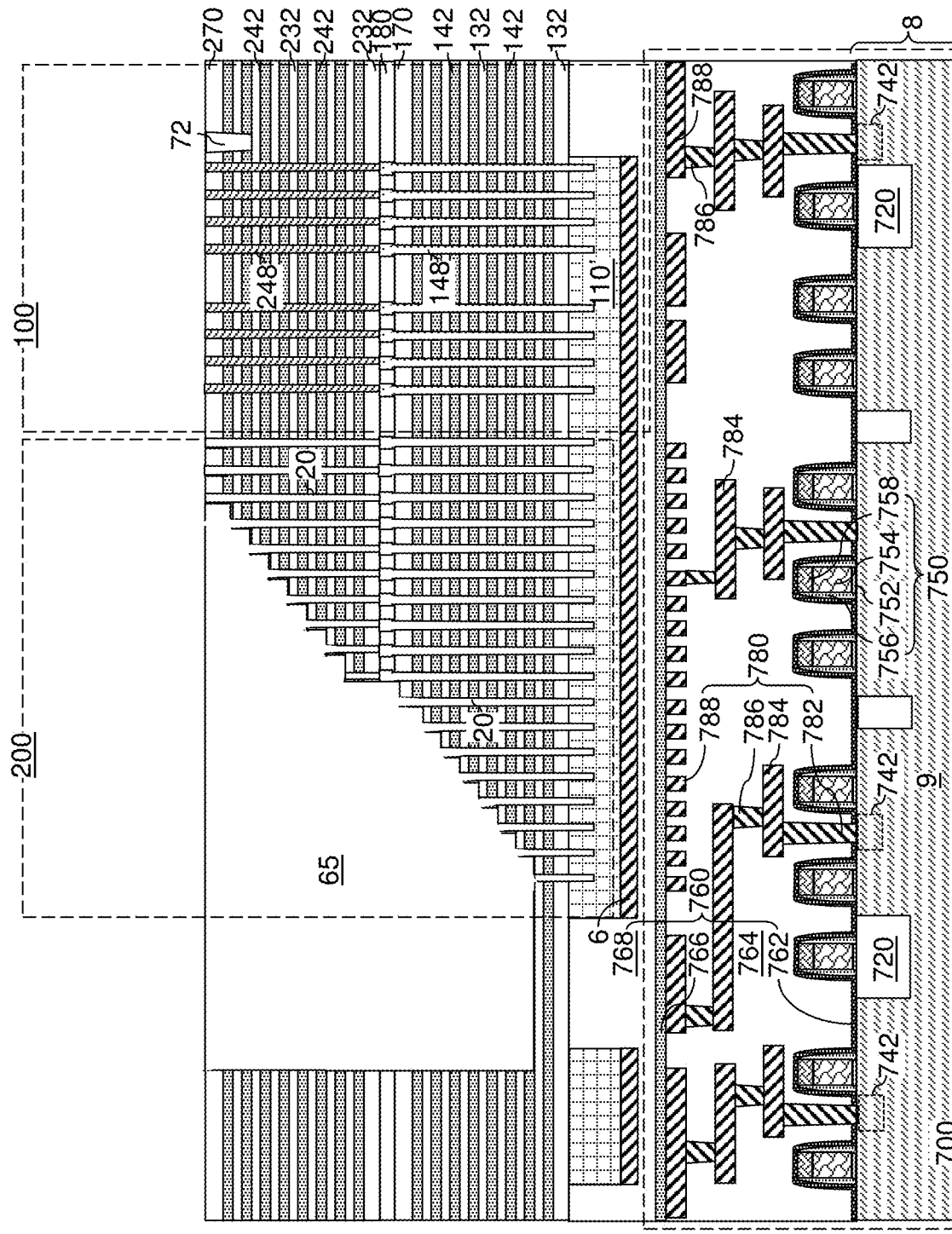
FIG. 10 is a vertical cross-sectional view of the first exemplary structure after formation of a retro-stepped dielectric material portion according to the first embodiment of the present disclosure.

Referring to FIG. 10, a retro-stepped dielectric material portion 65 can be formed by depositing a dielectric material such as undoped silicate glass or a doped silicate glass into the volume of the continuous stepped cavity 66 and the support openings 19. Excess portions of the deposited dielectric material can be removed from above the horizontal plane including the top surface of the second insulating cap layer 270 by a planarization process, which may comprise a chemical mechanical polishing process and/or a recess etch process. Remaining portions of the deposited dielectric material comprise a retro-stepped dielectric material portion 65 that fills the continuous stepped cavity 66. Generally, the retro-stepped dielectric material portion 65 can be formed by depositing a dielectric material on the first stepped surfaces and on the second stepped surfaces in a same dielectric material deposition step, and subsequently planarizing the dielectric material. The top surface of the retro-stepped dielectric material portion 65 can be located within a same horizontal plane as the top surface of the second insulating cap layer 270.

In one embodiment, the retro-stepped dielectric material portion 65 has a homogeneous material composition throughout, contacts each of the first stepped surfaces and the second stepped surfaces, has a set of straight sidewalls that vertically extend at least from a topmost layer within the second-tier alternating stack (232, 242) at least to the topmost layer within the first-tier alternating stack (132, 142), and continuously extends from a bottommost surface of the first stepped surfaces to a topmost surface of the second stepped surfaces. In one embodiment, the set of straight sidewalls include a pair of lengthwise sidewalls that vertically extends from a top surface of the second insulating cap layer 270 at least to a horizontal plane including a top surface of a first insulating layer that is most proximal to the in-process source-level material layers 110' of a set of all first insulating layers 132 other than the bottommost one of the first insulating layers 132.

Dielectric pillar portions 20 can be formed within the volumes of the support openings 19. The retro-stepped dielectric material portion 65 can comprise a first subset of the dielectric pillar portions 20. In other words, the first subset of the dielectric pillar portions 20 can be portions of the retro-stepped dielectric material portion 65. A second subset of the dielectric pillar portions 20 may be optionally provided, which can be detached from the retro-stepped dielectric material portion 65 and vertically extend through each layer of the first-tier alternating stack (132, 142) and the second-tier alternating stack (232, 242).

Figure 11:
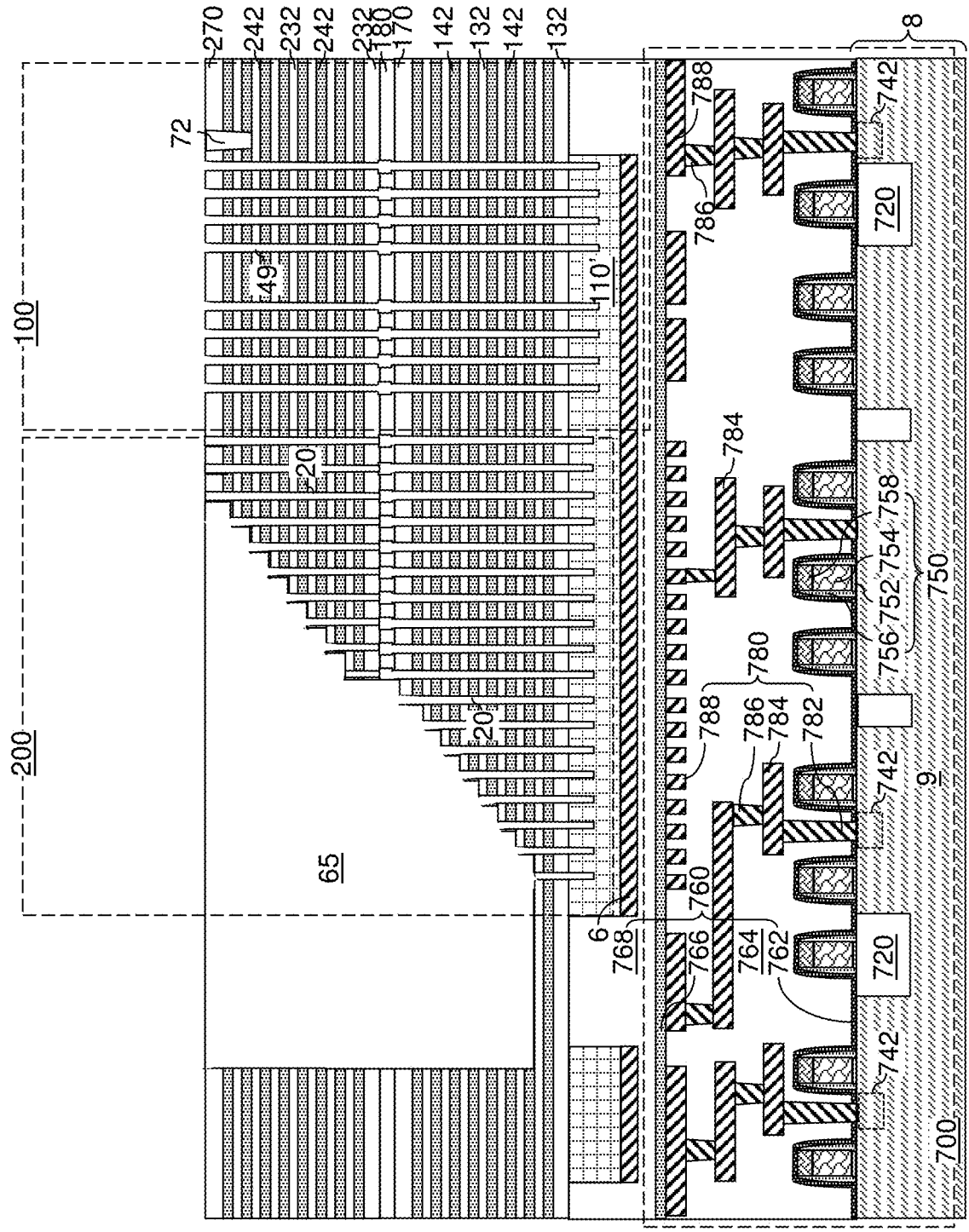
FIG. 11 is a vertical cross-sectional view of the first exemplary structure after formation of inter-tier memory openings according to the first embodiment of the present disclosure.

Referring to FIG. 11, the sacrificial materials of the sacrificial second-tier memory opening fill portions 248 and the sacrificial first-tier memory opening fill portions 148 may be removed using an etch process that etches the sacrificial materials selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed.

FIGS. 12A-12D provide sequential cross-sectional views of a memory opening 49 during formation of a memory opening fill structure.

Referring to FIG. 12A, a memory opening 49 in the first exemplary device structure of FIG. 11 is illustrated. The memory opening 49 extends through the first-tier structure and the second-tier structure.

Referring to FIG. 12B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figure 12C:
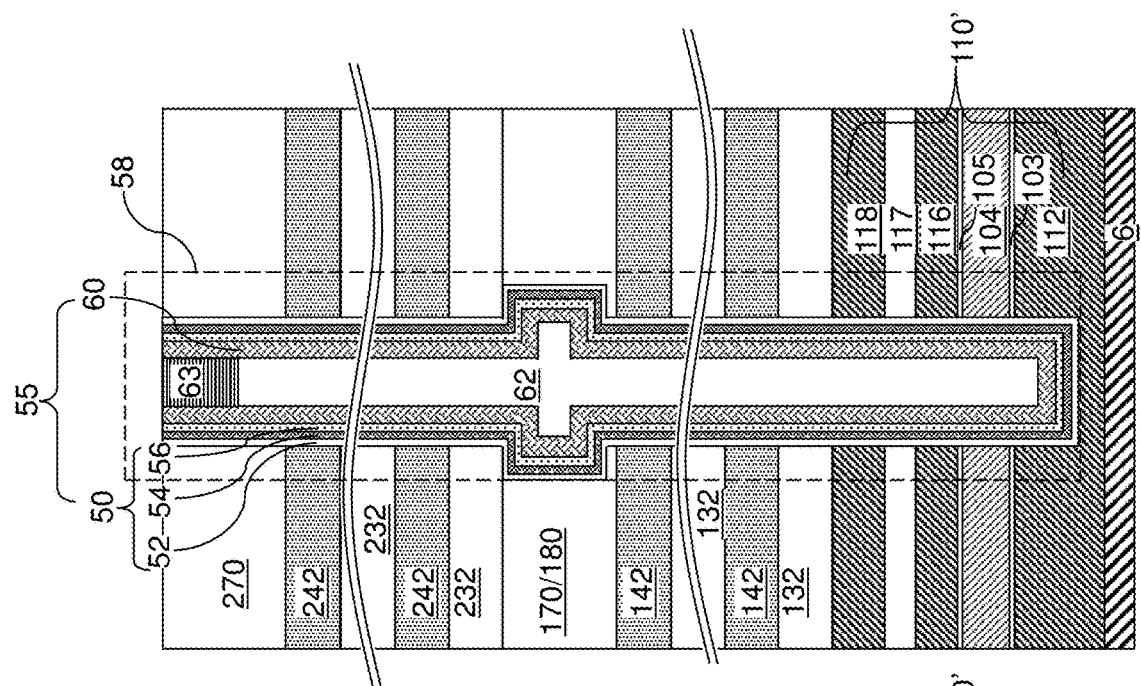

Referring to FIG. 12C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Figure 12D:
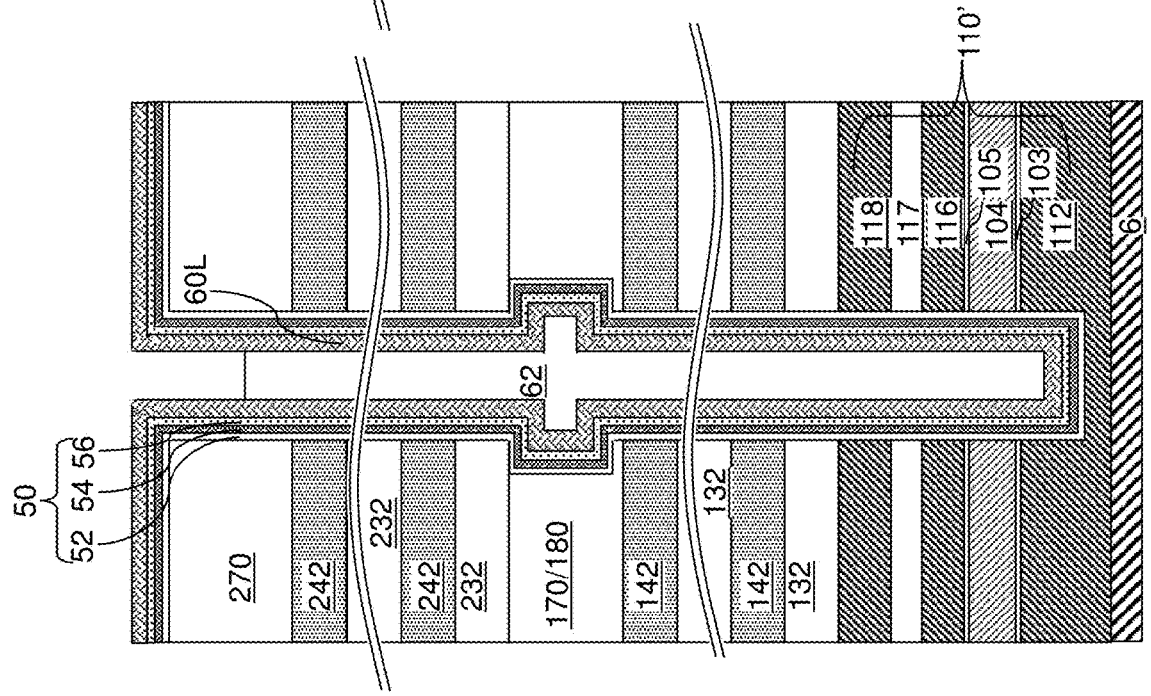
Figure 13:
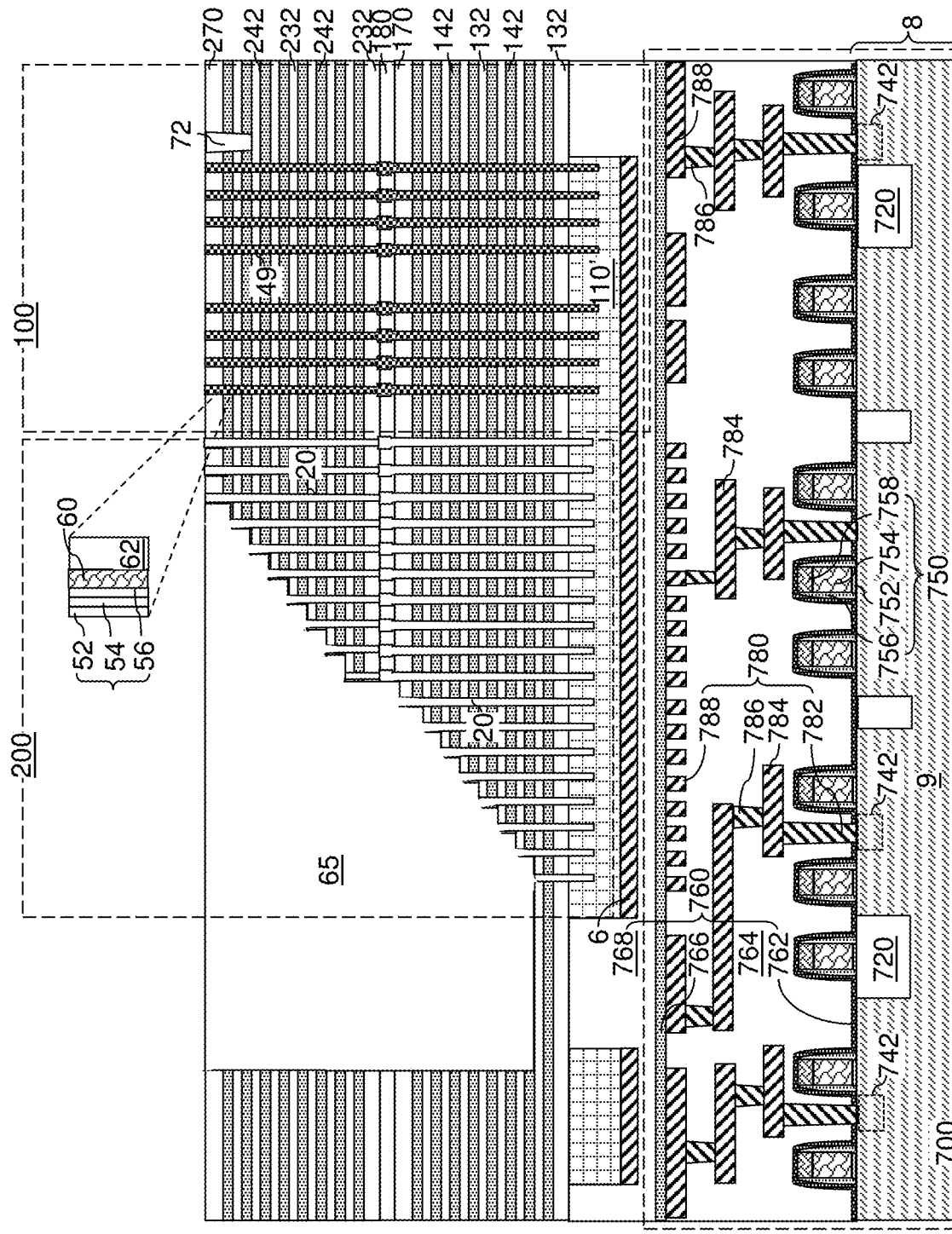
FIG. 13 is a vertical cross-sectional view of the first exemplary structure after formation of memory opening fill structures according to the first embodiment of the present disclosure.

Referring to FIGS. 12D and 13, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a vertical stack of memory elements comprising portions of the charge storage layer 54 located at the levels of the sacrificial material layers (142, 242), and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170), the second-tier structure (232, 242, 270, 265, 72), the inter-tier dielectric layer 180, and the memory opening fill structures 58 collectively constitute a memory-level assembly.

Figure 14A:
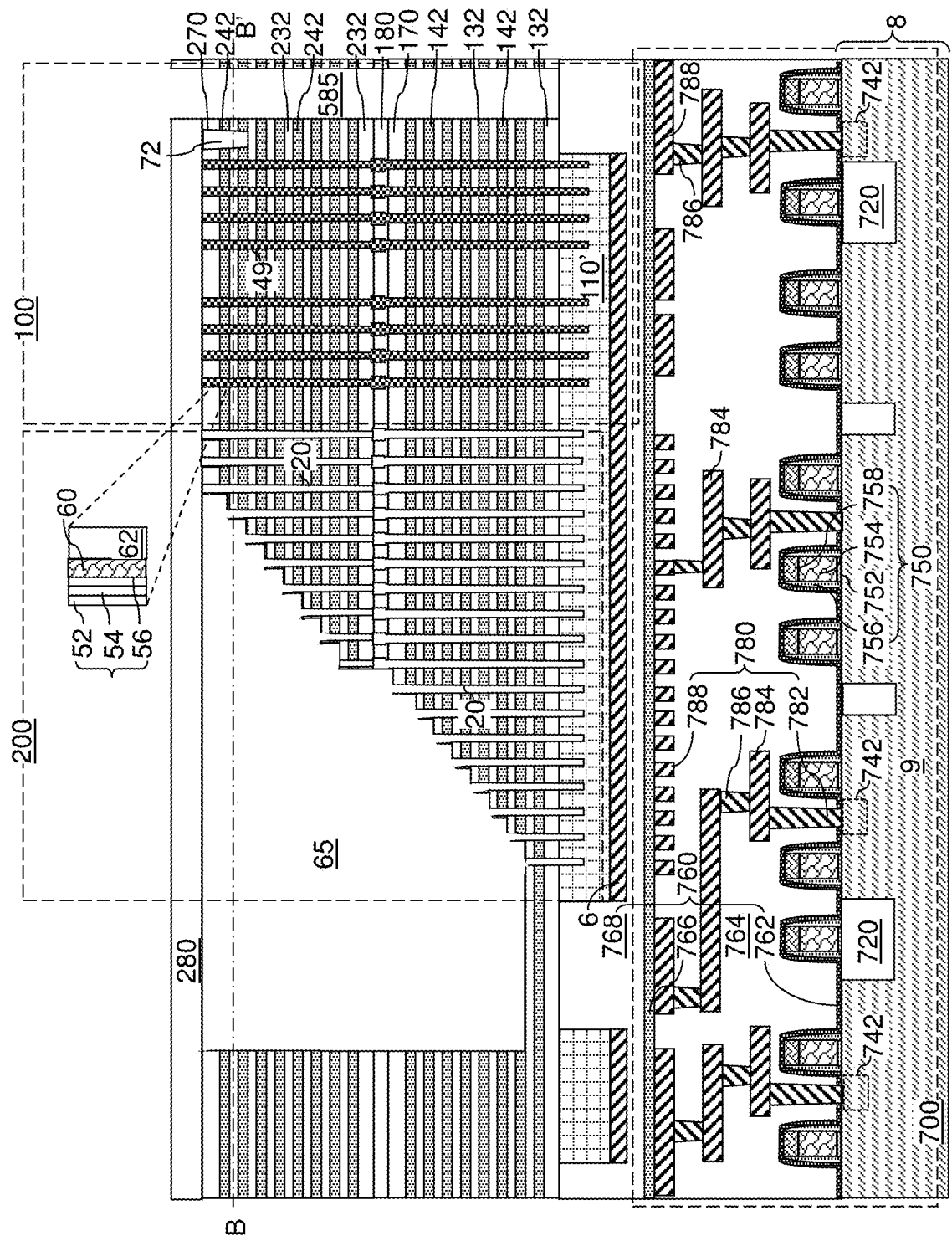
FIG. 14A is a vertical cross-sectional view of the first exemplary structure after formation of a first contact-level dielectric layer and pillar cavities according to the first embodiment of the present disclosure.

Referring to FIGS. 14A and 14B, a first contact-level dielectric layer 280 may be formed over the second insulating cap layer 270. The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 72), and the first-tier structure (132, 142, 170) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 15:
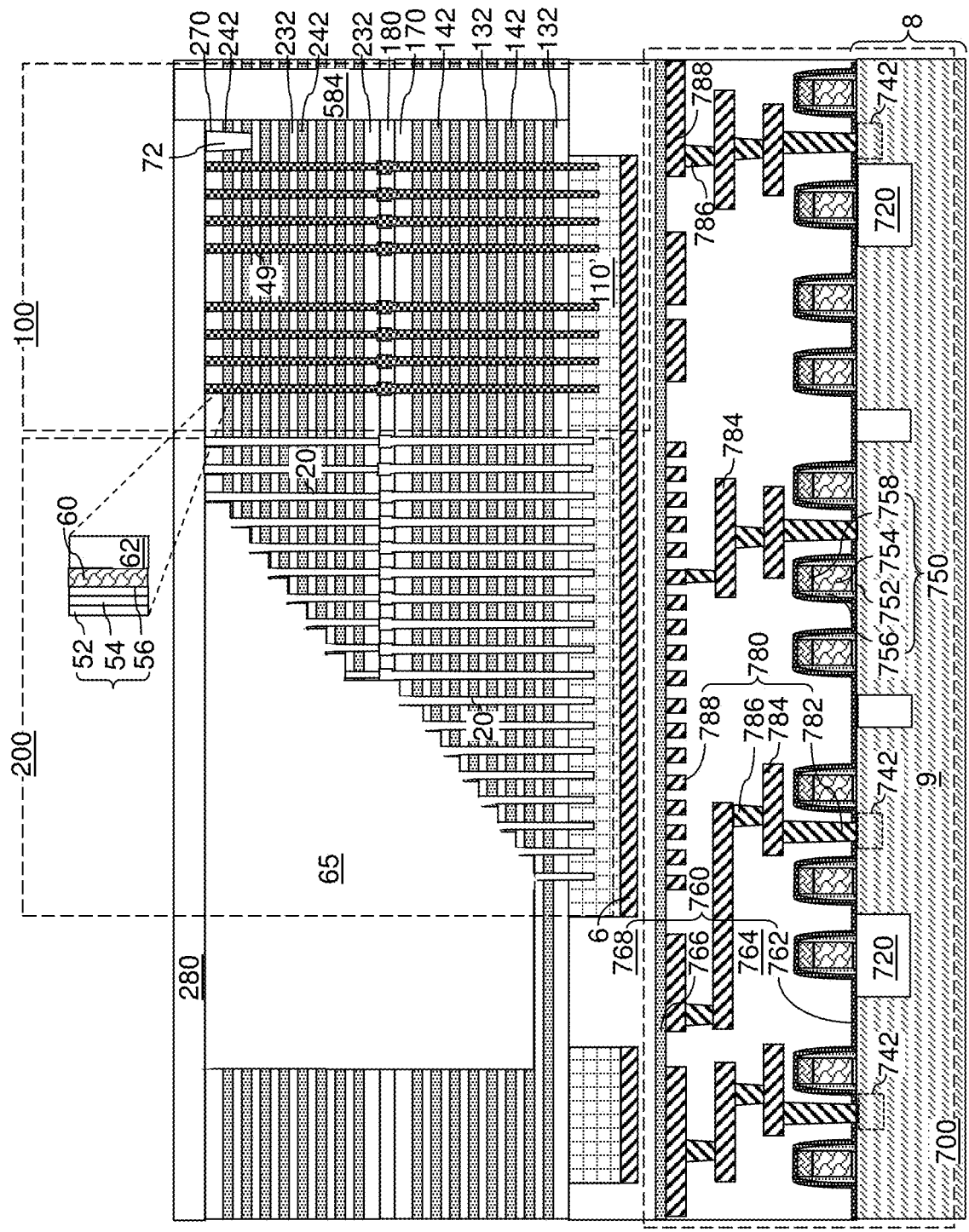
FIG. 15 is a vertical cross-sectional view of the first exemplary structure after formation of dielectric pillar structures according to the first embodiment of the present disclosure.

Referring to FIG. 15, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 16A:
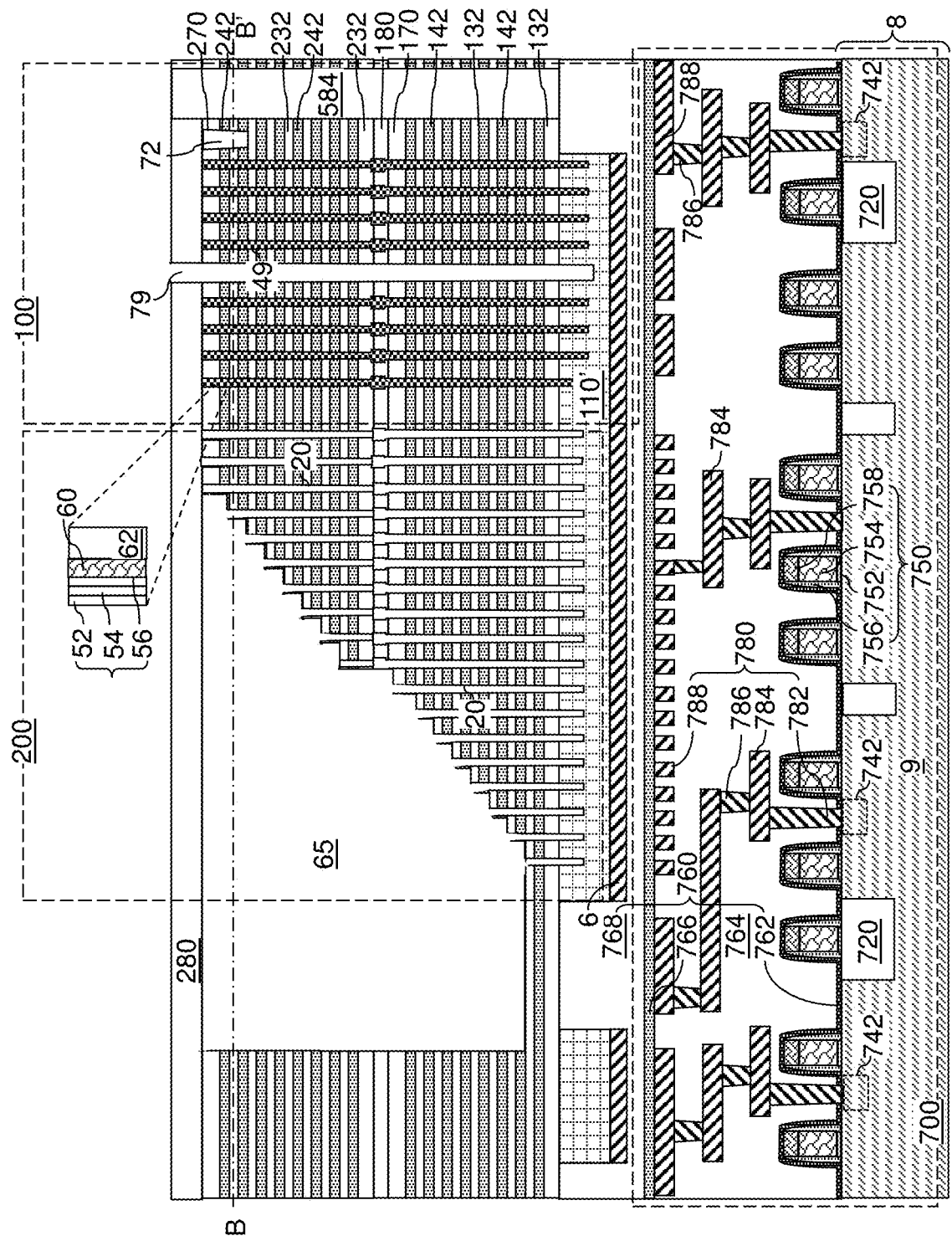
FIG. 16A is a vertical cross-sectional view of the first exemplary structure after formation of backside trenches according to the first embodiment of the present disclosure.
Figure 16B:
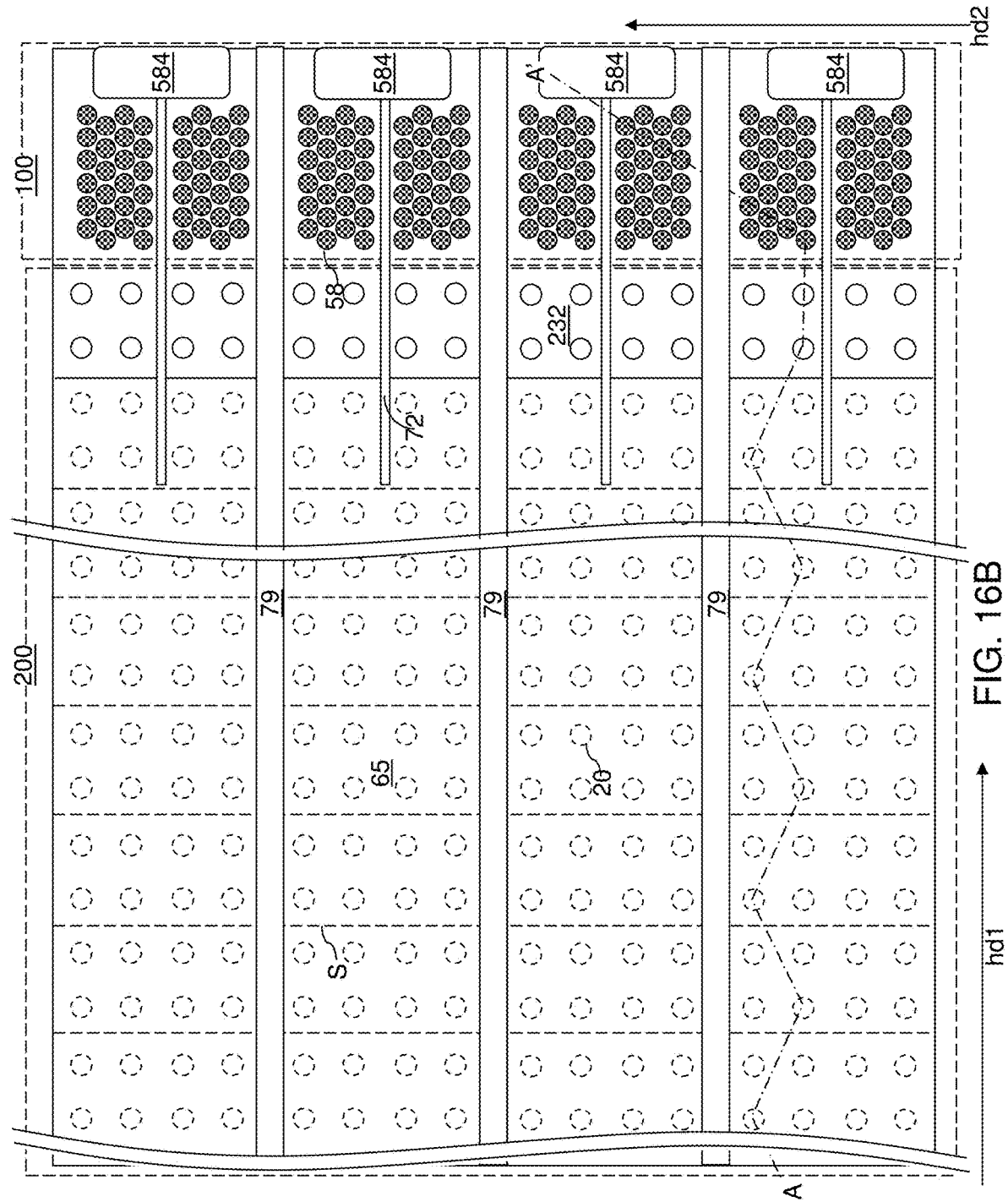
FIG. 16B is a horizontal cross-sectional view of the first exemplary structure along the horizontal plane B-B' of FIG. 16A. The hinged vertical plane A-A' corresponds to the plane of the vertical cross-sectional view of FIG. 16A.

Referring to FIGS. 16A and 16B, a photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 72), and the first-tier structure (132, 142, 170), and into the in-process source-level material layers 110'. Portions of the first contact-level dielectric layer 280, the second-tier structure (232, 242, 270, 72), the first-tier structure (132, 142, 170), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 17:
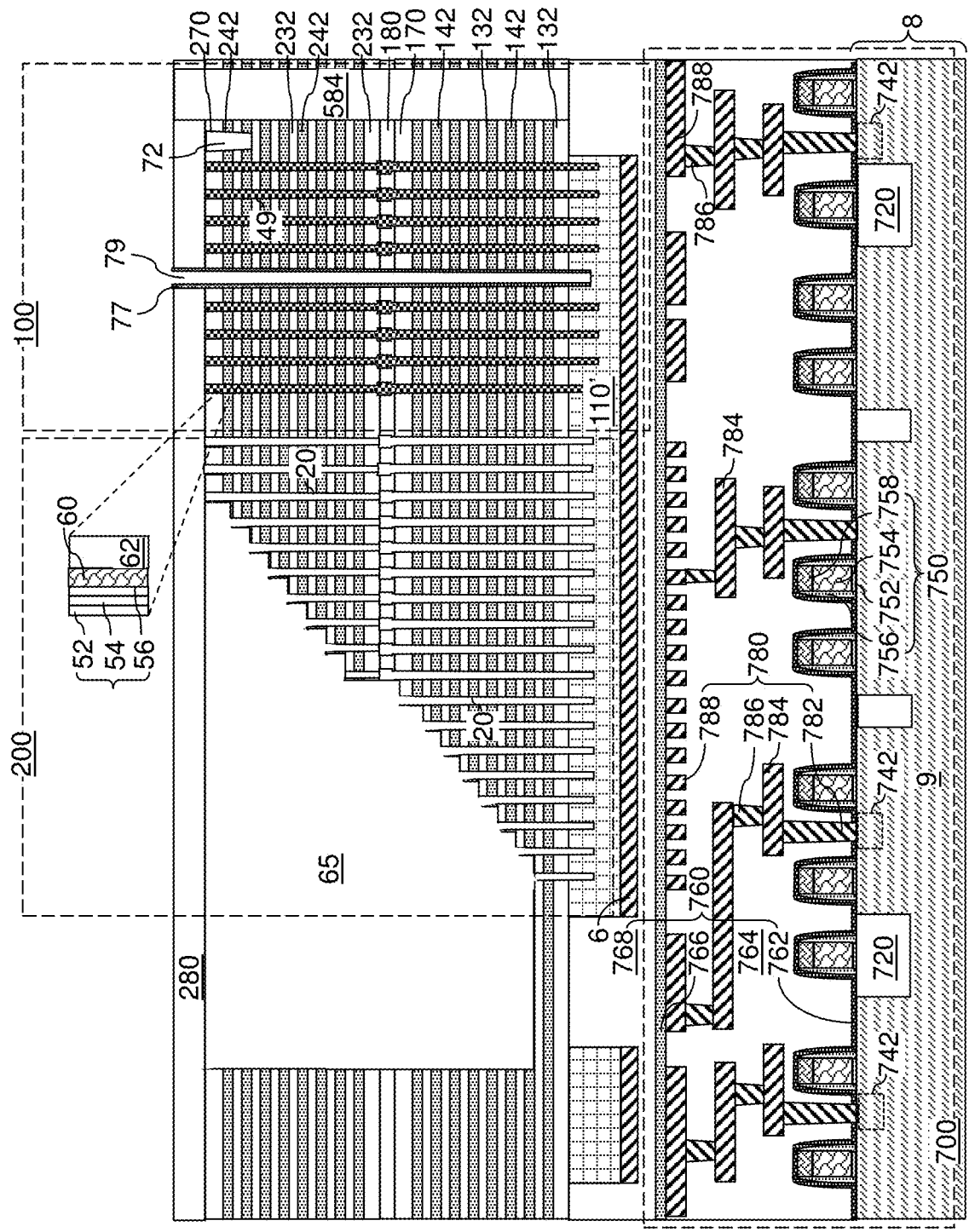
FIG. 17 is a vertical cross-sectional view of the first exemplary structure after formation of backside trench spacers according to the first embodiment of the present disclosure.
Figure 18A:
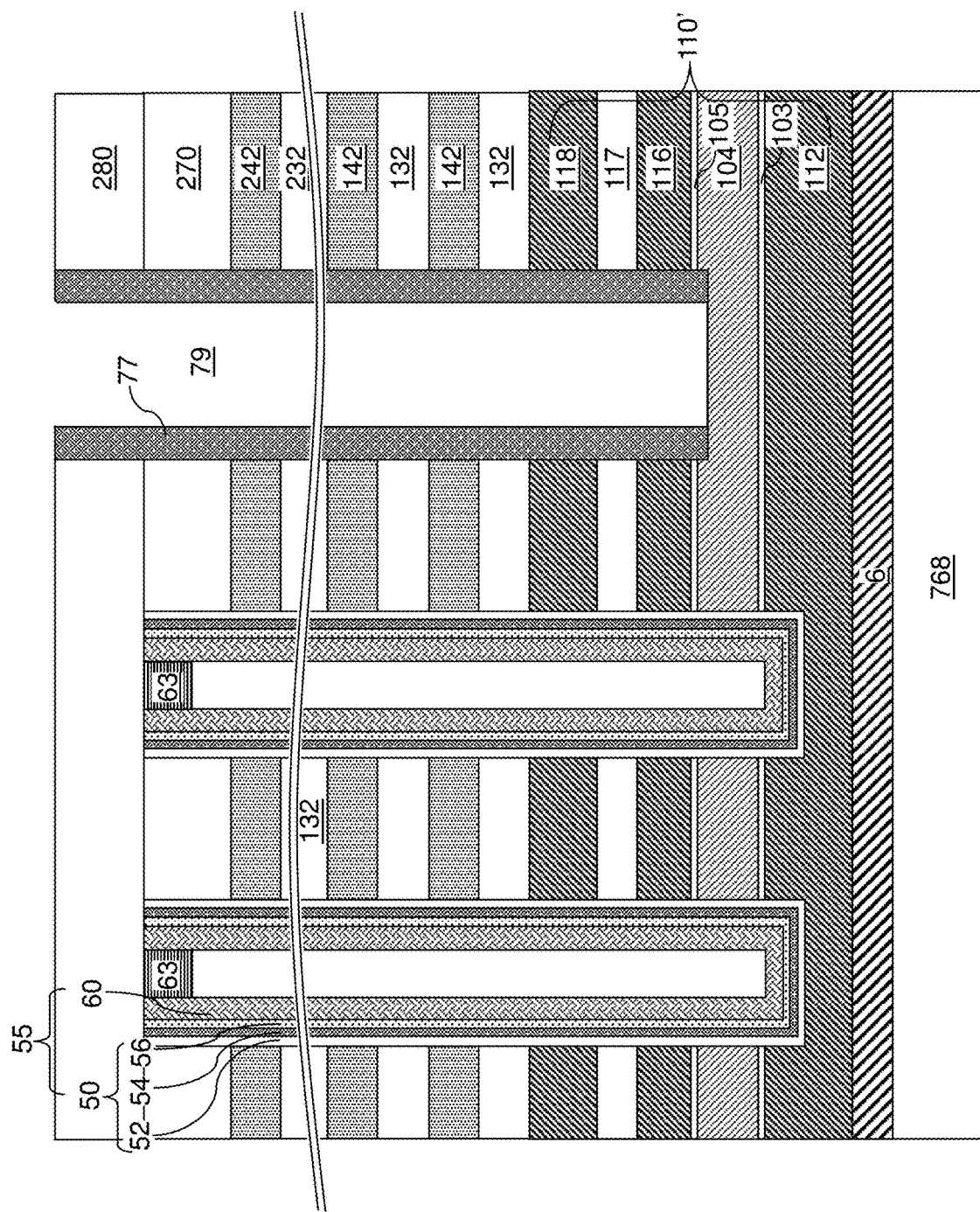
FIGS. 18A-18E illustrate sequential vertical cross-sectional views of memory opening fill structures and a backside trench during formation of source-level material layers according to the first embodiment of the present disclosure.

Referring to FIGS. 17 and 18A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 18B:
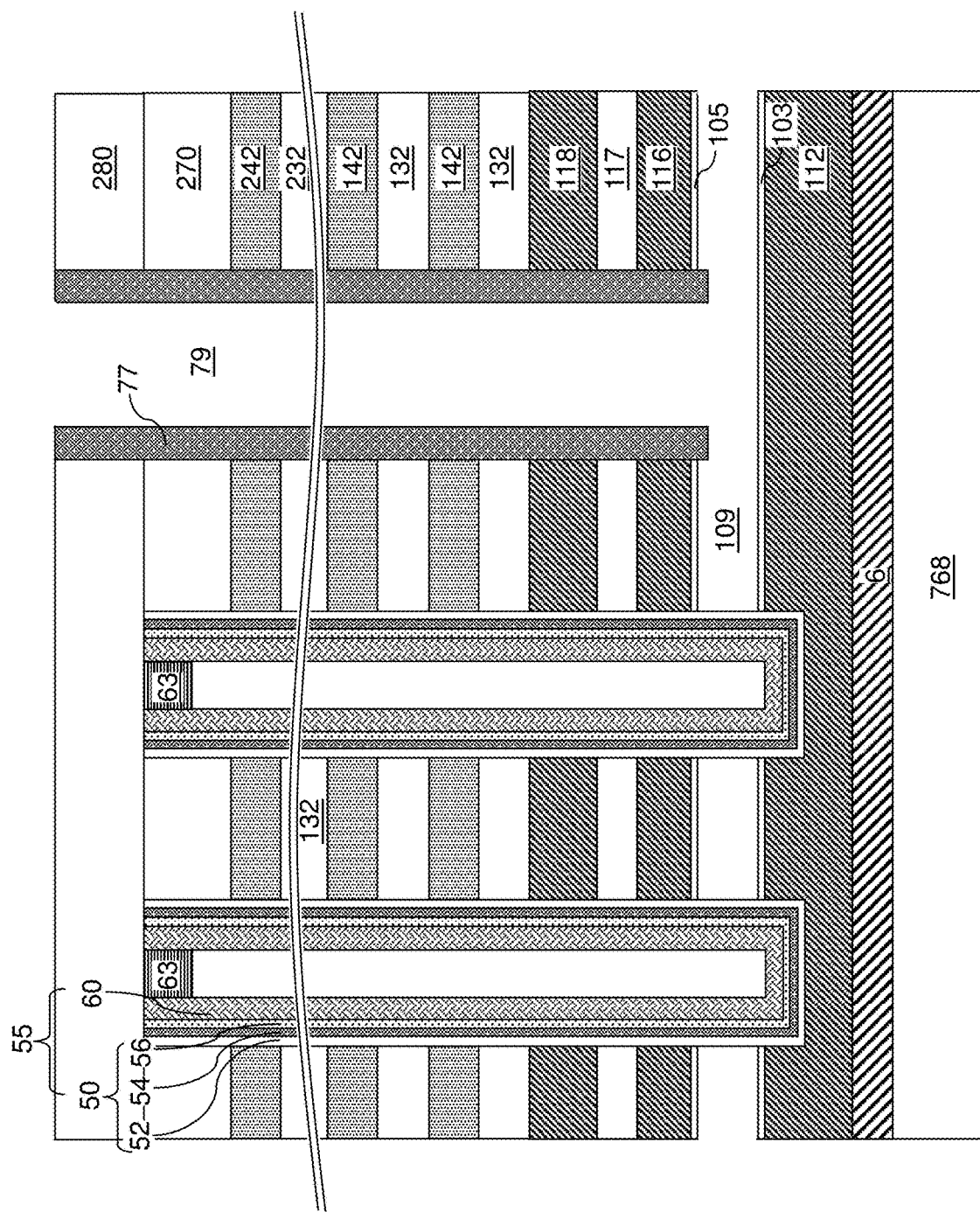

Referring to FIG. 18B, an etchant that etches the material of the source-level sacrificial layer 104 selective to the materials of the first-tier alternating stack (132, 142), the second-tier alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 18C:
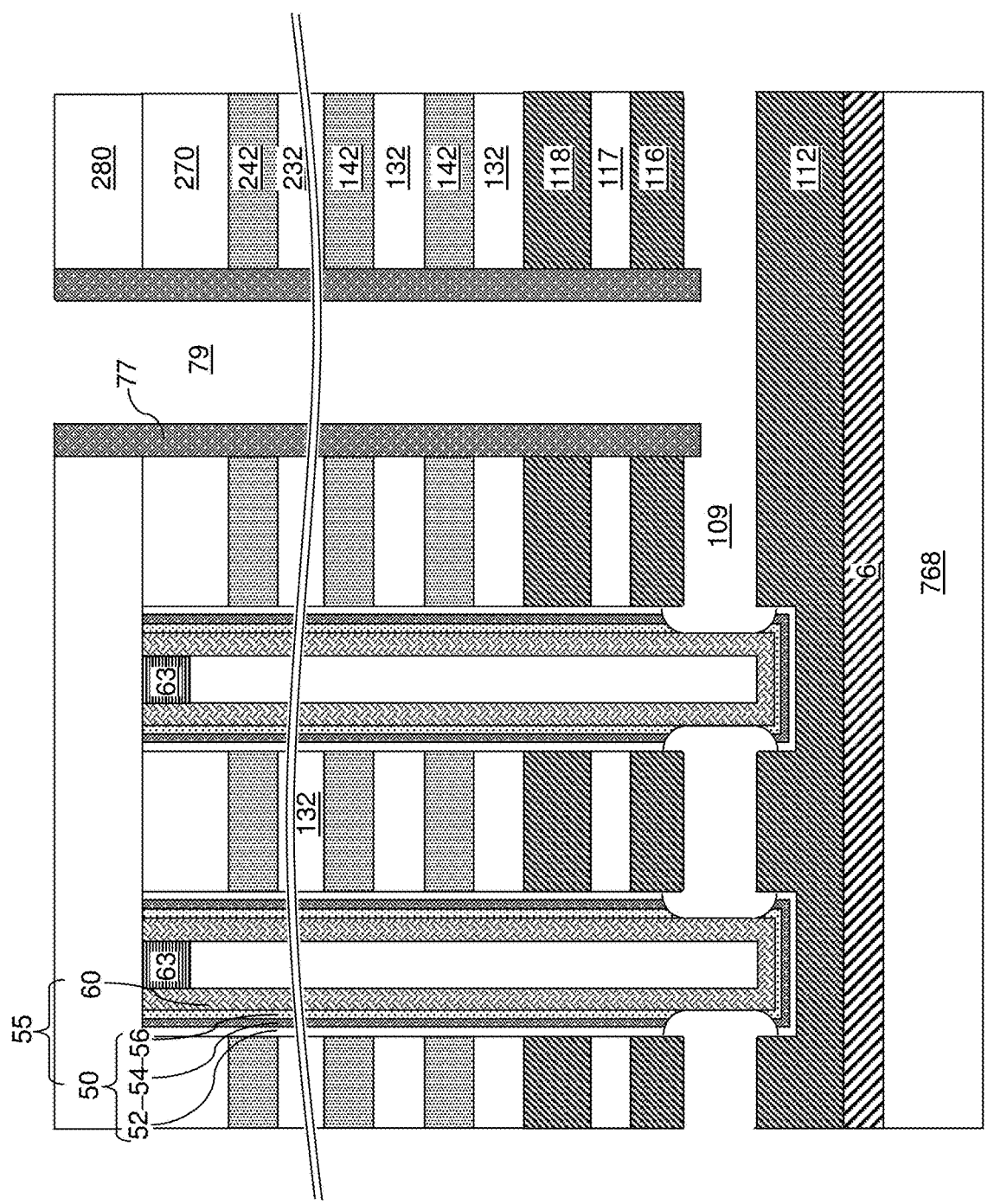

Referring to FIG. 18C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 18D:
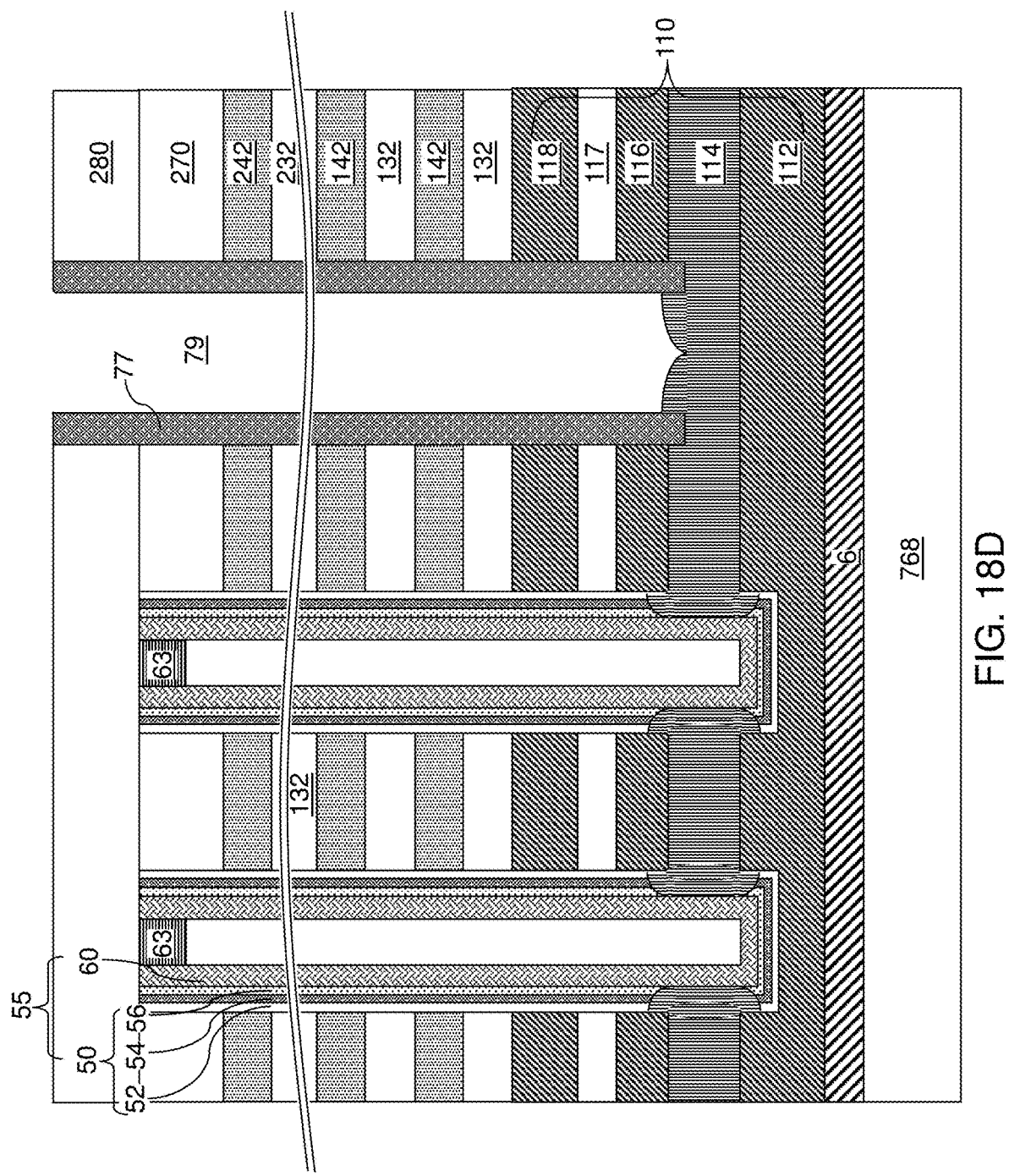

Referring to FIG. 18D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 18E:
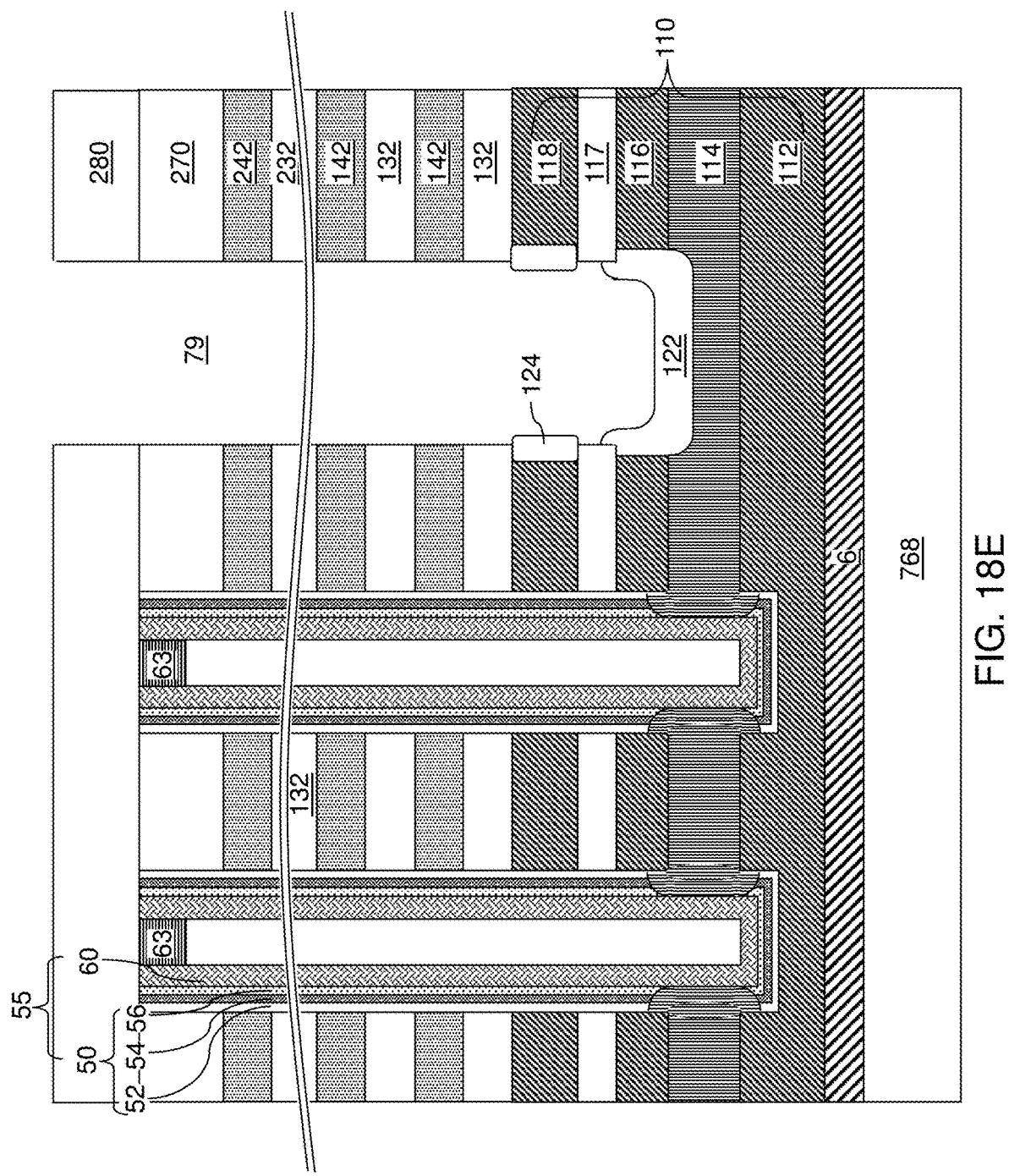
Figure 19:
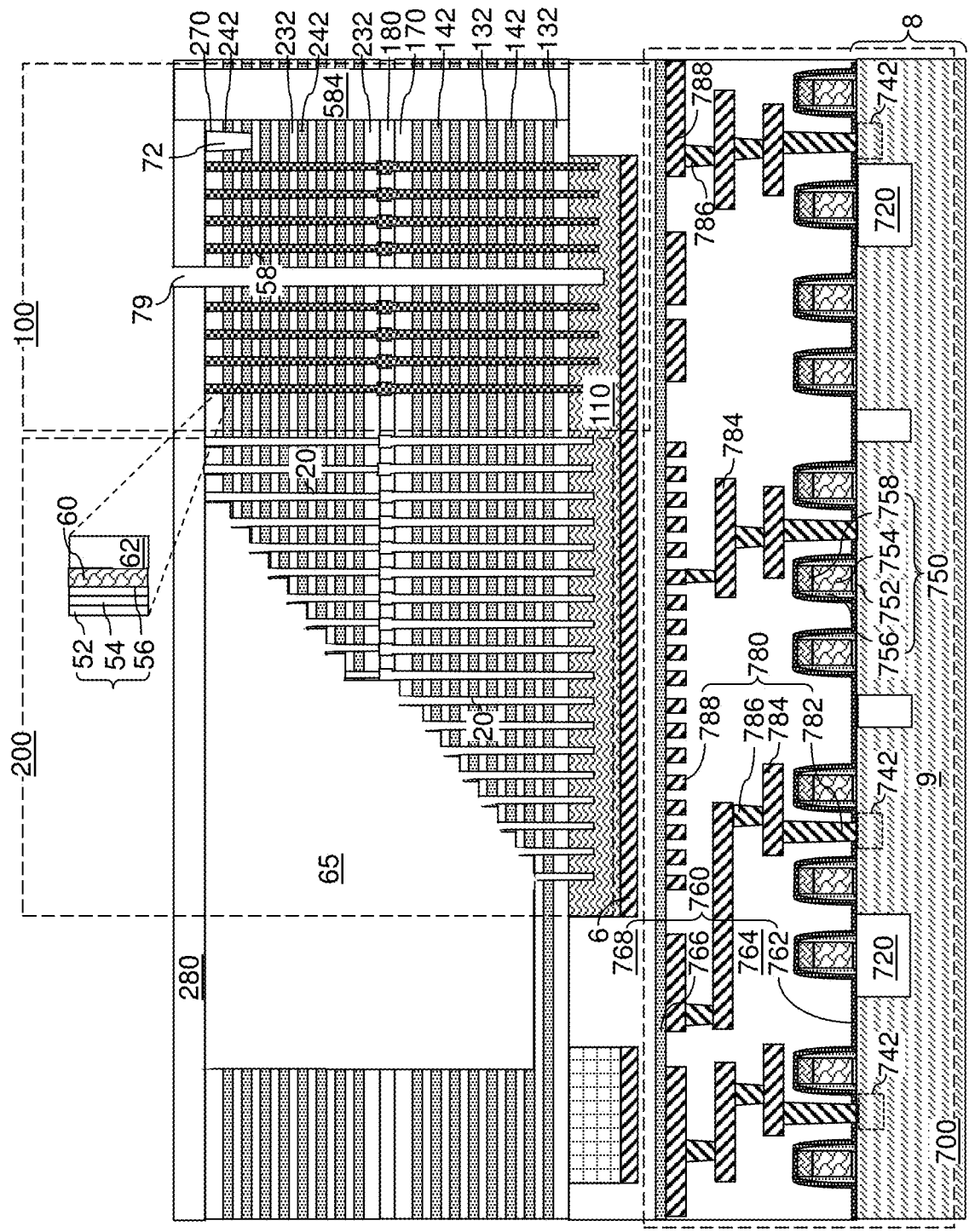
FIG. 19 is a vertical cross-sectional view of the first exemplary structure after formation of source-level material layers according to the first embodiment of the present disclosure.

Referring to FIGS. 18E and 19, the backside trench spacers 77 may be removed selective to the insulating layers (132, 232), the first and second insulating cap layers (170, 270), the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 20:
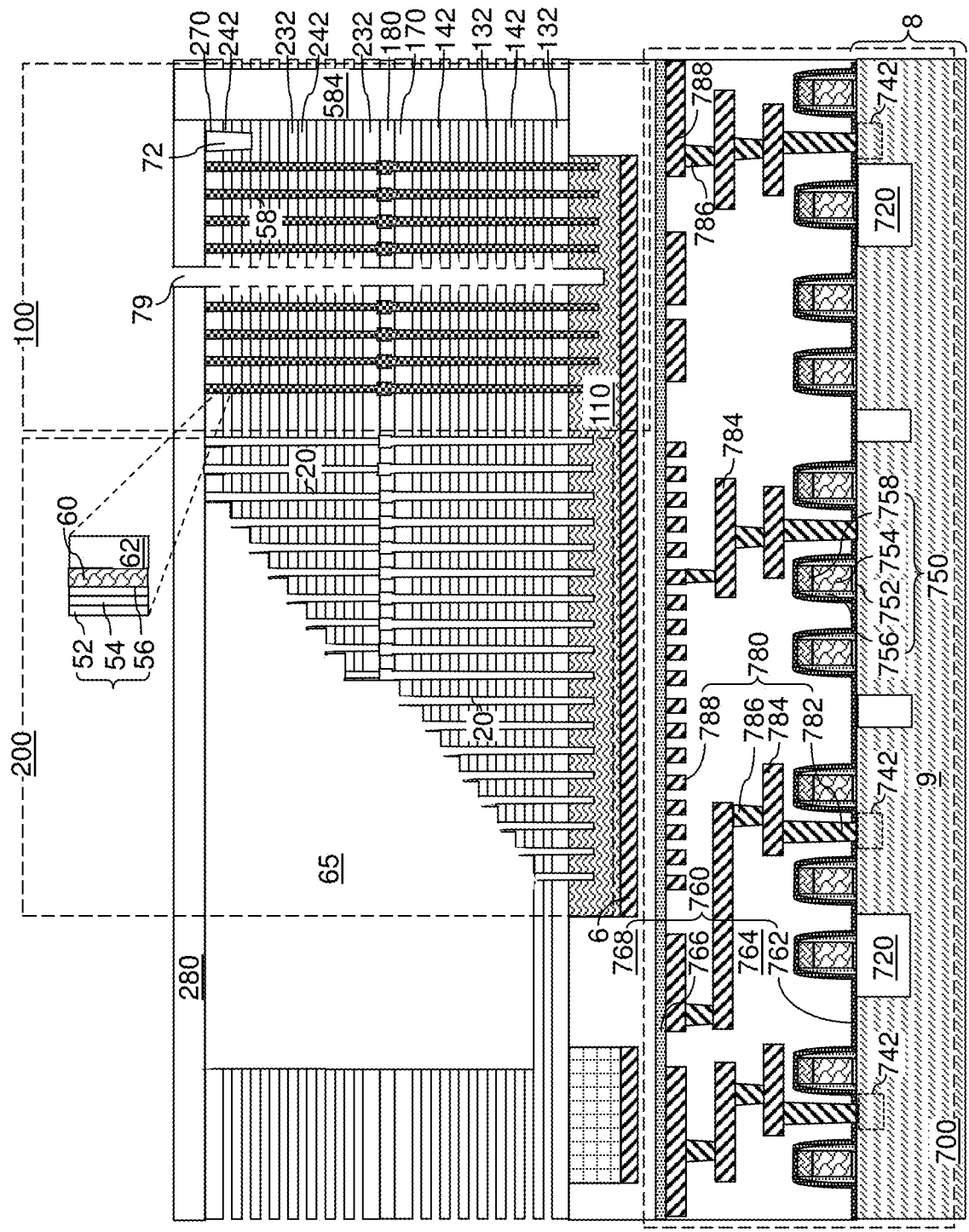
FIG. 20 is a vertical cross-sectional view of the first exemplary structure after formation of backside recesses according to the first embodiment of the present disclosure.

Referring to FIG. 20, the sacrificial material layers (142, 242) are removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 21A:
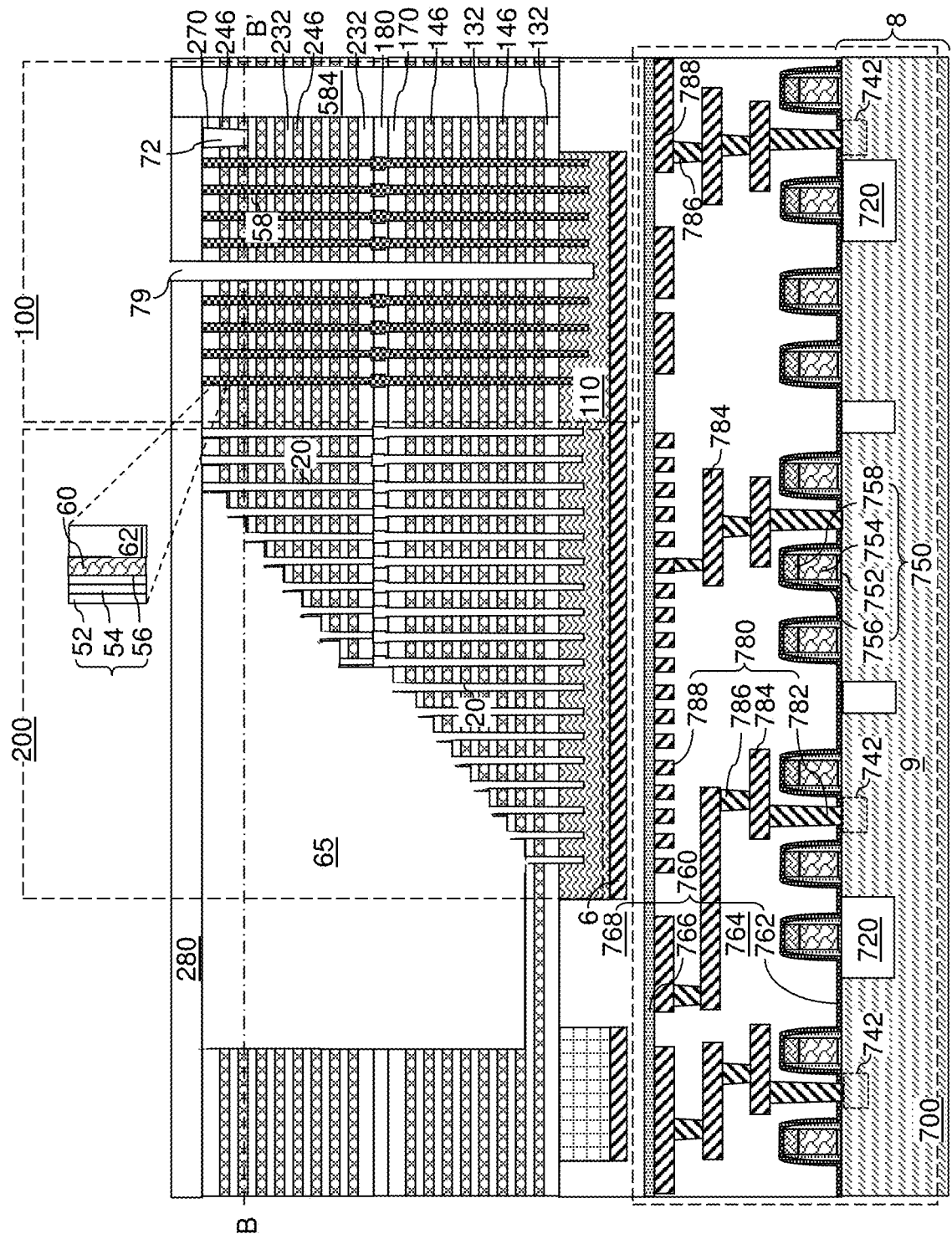
FIG. 21A is a vertical cross-sectional view of the first exemplary structure after formation of electrically conductive layers according to the first embodiment of the present disclosure.
Figure 21B:
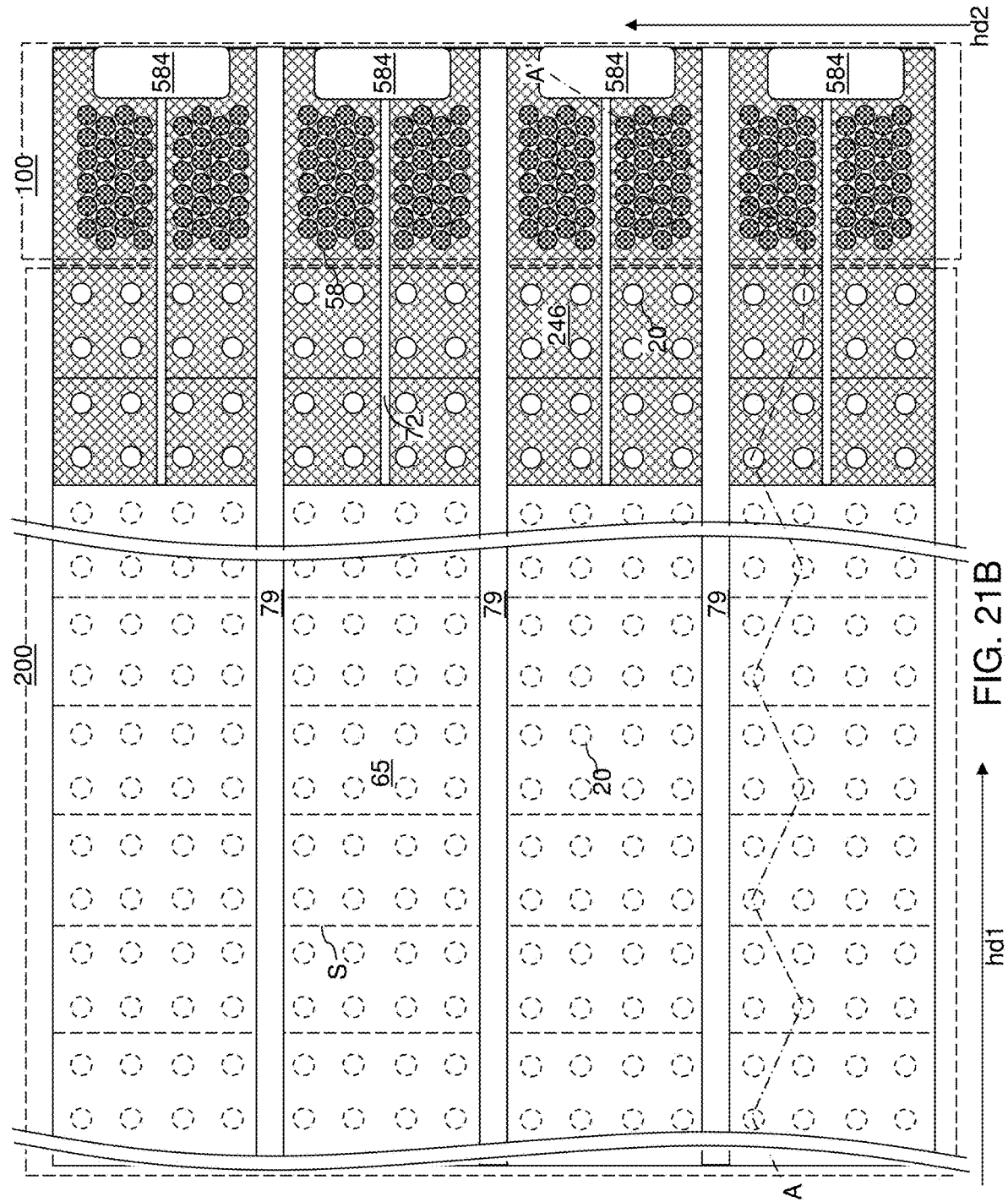
FIG. 21B is a horizontal cross-sectional view of the first exemplary structure along the horizontal plane B-B' of FIG. 21A. The hinged vertical plane A-A' corresponds to the plane of the vertical cross-sectional view of FIG. 21A.

Referring to FIGS. 21A and 21B, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the dielectric pillar portions 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Generally, the first sacrificial material layers 142 and the second sacrificial material layers 242 are replaced with first electrically conductive layers 146 and second electrically conductive layers 246, respectively.

Figure 22:
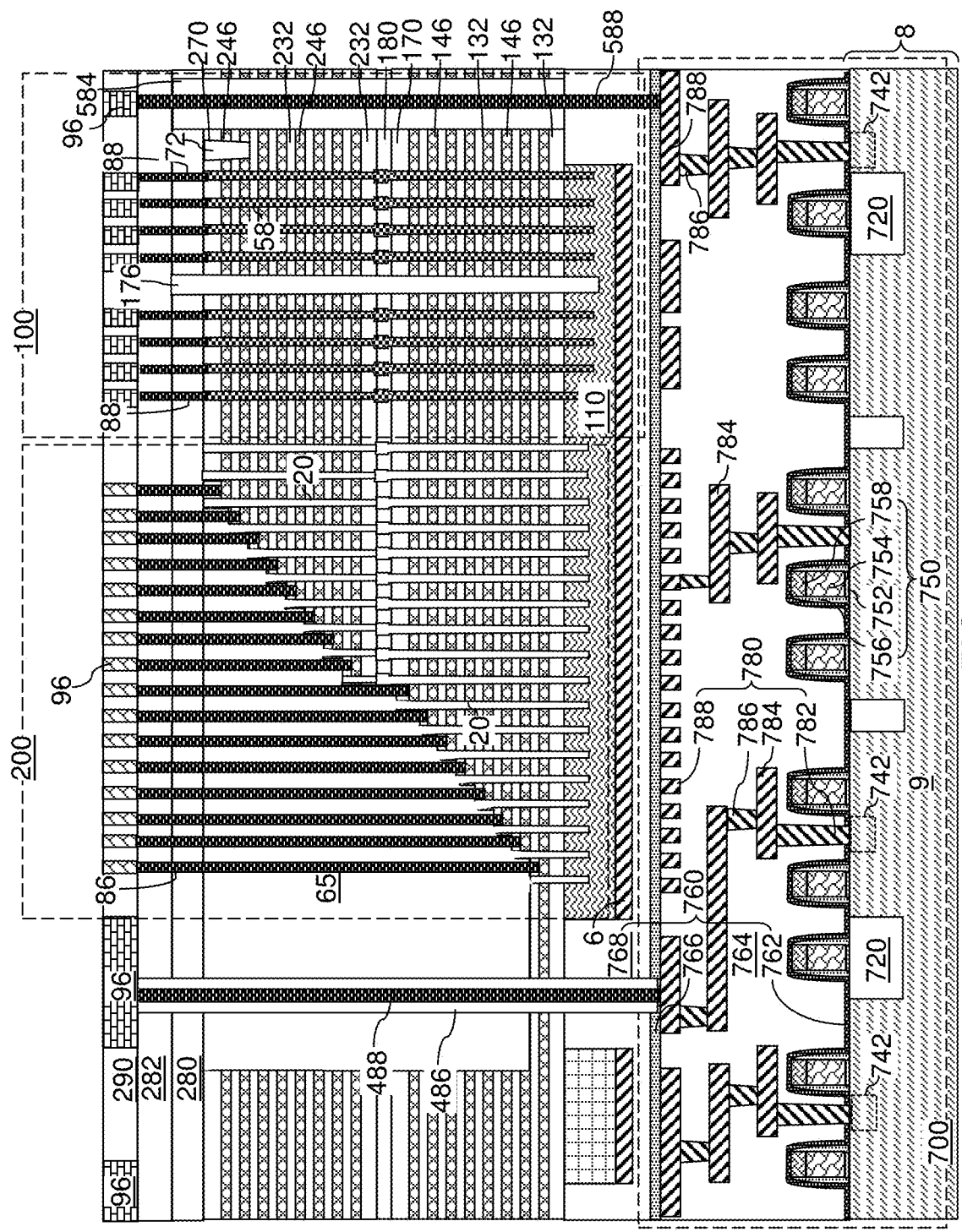
FIG. 22 is a vertical cross-sectional view of the first exemplary structure after formation of a second contact-level dielectric layer, various contact via structures, through-memory-level via structures, and upper metal line structures according to the first embodiment of the present disclosure.

Referring to FIG. 22, a backside trench fill material portion 176 can be formed within each backside trench 79. In one embodiment, the backside trench fill material portions 176 may include dielectric material portions. A second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146, 246) at the stepped surfaces underlying the retro-stepped dielectric material portion 65. The photoresist layer may be subsequently removed, for example, by ashing.

Drain contact via structures 88 are formed in the drain contact via cavities and on a top surface of a respective one of the drain regions 63. Layer contact via structures 86 are formed in the staircase-region contact via cavities and on a top surface of a respective one of the electrically conductive layers (146, 246). The layer contact via structures 86 may include drain select level contact via structures that contact a subset of the second electrically conductive layers 246 that function as drain select level gate electrodes. Further, the layer contact via structures 86 may include word line contact via structures that contact electrically conductive layers (146, 246) that underlie the drain select level gate electrodes and function as word lines for the memory stack structures 55.

Peripheral-region via cavities may be formed through the second and first contact-level dielectric layers (282, 280), the retro-stepped dielectric material portion 65, and the drain-side dielectric layers 768 to top surfaces of a first subset of the lower-level metal interconnect structure 780 in the peripheral device region. Through-memory-region via cavities may be formed through the interconnection region dielectric fill material portions 584 and the drain-side dielectric layers 768 to top surfaces of a second subset of the lower-level metal interconnect structure 780. Optionally, an insulating spacer 486 may be formed at peripheral portions of the peripheral-region via cavities. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the layer contact via structures 86 and/or the peripheral-region contact via structures 488 and/or the through-memory-region via structures 588. The word line contact via structures (which are provided as a subset of the layer contact via structures 86) may be electrically connected to the word line driver circuit through a subset of the lower-level metal interconnect structures 780 and through a subset of the peripheral-region contact via structures 488.

FIGS. 23A-23H are sequential vertical cross-sectional views of a second exemplary structure during formation of stepped surfaces according to a second embodiment of the present disclosure. The second exemplary structure of FIG. 23A can be derived from the first exemplary structure by forming a third-tier alternating stack of third insulating layers 332 and third sacrificial material layers 342. Various openings vertically extending through the various alternating stacks and various sacrificial opening fill structures are not illustrated for clarity. Generally, two or more alternating stacks vertically spaced among one another by insulating cap layers (170, 270) can be formed.

Figure 23A:
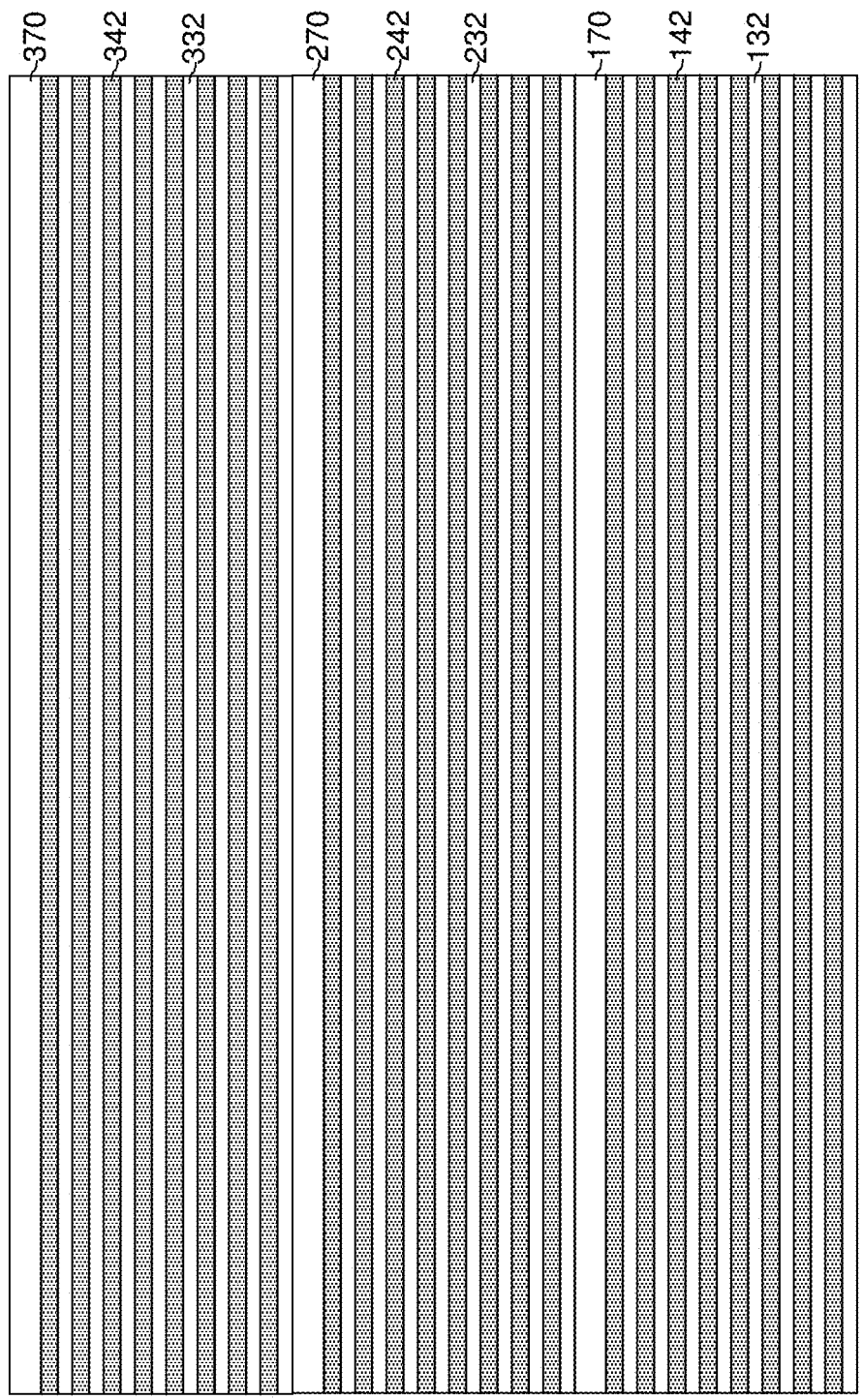
FIGS. 23A-23H are sequential vertical cross-sectional views of a second exemplary structure during formation of stepped surfaces according to a second embodiment of the present disclosure.
Figure 23B:
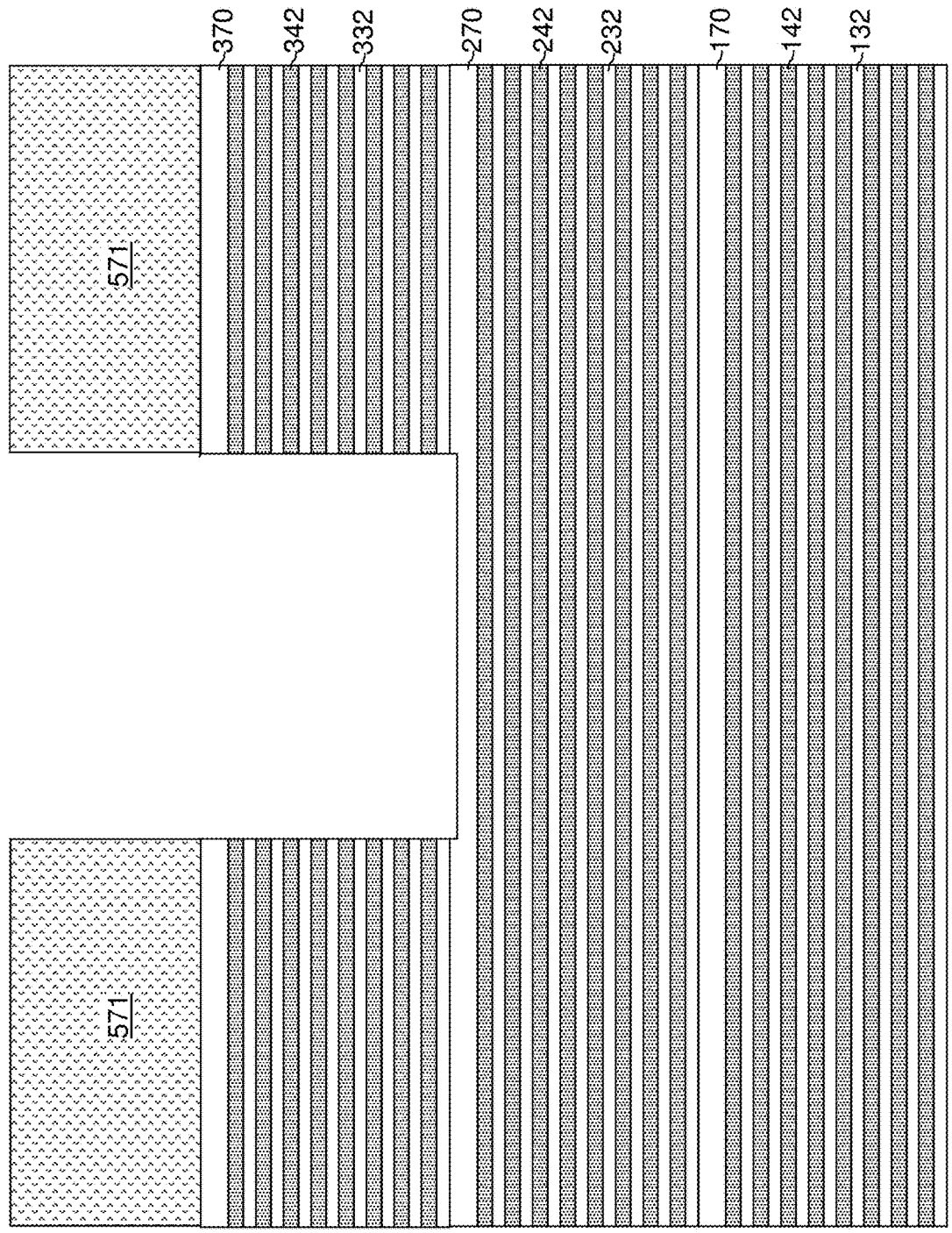

Referring to FIG. 23B, a first photoresist layer 571 can be applied over the multiple alternating stacks of the second exemplary structure, and can be lithographically patterned to form a first opening in a first area of a staircase region. An anisotropic etch process (i.e., a first level-shift anisotropic etch process) can be performed to form a first recess trench vertically extending through the third-tier alternating stack. The first photoresist layer 571 can be subsequently removed, for example, by ashing.

Figure 23C:
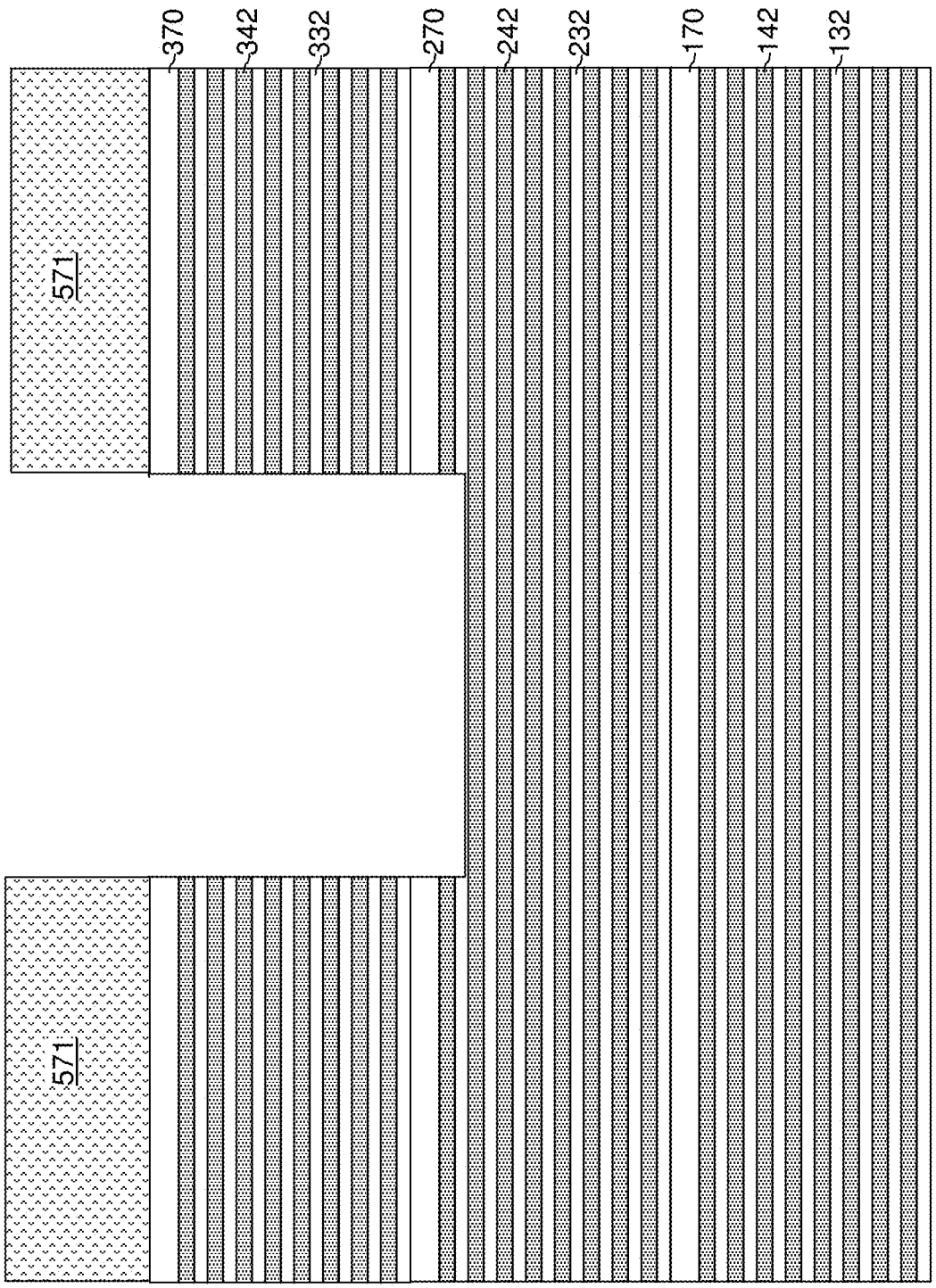

Referring to FIG. 23C, a first extension etch process is performed to extend the recess trench through the joint dielectric layer 270 and optionally through at least one pair of the topmost second insulating layer 232 and the topmost second sacrificial material layer 242. In the first extension etch process, the etching time and/or the etching power of the plasma etching (e.g., RIE etching) is changed relative to the first level-shift anisotropic etch process.

Figure 23D:
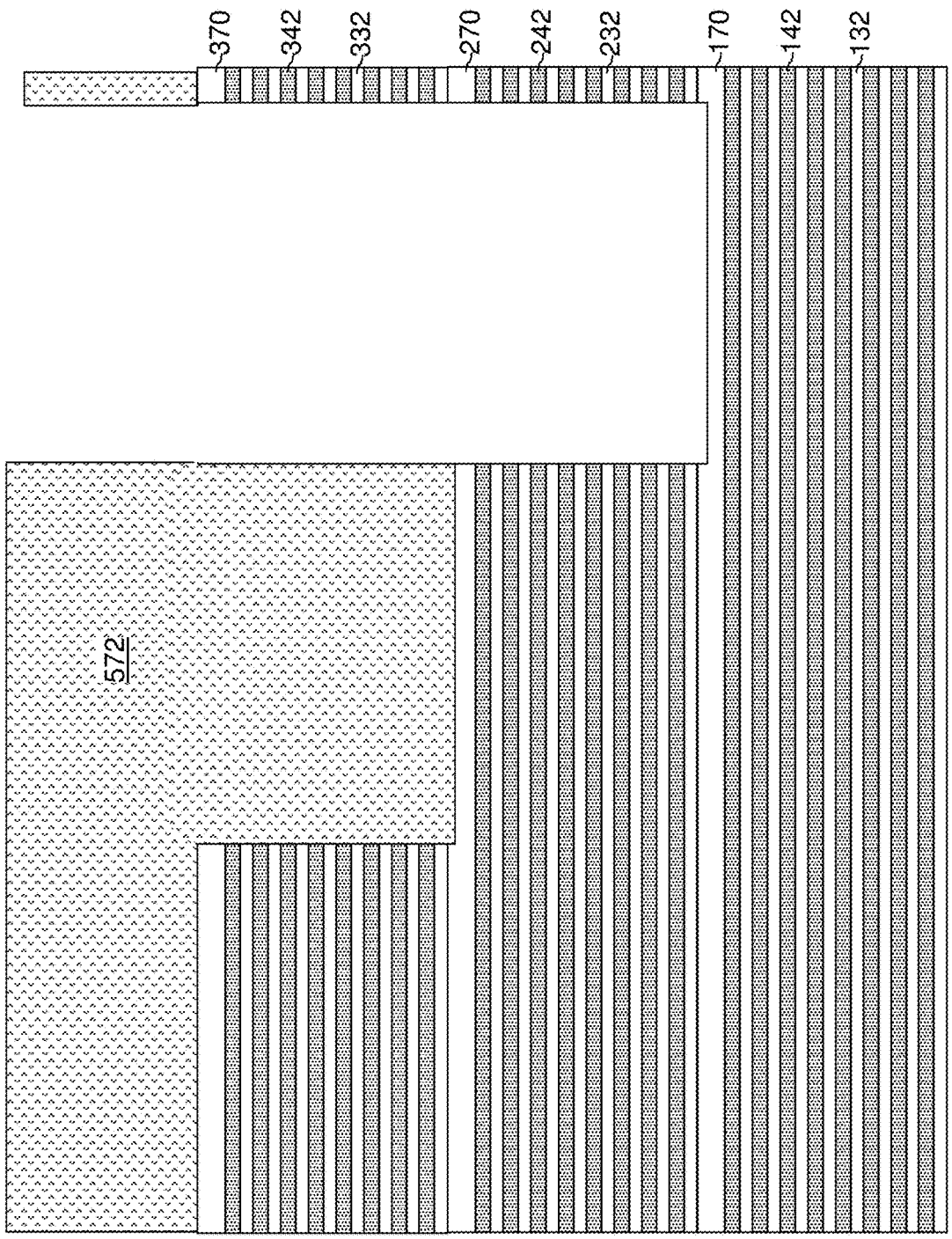

Referring to FIG. 23D, a second photoresist layer 572 can be applied over the multiple alternating stacks of the second exemplary structure, and can be lithographically patterned to form a second opening in a second area of the staircase region. An anisotropic etch process (i.e., a second level-shift anisotropic etch process) can be performed to form a second recess trench vertically extending through the third-tier alternating stack and the second-tier alternating stack. The second photoresist layer 572 can be subsequently removed, for example, by ashing.

Figure 23E:
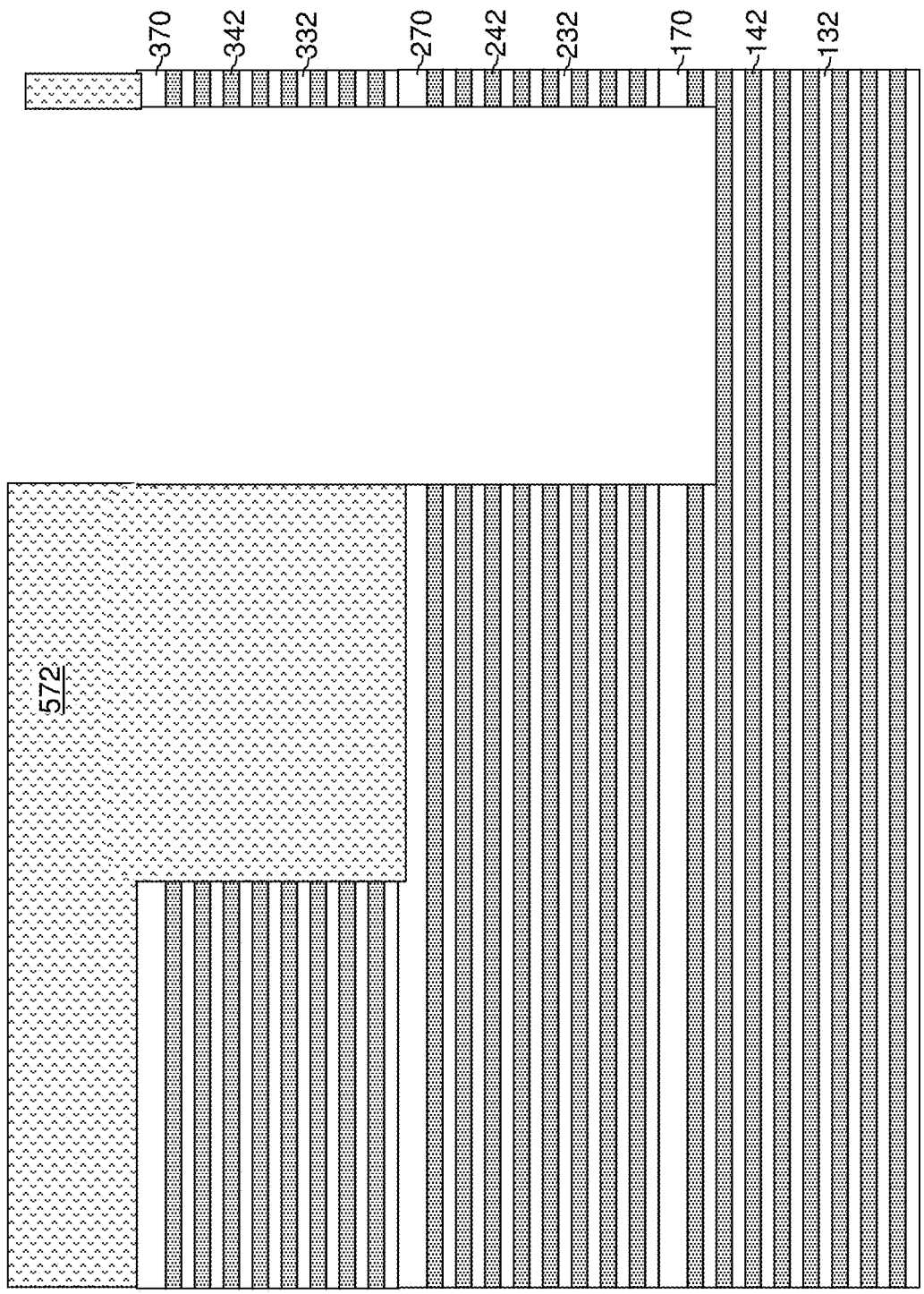

Referring to FIG. 23E, a second extension etch process is performed to extend the recess trench through the joint dielectric layer 170 and optionally through at least one pair of the topmost first insulating layer 132 and the first topmost sacrificial material layer 142. In the second extension etch process, the etching time and/or the etching power of the plasma etching (e.g., RIE etching) is changed relative to the second level-shift anisotropic etch process.

Figure 23F:
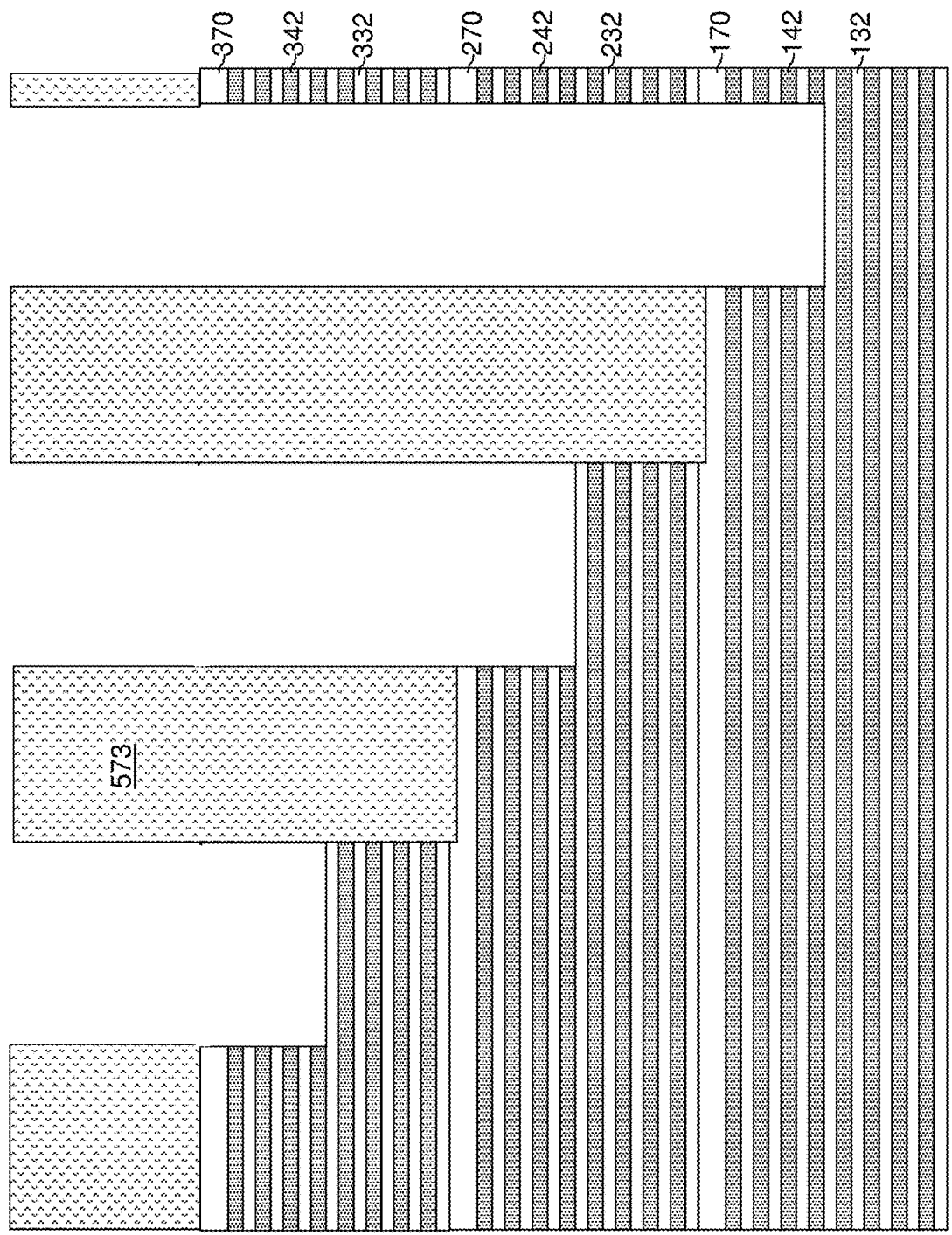

Referring to FIG. 23F, a third photoresist layer 573 can be applied over the second exemplary structure, and can be lithographically patterned to form openings such that the first area, the second area, and a third area that is adjacent to the first area are partially masked by the patterned third photoresist layer 573 without masking a respective complementary area. The processing steps of FIG. 9C can be subsequently performed.

In a non-limiting illustrative example, the total number of first sacrificial material layers 142 may be an integer Q1 that is in a range from $2^{(N-1)}+1$ to $2^N$, the total number of second sacrificial material layers 242 may be Q2 that is in a range from $2^{(N-1)}+1$ to $2^N$, and the total number of third sacrificial material layers 342 may be Q3 that is in a range from $2^{(N-1)}+1$ to $2^N$. In one embodiment, Q2 may be the same as Q1, and Q3 may be the same as Q2. The value of N may be in a range from 3 to 10, such as from 4 to 8, although lesser and greater numbers can be employed. In this case, the total number of adjoining pairs of a first insulating layer 132 and a first sacrificial material layer 142 that is etched by the second anisotropic etch step can be in a range from $2^{(N-2)}+1$ to $2^{(N-1)}$, and may be in a range from min(Q1, Q2, Q3)/2 and max(Q1, Q2, Q3)/2, in which min(Q1, Q2, Q3) represents the minimum of Q1, Q2, and Q3 and max(Q1, Q2, Q3) represents the maximum of Q1, Q2, and Q3. The total number of adjoining pairs of a second insulating layer 232 and a second sacrificial material layer 242 that is etched by the anisotropic etch step is the same as the total number of adjoining pairs of a first insulating layer 132 and a first sacrificial material layer 142 that is etched by the anisotropic etch step. The total number of adjoining pairs of a third insulating layer 332 and a third sacrificial material layer 342 that is etched by the anisotropic etch step is the same as the total number of adjoining pairs of a first insulating layer 132 and a first sacrificial material layer 142 that is etched by the anisotropic etch step. The third photoresist layer 573 can be subsequently removed, for example, by ashing.

Figure 23G:
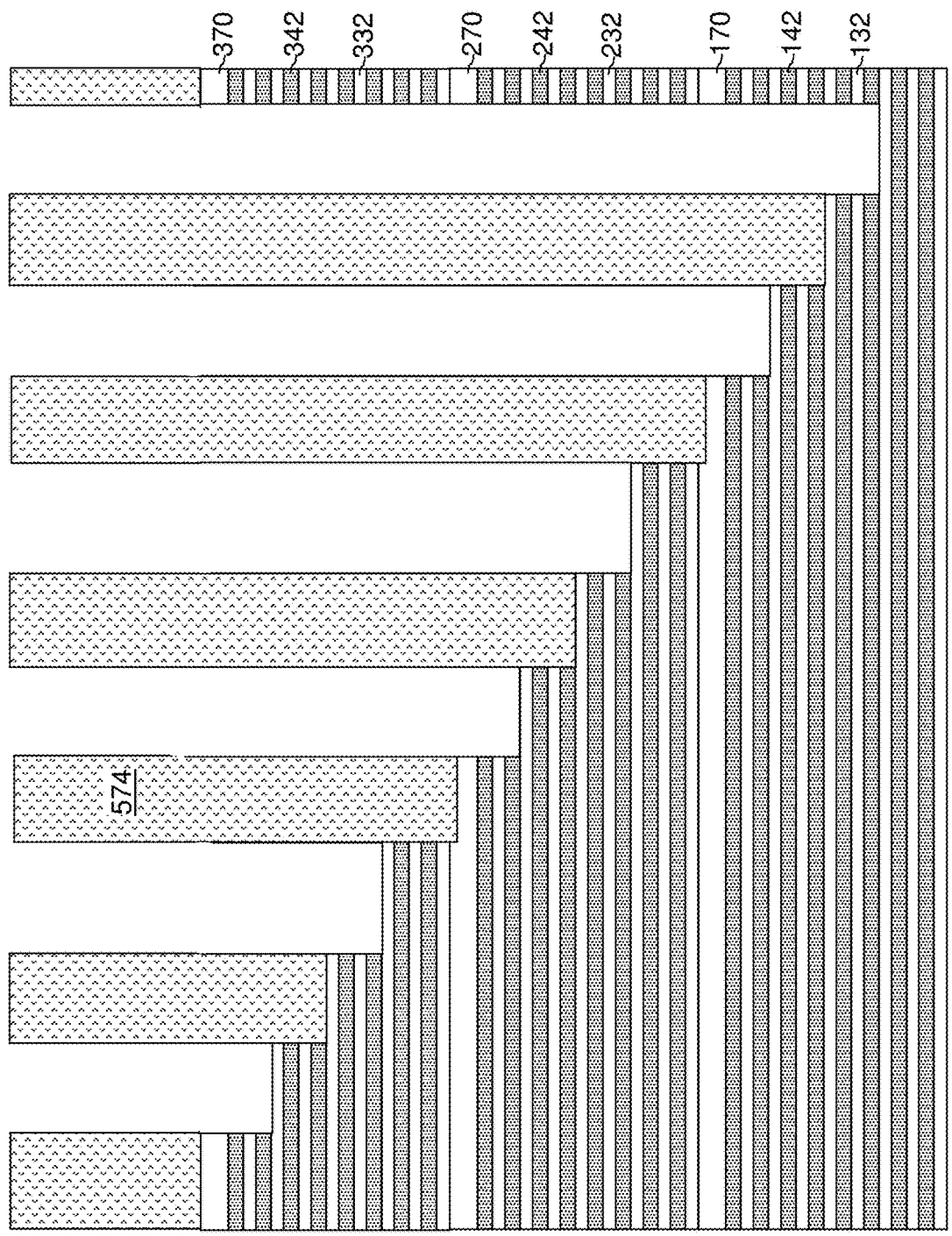
Figure 23H:
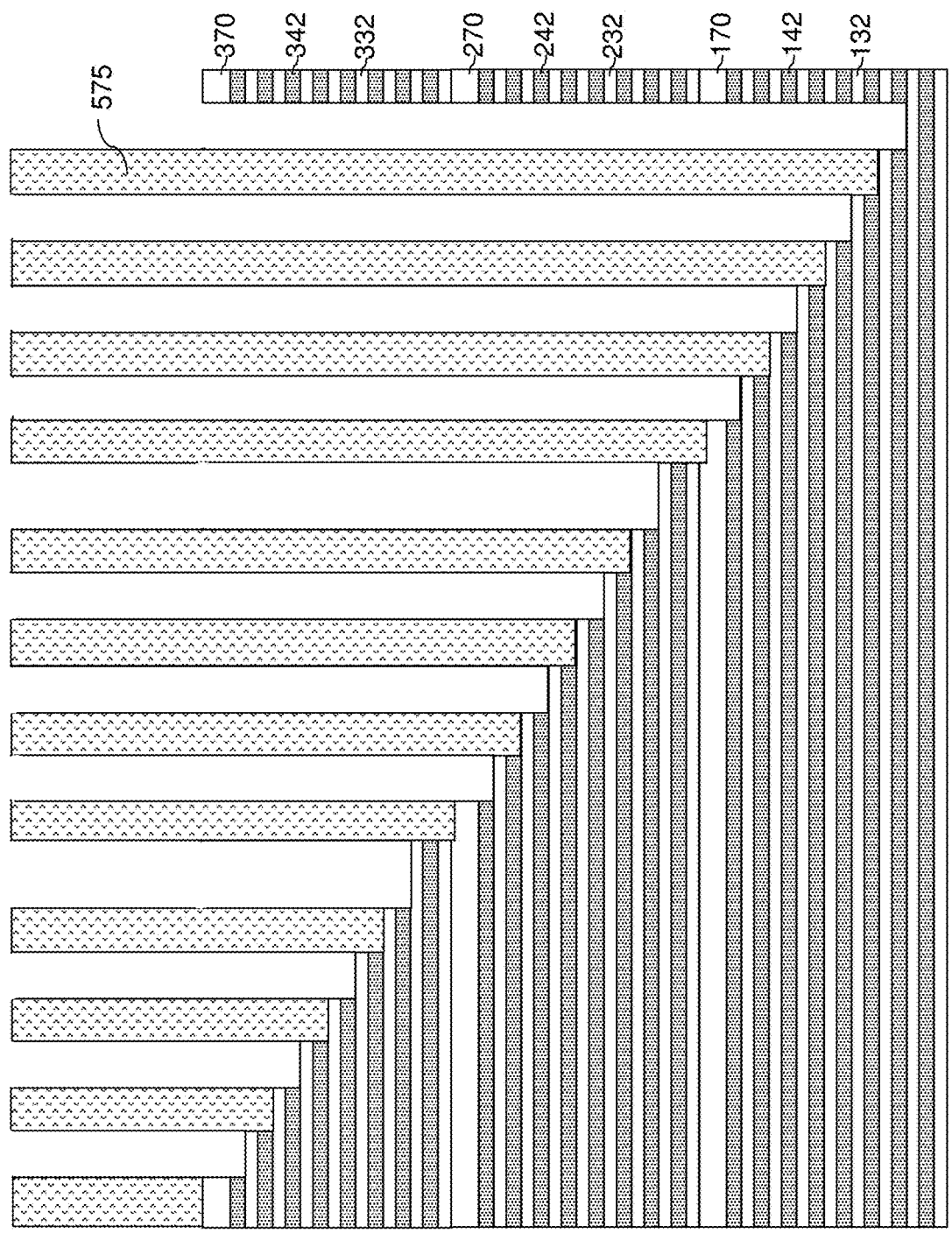

Referring to FIGS. 23G and 23H, the processing steps of FIGS. 9D and 9E can be performed with any needed changes due to the presence of the additional third alternating stack. Patterned photoresist layers (574, 575) and anisotropic etch processes may be employed as described above. Additional set of patterning process steps may be employed to form first stepped surfaces, second stepped surfaces, and third stepped surfaces that are located within a same continuous retro-stepped cavity or within a plurality of retro-stepped cavities that are laterally isolated among one another.

Subsequently, the processing steps of FIGS. 9F-22 may be performed to provide a second exemplary structure, which can include a third alternating stack of third insulating layers 332 and third electrically conductive layers located over the second-tier alternating stack and having third stepped surfaces in addition to the various structures illustrated in FIG. 22.

In one embodiment, the first-tier memory openings and the second-tier memory openings may be formed with a non-zero taper angle. In this case, each of the memory opening fill structures 58 can have a greater lateral extent at a level of a topmost layer within the second-tier alternating stack than at a level of a bottommost layer within the third alternating stack, and can have a greater lateral extent at a level of a topmost layer within the first-tier alternating stack than at a level of the bottommost layer within the second-tier alternating stack. In one embodiment, the first stepped surfaces, the second stepped surfaces, and the third stepped surfaces may be connected to each other underneath a continuous retro-stepped cavity in which a retro-stepped dielectric material portion is formed, and the retro-stepped dielectric material portion can contacts each of the third stepped surfaces. The retro-stepped dielectric material portion can comprise a set of straight sidewalls that vertically extend at least from a topmost layer within the third alternating stack to the topmost layer within the first-tier alternating stack.

FIGS. 24A-24F are sequential vertical cross-sectional views of a third exemplary structure during formation of stepped surfaces according to a third embodiment of the present disclosure.

Referring to FIG. 24A, the third exemplary structure can be derived from the first exemplary structure of FIG. 8 by forming a hard mask layer 660 including openings therein over the second-tier alternating stack (232, 242) and the second insulating cap layer 270. The hard mask layer 660 may include a metal or a dielectric metal oxide. The thickness of the hard mask layer 660 may be in a range from 30 nm to 600 nm, such as from 60 nm to 300 nm, although lesser and greater thicknesses may also be employed.

FIGS. 24B-24F illustrate sequential processing steps that can be employed to form via cavities vertically extending to different sacrificial material layers (142, 242) within the first-tier alternating stack (132, 142) and the second-tier alternating stack (232, 242). Multiple sets of patterning process steps can be subsequently performed to form via cavities having different depths. Each set of patterning process steps comprises a patterned etch mask formation step in which a respective etch mask covering a set of discrete openings or via cavities is formed, and includes an anisotropic etch step in which via cavities are formed or vertically extended underneath openings within the respective etch mask.

Referring to FIG. 24B, a first patterned photoresist layer 671 can be formed over the hard mask layer 660. The first patterned photoresist layer 671 includes an opening within areas of a first subset of the openings in the hard mask layer 660 (hereafter referred to as first openings of the hard mask layer 660), and covers a second subset of the openings in the hard mask layer 660 (hereafter referred to as second openings of the hard mask layer 660). Thus, the first patterned photoresist layer 671 covers the second openings in the hard mask layer 660 and does not cover the first openings in the hard mask layer 660. A first masking pattern (660, 671) including a stack of the hard mask layer 660 and the first patterned photoresist layer 671 is formed over the third exemplary structure. A first anisotropic etch process (i.e., the level-shift anisotropic etch process) can be performed to transfer the pattern of the first openings in the hard mask layer 660. First via cavities are formed through the second-tier alternating stack underneath the first openings in the hard mask layer 660 while the second openings in the hard mask layer 660 are covered with the first patterned photoresist layer 671.

Referring to FIG. 24C and according to an aspect of the present disclosure, the first via cavities can be vertically extended through the inter-tier dielectric layer 180 and the first insulating cap layer 170. The first via cavities can vertically extend down at least to a topmost layer within the first-tier alternating stack (132, 142). The first via cavities having a same depth can be formed through the second-tier alternating stack (232, 242) down to a topmost layer of the first-tier alternating stack (132, 142) by performing the extension etch process that etches the unmasked portions of the second-tier alternating stack (232, 242), the inter-tier dielectric layer 180, and the first insulating cap layer 170 underneath the first masking pattern. The first patterned photoresist layer 671 can be subsequently removed, for example, by ashing.

Referring to FIGS. 24D-24F, multiple via extension processes can be subsequently formed. Each of the multiple via extension processes comprises a respective patterned etch mask formation step in which a respective etch mask (such as a second, third, or fourth patterned photoresist layer (672, 673, 674)) covering a respective subset of the first openings and a respective subset of the second openings is formed over the hard mask layer 660, and a respective additional anisotropic etch step in which a respective subset of layers within the first-tier alternating stack (132, 142) and a respective subset of layers within the second-tier alternating stack (232, 242) are vertically etched within areas that are not covered by the respective etch mask.

In one embodiment, the multiple via extension processes vertically extend the first via cavities to different depths down to a top surface of a respective one of the first sacrificial material layers 142. The multiple via extension processes form second via cavities extending down to a top surface of a respective one of the second sacrificial material layers 242. Each of the additional anisotropic etch steps simultaneously extends respective first via cavities and forms or extends respective second via cavities. The total number of layers within the first-tier alternating stack (132, 142) and the second-tier alternating stack (232, 242) that are etched by the additional anisotropic etch processes within each unmasked area differ among the additional anisotropic etch processes. For example, the total number of layers within the first-tier alternating stack (132, 142) and the second-tier alternating stack (232, 242) that are etched by the additional anisotropic etch processes within each unmasked area may be, for example, $2^{(N-1)}$, $2^{(N-2)}$, $2^{(N-3)}$, . . . 8, 4, 2, and 1.

FIGS. 25A-25F are sequential vertical cross-sectional views of a fourth exemplary structure during formation of stepped surfaces according to a fourth embodiment of the present disclosure.

Referring to FIG. 25A, the fourth exemplary structure can be the same as the first exemplary structure of FIG. 8.

Multiple sets of patterning process steps can be subsequently performed to form via cavities having different depths. Each set of patterning process steps comprises a patterned etch mask formation step in which a respective etch mask covering a set of discrete openings or via cavities is formed, and includes an anisotropic etch step in which via cavities are formed or vertically extended underneath openings within the respective etch mask.

Referring to FIG. 25B, a first photoresist layer 771 can be formed over the second-tier alternating stack (232, 242). The first photoresist layer 771 is a first patterned etch mask having the same pattern as the first masking pattern (660, 671) illustrated in FIG. 24B. A first anisotropic etch process (e.g., the level-shift anisotropic etch process) can be performed to transfer the pattern of openings in the first photoresist layer 771. First via cavities are formed through the second-tier alternating stack underneath the openings in the first photoresist layer 771.

Referring to FIG. 25C and according to an aspect of the present disclosure, the first via cavities can be vertically extended through the inter-tier dielectric layer 180 and the first insulating cap layer 170. The first via cavities can vertically extend down to a topmost layer within the first-tier alternating stack (132, 142). The first via cavities having a same depth can be formed through the second-tier alternating stack (232, 242) down to a topmost layer of the first-tier alternating stack (132, 142) by performing the extension etch process that etches the unmasked portions of the second-tier alternating stack (232, 242), the inter-tier dielectric layer 180, and the first insulating cap layer 170 underneath the first masking pattern (which includes the first photoresist layer 771). The first photoresist layer 771 can be subsequently removed, for example, by ashing.

Referring to FIGS. 25D-25F, multiple via extension processes can be subsequently formed. Each of the multiple via extension processes comprises a respective patterned etch mask formation step in which a respective etch mask (such as a second, third, or fourth photoresist layer (772, 773, 774)) defines a subset of existing via cavities to be vertically extended and defines areas in which new via cavities are to be formed; and a respective additional anisotropic etch step in which a respective subset of layers within the first-tier alternating stack (132, 142) and a respective subset of layers within the second-tier alternating stack (232, 242) are vertically etched within areas that are not covered by the respective etch mask.

In one embodiment, the multiple via extension processes vertically extend the first via cavities to different depths down to a top surface of a respective one of the first sacrificial material layers 142. The multiple via extension processes form second via cavities extending down to a top surface of a respective one of the second sacrificial material layers 242. Each of the additional anisotropic etch steps simultaneously extends respective first via cavities and forms or extends respective second via cavities. The total number of layers within the first-tier alternating stack (132, 142) and the second-tier alternating stack (232, 242) that are etched by the additional anisotropic etch processes within each unmasked area differ among the additional anisotropic etch processes. For example, the total number of layers within the first-tier alternating stack (132, 142) and the second-tier alternating stack (232, 242) that are etched by the additional anisotropic etch processes within each unmasked area may be, for example, $2^{(N-1)}$, $2^{(N-2)}$, $2^{(N-3)}$, . . . , 8, 4, 2, and 1.

Figure 26:
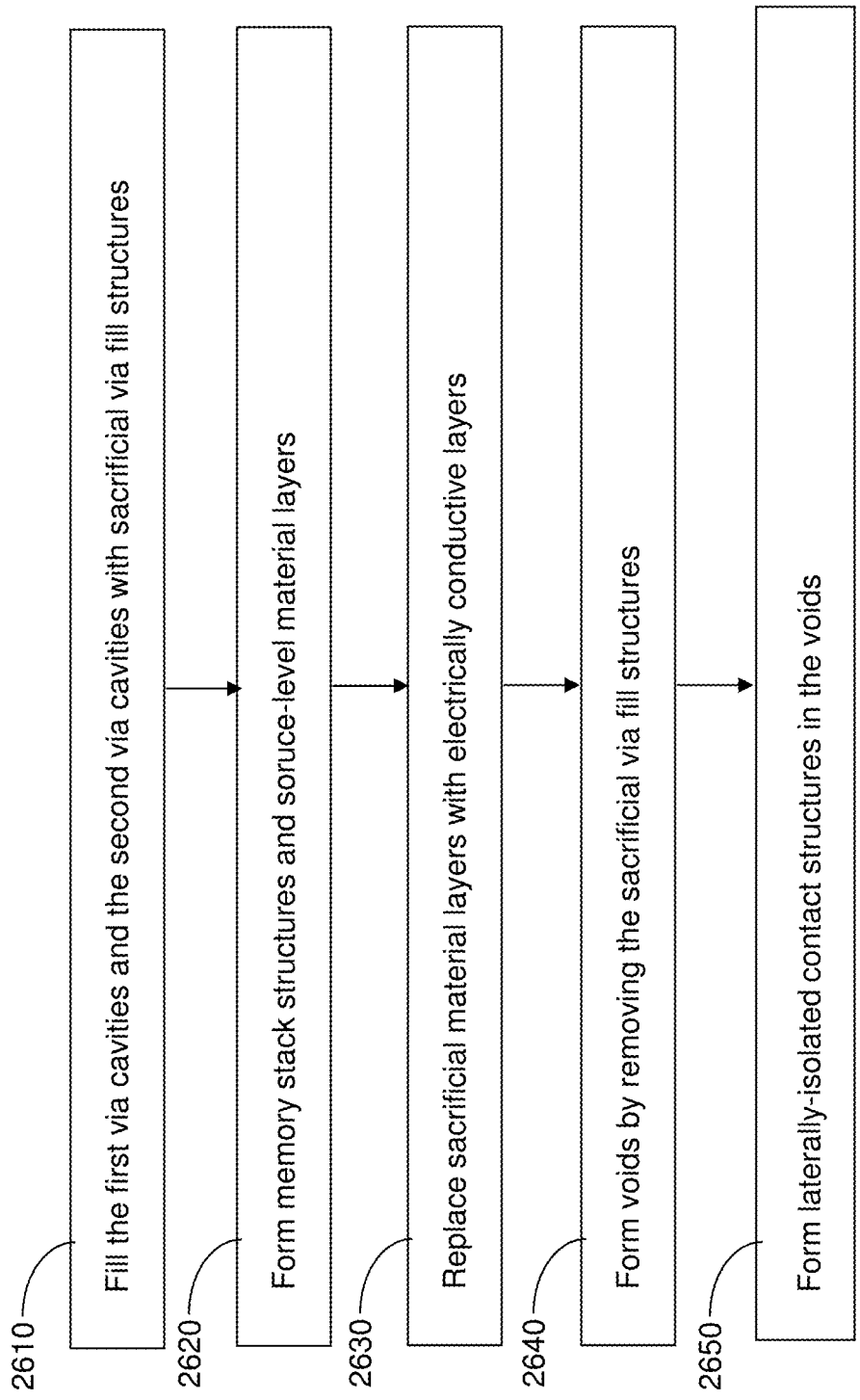
FIG. 26 is a flow chart illustrating an exemplary process sequence that may be employed after formation of the third exemplary structure of FIG. 24F or the fourth exemplary structure of FIG. 25F according to the first embodiment of the present disclosure.

FIG. 26 is a flow chart illustrating an exemplary process sequence that may be employed after formation of the third exemplary structure of FIG. 24F or the fourth exemplary structure of FIG. 25F according to the first embodiment of the present disclosure.

Referring to step 2610, the first via cavities and the second via cavities of FIG. 24F or FIG. 25F are filled with sacrificial via fill structures including a sacrificial via fill material. The sacrificial via fill material may include, for example, a semiconductor material (such as polysilicon, amorphous silicon, or a silicon-germanium alloy), a carbon-based material (such as amorphous carbon or diamond-like carbon), or a dielectric fill material having a higher etch rate than the materials of the alternating stacks (132, 142, 232, 242).

Referring to step 2620, the processing steps of FIGS. 14A-19 can be performed to form memory opening fill structures 58 including a respective memory stack structure 55, and to replace the in-process source-level material layers 110' with source-level material layers 110.

Referring to step 2630, the processing steps of FIGS. 20-21B can be performed to replace the sacrificial material layers (142, 242) with electrically conductive layers (146, 246).

Referring to step 2640, voids can be formed in the volumes of the via cavities by removing the sacrificial via fill structures.

Figure 27:
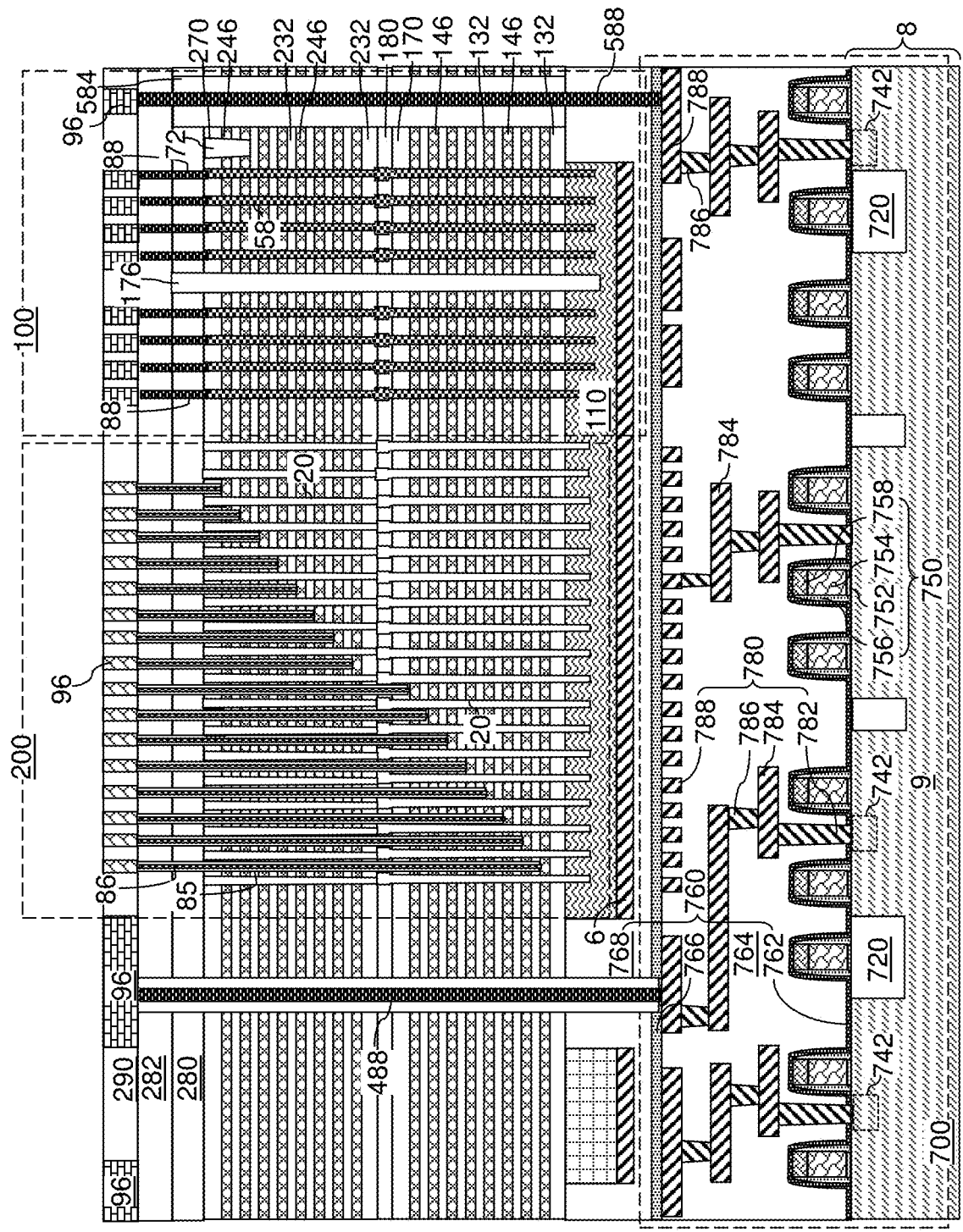
FIG. 27 is a vertical cross-sectional view of an exemplary structure that may be derived from the third exemplary structure of FIG. 24F or the fourth exemplary structure of FIG. 25F according to the first embodiment of the present disclosure.

Referring to step 2650 and FIG. 27, laterally-isolated contact structures (85, 86) can be formed in each void formed in the via cavities. Each laterally-isolated contact structure (85, 86) can include, for example, a cylindrical insulating spacer 85 and a layer contact via structure 86. The cylindrical insulating spacers 85 can be formed by depositing and anisotropically etching a dielectric liner. The layer contact via structures 86 can be formed by depositing at least one conductive material in remaining volumes of the voids formed by removal of the sacrificial via fill structures. Subsequently, additional processing steps described in conjunction with FIG. 22 can be performed to provide an exemplary structure illustrated in FIG. 27.

Referring to all drawings and according to various embodiments of the present disclosure, a three-dimensional memory device is provided, which comprises: a first-tier alternating stack of first insulating layers 132 and first electrically conductive layers 146 located over a substrate 8 and comprising first stepped surfaces; a second-tier alternating stack of second insulating layers 232 and second electrically conductive layers 246 located over the first-tier alternating stack (132, 146) and comprising second stepped surfaces; memory openings vertically extending through the second-tier alternating stack and the first-tier alternating stack; memory opening fill structures 58 located within the memory openings and comprising a respective vertical semiconductor channel 60 and a respective vertical stack of memory elements (such as portions of a charge storage layer 54) located at levels of the first electrically conductive layers 146 and the second electrically conductive layers 246, wherein each of the memory opening fill structures 58 has a greater lateral extent at a level of a topmost layer within the first-tier alternating stack (132, 146) (for example, due to a finite taper angle in the first-tier memory openings 149) than at a level of a bottommost layer within the second-tier alternating stack (232, 246) (for example, due to a finite taper angle in the second-tier memory openings 249); and a retro-stepped dielectric material portion 65 having a homogeneous material composition throughout, contacting each of the first stepped surfaces and the second stepped surfaces, having a set of straight sidewalls that vertically extend at least from a topmost layer within the second-tier alternating stack (232, 246) to the topmost layer within the first-tier alternating stack (132, 146), and continuously extending from a bottommost surface of the first stepped surfaces to a topmost surface of the second stepped surfaces.

In one embodiment, the set of straight sidewalls comprise a pair of lengthwise sidewalls that laterally extend along a first horizontal direction hd1, laterally spaced apart from each other along a second horizontal direction hd2 that is perpendicular to the first horizontal direction hd1, having a respective top surface adjoining a respective edge of a top surface of the retro-stepped dielectric material portion 65, and having a respective stepped bottom surfaces that is directly adjoined to each of the first stepped surfaces and the second stepped surfaces.

In one embodiment, the set of straight sidewalls comprises a widthwise sidewall that continuously extends through each level of vertical steps within the first stepped surfaces and the second stepped surfaces, is adjoined to an edge of a bottom surface of the retro-stepped dielectric material portion 65, and is parallel to the second horizontal direction hd2.

In one embodiment, the three-dimensional memory device comprises an inter-tier dielectric material layer 180 located between the first-tier alternating stack (132, 146) and the second-tier alternating stack (232, 246), wherein each of the memory opening fill structures 58 vertically extends through the inter-tier dielectric material layer 180 and has a greater lateral extent at a level of the inter-tier dielectric material layer 180 than at the level of the topmost layer within the first-tier alternating stack (132, 146).

In one embodiment, the retro-stepped dielectric material portion 65 comprises a plurality of dielectric pillar portions 20 that are adjoined to a stepped bottom surface of the retro-stepped dielectric material portion 65 that contacts the first stepped surfaces and the second stepped surfaces. The stepped bottom surface of the retro-stepped dielectric material portion 65 comprises horizontal surface segments that are adjoined to vertical surface segments.

In one embodiment, each of the plurality of dielectric pillar portions 20 vertically extends into a top portion of a semiconductor material layer (112, 114, 116) located above, or within, the substrate 8; and bottom surfaces of the plurality of dielectric pillar portions 20 are located at a same depth from a horizontal plane including a bottommost surface of the first-tier alternating stack (132, 146). In one embodiment, a bottom end of each of the vertical semiconductor channels 60 is electrically connected to the semiconductor material layer (112, 114, 116).

In one embodiment, the three-dimensional memory device comprises contact via structures 86 vertically extending through the retro-stepped dielectric material portion 65, contacting a respective one of the first electrically conductive layers 146 and the second electrically conductive layers 246, and having a respective top surface that is located within a same horizontal plane, such as a horizontal plane including a top surface of the second contact-level dielectric layer 282.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:

forming a first-tier alternating stack of first insulating layers and first sacrificial material layers over a substrate;

forming a joint dielectric layer over the first-tier alternating stack, wherein the joint dielectric layer is thicker than each of the first insulating layers and the first sacrificial material layers;

forming first-tier memory openings and first-tier support openings through the first-tier alternating stack and the joint dielectric layer;

forming sacrificial first-tier memory opening fill portions in the first-tier memory openings in a memory array region and forming sacrificial first-tier support opening fill portions in the first-tier support openings in an area outside of the memory array region;

forming a second-tier alternating stack of second insulating layers and second sacrificial material layers over the joint dielectric layer, the first-tier alternating stack and the sacrificial first-tier memory opening fill portions;

performing a level-shift anisotropic etch process to form a recess trench vertically extending through the second-tier alternating stack and down to the joint dielectric layer in a staircase region, wherein top surfaces of a first subset of the sacrificial first-tier support opening fill portions are exposed underneath the recess trench and a second subset of the sacrificial first-tier support opening fill portions located outside an area of a volume of the recess trench are not exposed to the recess trench, wherein an entirety of the recess trench has a uniform depth throughout and each sidewall of the recess trench is a vertical sidewall which extends straight from a top surface of the joint dielectric layer at least to a respective edge of a topmost surface of the second-tier alternating stack;

performing an extension etching process to extend the recess trench through at least the joint dielectric layer by removing portions of the joint dielectric layer that underlie the recess trench in the staircase region, wherein at least one of etching time or etching power used during the extension etching process is different from that used during the level-shift anisotropic etch process;

patterning first stepped surfaces in the first-tier alternating stack underneath the volume of the recess trench and patterning second stepped surfaces in the second-tier alternating stack adjacent to, and outside the area of, the volume of the recess trench, whereby a continuous stepped cavity overlying the first stepped surfaces and the second stepped surfaces is formed in the staircase region, whereby upper portions of the first subset of the sacrificial first-tier support opening fill portions are removed during patterning of the first stepped surfaces;

removing lower portions of the first subset of the sacrificial first-tier support opening fill portions after formation of the first stepped surfaces, whereby vertically-extending voids formed by removal of the lower portions of the first subset of the sacrificial first-tier support opening fill portions vertically extend through the first-tier alternating stack;

forming a retro-stepped dielectric material portion in a combination of the continuous stepped cavity and the vertically-extending voids, wherein the retro-stepped dielectric material portion comprises vertically-extending portions that vertically extend through a respective subset of layers within the first-tier alternating stack and fill volumes of the vertically-extending voids;

forming memory openings through the second-tier alternating stack and the first-tier alternating stack, wherein each of the memory openings comprises a volume formed by removing a respective one of the sacrificial first-tier memory opening fill portions;

forming memory opening fill structures in the memory openings, wherein each of the memory opening fill structures comprises a respective vertical semiconductor channel and a respective vertical stack of memory elements; and replacing the first sacrificial material layers and the second sacrificial material layers with first electrically conductive layers and second electrically conductive layers, respectively.

2. The method of claim 1, wherein patterning the first stepped surfaces and patterning the second stepped surfaces comprises performing at least one set of patterning process steps, wherein each set of patterning process steps comprises:

a patterned etch mask formation step in which a respective etch mask partially covering a respective area of the first stepped surfaces and partially covering a respective area of the second stepped surfaces is formed; and an anisotropic etch step in which a respective subset of layers within the first-tier alternating stack and a respective subset of layers within the second-tier alternating stack are vertically etched within areas that are not covered by the respective etch mask.

3. The method of claim 2, wherein:

the at least one set of patterning process steps comprises multiple sets of patterning process steps; and a total number of layers within the first-tier alternating stack and the second-tier alternating stack that are etched by the anisotropic etch processes of the multiple sets of patterning process steps within each unmasked area differ among the anisotropic etch processes.

4. The method of claim 3, wherein the total number of layers within the first-tier alternating stack and the second-tier alternating stack that are etched by the anisotropic etch processes of the multiple sets of patterning process steps within each unmasked area:

is 2 for one of the anisotropic etch processes;

is 4 for another of the anisotropic etch processes; and is $2^i$ for at least yet another of the anisotropic etch process in which i is an integer greater than 2.

5. The method of claim 2, wherein each etch mask employed within the at least one set of patterning process steps comprises a patterned photoresist layer that partly covers a first area of the first stepped surfaces, does not cover a second area of the first stepped surfaces, covers a first area of the second stepped surfaces, and does not cover a second area of the second stepped surfaces.

6. The method of claim 1, wherein:

the retro-stepped dielectric material portion is formed by depositing a dielectric material on the first stepped surfaces and on the second stepped surfaces in a same dielectric material deposition step, and subsequently planarizing the dielectric material; and the retro-stepped dielectric material portion has a homogeneous material composition throughout, contacts each of the first stepped surfaces and the second stepped surfaces, has a set of straight sidewalls that vertically extend at least from a topmost layer within the second-tier alternating stack to the topmost layer within the first-tier alternating stack, and continuously extends from a bottommost surface of the first stepped surfaces to a topmost surface of the second stepped surfaces.

7. The method of claim 1, further comprising:

forming first-tier support openings through the first-tier alternating stack;

forming sacrificial first-tier support opening fill portions in the first-tier support openings prior to formation of the second-tier alternating stack; and forming voids by removing the sacrificial first-tier support opening fill portions after formation of the continuous stepped cavity.

8. The method of claim 7, wherein the retro-stepped dielectric material portion is formed by depositing a dielectric material in volumes of the continuous stepped cavity and in volumes of the voids.

9. The method of claim 1, wherein the extension etching process further extends the recess trench through at least a topmost first insulating layer and a topmost first sacrificial material layer.

10. The method of claim 1, wherein:

each of the vertical sidewalls of the recess trench extends continuously from the top surface of the joint dielectric layer to the respective edge of the topmost surface of the second-tier alternating stack after the level-shift anisotropic etch process; and the joint dielectric layer has a uniform thickness throughout the memory array region and the staircase region.

11. The method of claim 1, wherein each of the vertical sidewalls of the recess trench extends continuously at least from a bottom surface of the joint dielectric layer to the respective edge of the topmost surface of the second-tier alternating stack after the extension etching process.

12. The method of claim 1, further comprising forming a patterned etch mask layer over the second alternating stack, wherein all sidewalls of the recess trench are vertically coincident with sidewalls of an opening in the patterned etch mask layer.

13. The method of claim 1, further comprising:

forming second-tier support openings through the second-tier alternating stack; and forming sacrificial second-tier support opening fill portions in the second-tier support openings prior to formation of recess trench, wherein:

the second subset of the sacrificial first-tier support opening fill portions contacts a bottom surface of a respective one of the second-tier support opening fill portions; and the first subset of the sacrificial first-tier support opening fill portions is not in direct contact with any of the sacrificial second-tier support opening fill portions, and comprises a respective top surface contacting the second-tier alternating stack.

14. The method of claim 13, wherein the recess trench is formed in a region that is free of the sacrificial second-tier support opening fill portions.

15. The method of claim 13, wherein each top surface of the second subset of the sacrificial first-tier support opening fill structures is physically exposed after the level-shift anisotropic etch process.

16. The method of claim 1, wherein:

the first-tier alternating stack is formed on a source-level semiconductor layer;

surfaces of the source-level semiconductor layer are physically exposed upon formation of the first-tier support openings, and are covered by the sacrificial first-tier support opening fill portions upon formation of the sacrificial first-tier support opening fill portions;

a first subset of the surfaces of the source-level semiconductor layer is physically re-exposed upon formation of the support openings while a second subset of the source-level semiconductor layer that underlie the second subset of the sacrificial first-tier support opening fill portions are not physically exposed; and the first subset of the surfaces of the source-level semiconductor layer is contacted by, and is covered by, the vertically-extending portions of the retro-stepped dielectric material portion.

17. The method of claim 1, further comprising:
forming second-tier support openings through the second-tier alternating stack;
forming second-tier sacrificial support opening fill portions in the second-tier support openings prior to performing the level-shift anisotropic etch process, wherein upper portions of the second-tier sacrificial support opening fill portions are removed during formation of the second stepped surfaces; and
forming additional vertically-extending voids by removing lower portions of the second-tier sacrificial support opening fill portions, wherein the retro-stepped dielectric material portion is formed by deposition of a dielectric fill material into the vertically-extending voids and into the additional vertically-extending voids employing a dielectric material deposition process.

18. A method of forming a three-dimensional memory device, comprising:
forming a first-tier alternating stack of first insulating layers and first sacrificial material layers over a substrate;
forming first-tier memory openings and first-tier support openings through the first-tier alternating stack;
forming sacrificial first-tier memory opening fill portions in the first-tier memory openings in a memory array region and forming sacrificial first-tier support opening fill portions in the first-tier support openings in an area outside of the memory array region;
forming a second-tier alternating stack of second insulating layers and second sacrificial material layers over the first-tier alternating stack and the sacrificial first-tier memory opening fill portions;
performing a level-shift anisotropic etch process to form a recess trench vertically extending through an entirety of the second-tier alternating stack, wherein top surfaces of a first subset of the sacrificial first-tier support opening fill portions are exposed underneath the recess trench and a second subset of the sacrificial first-tier support opening fill portions located outside an area of a volume of the recess trench are not exposed to the recess trench;
patterning first stepped surfaces in the first-tier alternating stack underneath a volume of the recess trench and patterning second stepped surfaces in the second-tier alternating stack adjacent to, and outside the area of, the volume of the recess trench, whereby a continuous stepped cavity overlying the first stepped surfaces and the second stepped surfaces is formed in a staircase region, whereby upper portions of the first subset of the sacrificial first-tier support opening fill portions are removed during patterning of the first stepped surfaces;
removing lower portions of the first subset of the sacrificial first-tier support opening fill portions after formation of the first stepped surfaces, whereby vertically-extending voids formed by removal of the lower portions of the first subset of the sacrificial first-tier support opening fill portions vertically extend through the first-tier alternating stack;
forming a retro-stepped dielectric material portion in a combination of the continuous stepped cavity and the vertically-extending voids, wherein the retro-stepped dielectric material portion comprises vertically-extending portions that vertically extend through a respective subset of layers within the first-tier alternating stack and fill volumes of the vertically-extending voids;
forming memory openings through the second-tier alternating stack and the first-tier alternating stack, wherein each of the memory openings comprises a volume formed by removing a respective one of the sacrificial first-tier memory opening fill portions;
forming memory opening fill structures in the memory openings, wherein each of the memory opening fill structures comprises a respective vertical semiconductor channel and a respective vertical stack of memory elements; and
replacing the first sacrificial material layers and the second sacrificial material layers with first electrically conductive layers and second electrically conductive layers, respectively.

19. A method of forming a three-dimensional memory device, comprising:
forming a first-tier alternating stack of first insulating layers and first sacrificial material layers over a substrate;
forming first-tier support openings through the first-tier alternating stack;
forming sacrificial first-tier support opening fill portions in the first-tier support openings in an area outside of a memory array region;
forming a second-tier alternating stack of second insulating layers and second sacrificial material layers over the first-tier alternating stack;
performing a level-shift anisotropic etch process to form a recess trench vertically extending through an entirety of the second-tier alternating stack, wherein top surfaces of a first subset of the sacrificial first-tier support opening fill portions are exposed underneath the recess trench and a second subset of the sacrificial first-tier support opening fill portions located outside an area of a volume of the recess trench are not exposed to the recess trench;
patterning first stepped surfaces in the first-tier alternating stack underneath a volume of the recess trench and patterning second stepped surfaces in the second-tier alternating stack adjacent to, and outside the area of, the volume of the recess trench, whereby a continuous stepped cavity overlying the first stepped surfaces and the second stepped surfaces is formed in a staircase region, whereby upper portions of the first subset of the sacrificial first-tier support opening fill portions are removed during patterning of the first stepped surfaces;
removing lower portions of the first subset of the sacrificial first-tier support opening fill portions after formation of the first stepped surfaces, whereby vertically-extending voids formed by removal of the lower portions of the first subset of the sacrificial first-tier support opening fill portions vertically extends through the first-tier alternating stack;
forming a retro-stepped dielectric material portion in a combination of the continuous stepped cavity and the vertically-extending voids, wherein the retro-stepped dielectric material portion comprises vertically-extending portions that vertically extend through a respective subset of layers within the first-tier alternating stack and fill volumes of the vertically-extending voids;
forming memory openings through the second-tier alternating stack and the first-tier alternating stack;

forming memory opening fill structures in the memory openings, wherein each of the memory opening fill structures comprises a respective vertical semiconductor channel and a respective vertical stack of memory elements; and replacing the first sacrificial material layers and the second sacrificial material layers with first electrically conductive layers and second electrically conductive layers, respectively.

* * * * *